(12) United States Patent
Utsumi

(10) Patent No.: US 10,720,545 B2
(45) Date of Patent: Jul. 21, 2020

(54) SEMICONDUCTOR DEVICE

(71) Applicant: ROHM CO., LTD., Kyoto-shi, Kyoto (JP)

(72) Inventor: Hideyuki Utsumi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/301,531

(22) PCT Filed: May 2, 2017

(86) PCT No.: PCT/JP2017/017230
§ 371 (c)(1),
(2) Date: Nov. 14, 2018

(87) PCT Pub. No.: WO2017/203953
PCT Pub. Date: Nov. 30, 2017

(65) Prior Publication Data
US 2019/0207051 A1    Jul. 4, 2019

(30) Foreign Application Priority Data

May 27, 2016  (JP) ................. 2016-106090
May 27, 2016  (JP) ................. 2016-106228
May 27, 2016  (JP) ................. 2016-106583

(51) Int. Cl.
*H01L 31/12*    (2006.01)
*H01L 31/167*   (2006.01)
(Continued)

(52) U.S. Cl.
CPC .......... *H01L 31/12* (2013.01); *H01L 31/0203* (2013.01); *H01L 31/02005* (2013.01);
(Continued)

(58) Field of Classification Search
CPC ................. H01L 31/153; H01L 31/173; H01L 31/02164; H01L 31/0203
See application file for complete search history.

(56) References Cited

U.S. PATENT DOCUMENTS

2011/0057129 A1* 3/2011 Yao ................ G01S 7/4813
250/552
2011/0108714 A1  5/2011 Yang et al.
(Continued)

FOREIGN PATENT DOCUMENTS

JP    6-61523 A    3/1994
JP    8-9099 A     1/1996
(Continued)

OTHER PUBLICATIONS

International Search Report issued in PCT/JP2017-017230, dated Jun. 6, 2017.

*Primary Examiner* — Changhyun Yi
(74) *Attorney, Agent, or Firm* — Hamre, Schumann, Mueller & Larson, P.C.

(57) ABSTRACT

A semiconductor device includes a substrate having a mounting surface, a plurality of internal terminals disposed on the mounting surface, a light-receiving element mounted on the mounting surface, a light-emitting element mounted on the mounting surface, a first bonding wire and a light-transmitting element. The light-receiving element has a light-receiving region that detects light and a plurality of element pad portions. At least one of the plurality of element pad portions is electrically connected to the light-receiving region. The light-emitting element is spaced apart from the light-receiving element along a first direction perpendicular to a thickness direction of the substrate. The first bonding wire connects one of the plurality of element pad portions of the light-receiving element to one of the plurality of internal
(Continued)

terminals. The first bonding wire is located on a side of the light-receiving element opposite the light-emitting element along the first direction.

31 Claims, 36 Drawing Sheets

(51) Int. Cl.
*H01L 31/02* (2006.01)
*H01L 31/0203* (2014.01)
*H01L 31/0216* (2014.01)
*H01L 33/52* (2010.01)
*H01L 33/58* (2010.01)
*H01L 33/62* (2010.01)
*G01S 7/481* (2006.01)
*G01S 17/04* (2020.01)

(52) U.S. Cl.
CPC ...... *H01L 31/02164* (2013.01); *H01L 31/167* (2013.01); *H01L 33/52* (2013.01); *H01L 33/58* (2013.01); *H01L 33/62* (2013.01); *G01S 7/4813* (2013.01); *G01S 17/04* (2020.01)

(56) References Cited

U.S. PATENT DOCUMENTS

2015/0377775 A1* 12/2015 Sakai ................ G01N 21/3504
250/338.1
2016/0126403 A1   5/2016 Tu et al.

FOREIGN PATENT DOCUMENTS

| JP | 11-330538 A | 11/1999 |
| JP | 2000-124478 A | 4/2000 |
| JP | 2006-5141 A | 1/2006 |
| JP | 2012-150022 A | 8/2012 |
| JP | 2015-88518 A | 5/2015 |

* cited by examiner

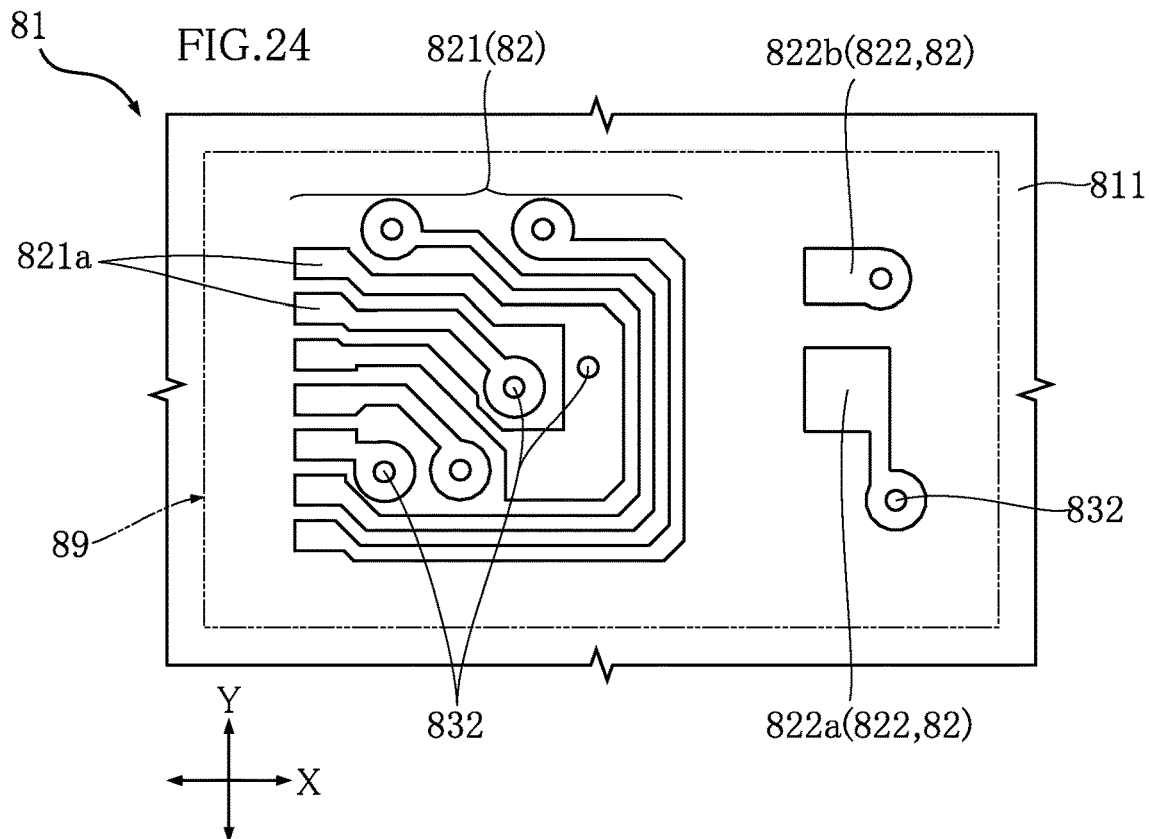
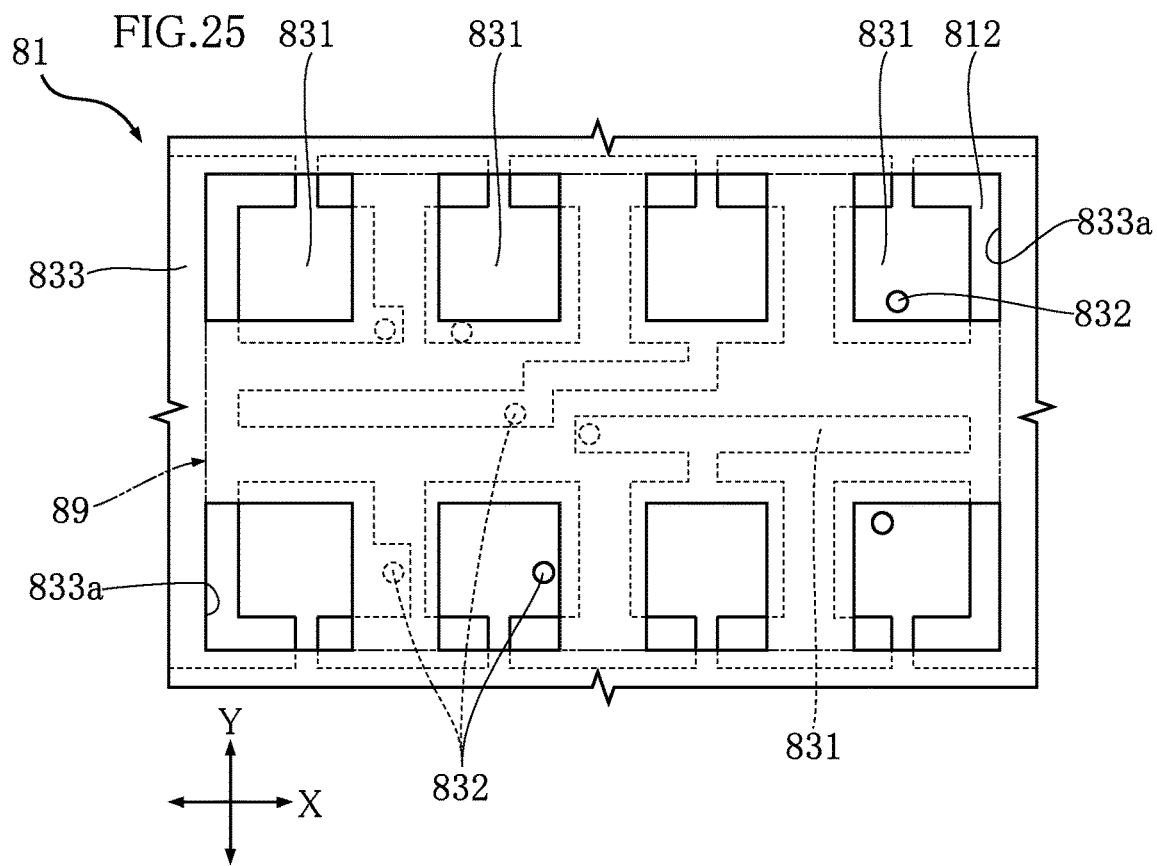

SEMICONDUCTOR DEVICE

FIELD

The present disclosure relates to semiconductor devices.

BACKGROUND ART

Semiconductor devices having light-emitting elements and light-receiving elements mounted on the same substrates may be found in camera modules integrated, for example, with proximity sensors and flash units for smartphones and tablet computers. A semiconductor device serving as a proximity sensor emits infrared radiation from its light-emitting element such as a light-emitting diode (LED) and detects the infrared radiation that is reflected from a target object with its light-receiving element such as a photodiode. In this way, the semiconductor device controls an associated electronic device in response to the presence of nearby objects. Operations under such control include turning off of the liquid crystal screen when the electronic device is brought closer to a human face and turning on when the electronic device is moved away from the human face. The semiconductor device is visible through an optical window of the electronic device. Recently, however, there has been a demand for the optical windows that are as small as possible to improve the appearance of electronic devices. To meet the demand, the light-emitting element and the light-receiving element of a semiconductor device need to be mounted on the substrate as close as possible to each other to reduce the center distance between the light-emitting element and the light-receiving element in the longitudinal direction of the semiconductor device.

One document related to the present disclosure describes a semiconductor device (camera module integrated with a flash unit) configured to reduce the center distance between the light-receiving element and the light-emitting element mounted in a longitudinal direction of the device. In this semiconductor device, in a region between the light-emitting element and the light-receiving element mounted on a mounting surface of a substrate, a subset of electrodes connected to the light-emitting element alternates with a subset of electrodes connected to the light-receiving element in a short-side direction of the semiconductor device. This configuration enables the center distance between the light-receiving element and the light-emitting element to be reduced in the longitudinal direction of the device. Each electrode is electrically connected to the light-receiving element or to the light-emitting element via a bonding wire.

Unfortunately, in the semiconductor device, the bonding wires connecting the electrodes to the light-receiving element are in close proximity to the bonding wires connecting the electrodes to the light-emitting element. In addition, the light-receiving element passes a larger electric current than the light-receiving element. In this circumstance, the electric current flowing through the light-emitting element may generate noise in the light-receiving element, which may result in detection errors in the light-receiving element.

The document mentioned above is directed to a semiconductor device serving as a proximity sensor. In the manufacture of the semiconductor device, a light-transmitting resin part is formed to have a lens (primary resin molding), and a light-shielding resin part is formed to cover the light-transmitting resin (secondary resin molding) by pressing a metal mold against the entire lens surface of the light-transmitting resin part. This manufacturing method makes it possible to minimize the size of the opening to be formed in the light-shielding resin part to expose the lens surface, enabling the overall size of the semiconductor device to be reduced. However, since the metal mold is pressed against the entire lens surface, there is a risk of scratching the lens surface. Depending on the conditions of a scratch on the lens surface, the amount of incoming light and outgoing light through the lens surface may be reduced. Consequently, the performance of the semiconductor device may be reduced.

The semiconductor device described in the document mentioned above is a proximity sensor. An attempt on a semiconductor device to reduce the center distance between the light-receiving element and the light-emitting element in the longitudinal direction of the device may result in that more light emitted from the light-emitting element is reflected at the boundary plane between the optical window and the outside of the electronic device and reaches the light-receiving element. Generally, light reflected from the boundary plane between the optical window and the outside is more directive than the light reflected from a target object. Increase in the light reflected from the boundary plane between the optical window and the outside to the light-receiving element may cause the light-receiving element to determine in error that a target object is in proximity to the electronic device. Consequently, the detection accuracy of the light-emitting element may be reduced.

SUMMARY

Problems

In view of the above circumstances, one objective of the present disclosure is to provide a semiconductor device configured to have a shorter center distance between the light-receiving element and the light-emitting element and also to achieve noise reduction in the light-receiving element.

Means to Solve the Problem

One aspect of the present disclosure provides a semiconductor device. The semiconductor device includes a substrate, a plurality of internal terminals, a light-receiving element, a light-emitting element, a first bonding wire and a light-transmitting element. The substrate has a mounting surface and an attachment surface facing away from each other. The plurality of internal terminals are disposed on the mounting surface. The light-receiving element has a light-receiving region that detects light and a plurality of element pad portions. The light-receiving element is mounted on the mounting surface of the substrate. At least one of the plurality of element pad portions is electrically connected to the light-receiving region. The light-emitting element is mounted on the mounting surface of the substrate and spaced apart from the light-receiving element in a first direction perpendicular to a thickness direction of the substrate. The first bonding wire connects one of the plurality of element pad portions of the light-receiving element to one of the plurality of internal terminals. The first bonding wire is located on a side of the light-receiving element opposite the light-emitting element in the first direction. The light-transmitting member covers the light-receiving element, the light-emitting element and the first bonding wire.

BRIEF DESCRIPTION OF THE DRAWINGS

FIG. 24 is a plan view illustrating a method of manufacturing the semiconductor device of FIG. 14.

FIG. 25 is a bottom view illustrating the method of manufacturing the semiconductor device of FIG. 14.

EMBODIMENTS

Figure 1:
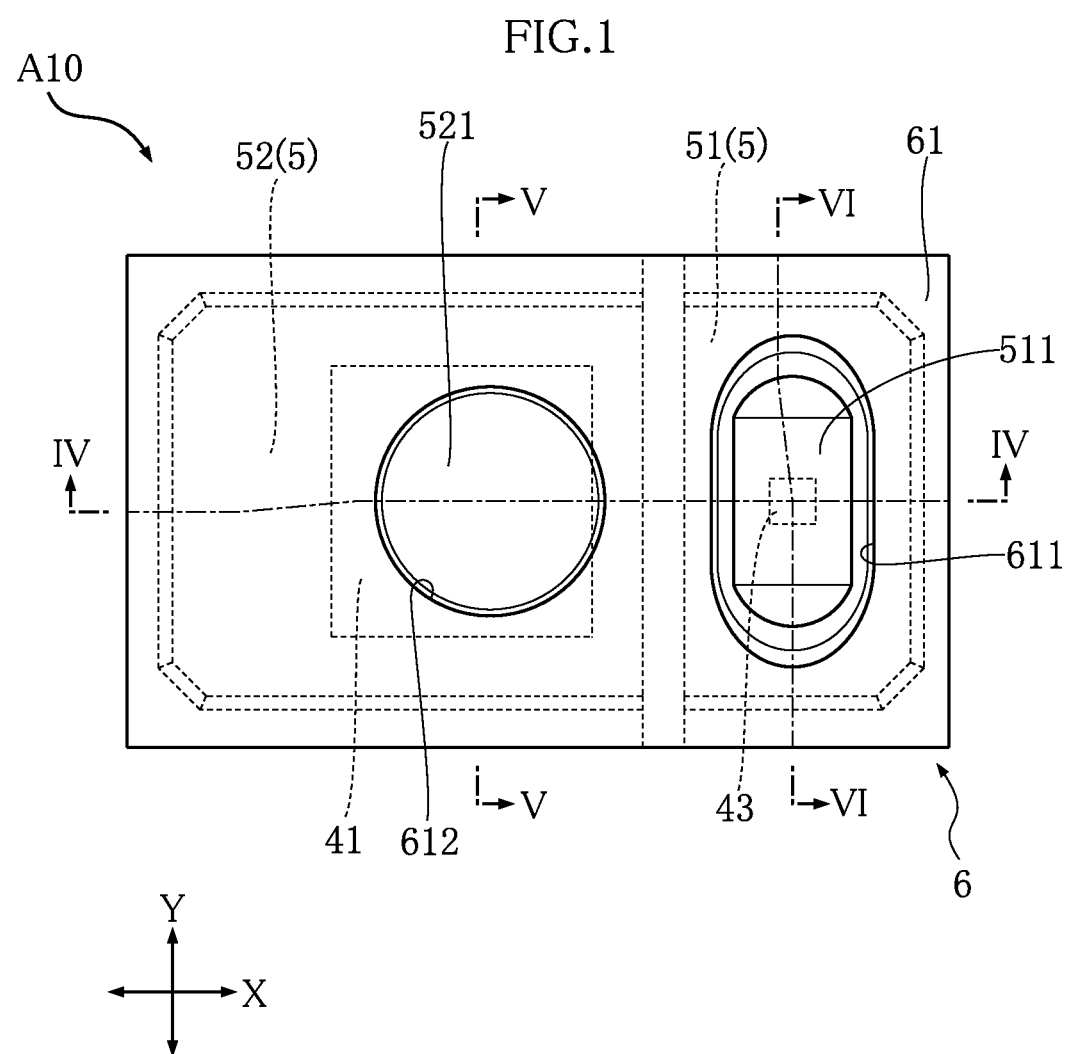
FIG. 1 is a plan view of a semiconductor device according to Embodiment A1 of the present disclosure.

Modes for carrying out the present disclosure (hereinafter, "embodiments") will be described with reference to the accompanying drawings.

Embodiment A1

With reference to FIGS. 1 to 9, a semiconductor device A10 according to Embodiment A1 will be described. The semiconductor device A10 includes a substrate 1, internal terminals 2, external terminals 31, a light-receiving element 41, a first bonding layer 42, a light-emitting element 43, a second bonding layer 44, first bonding wires 48, a second bonding wire 49, a light-transmitting member 5 and a light-shielding member 6.

Figure 2:
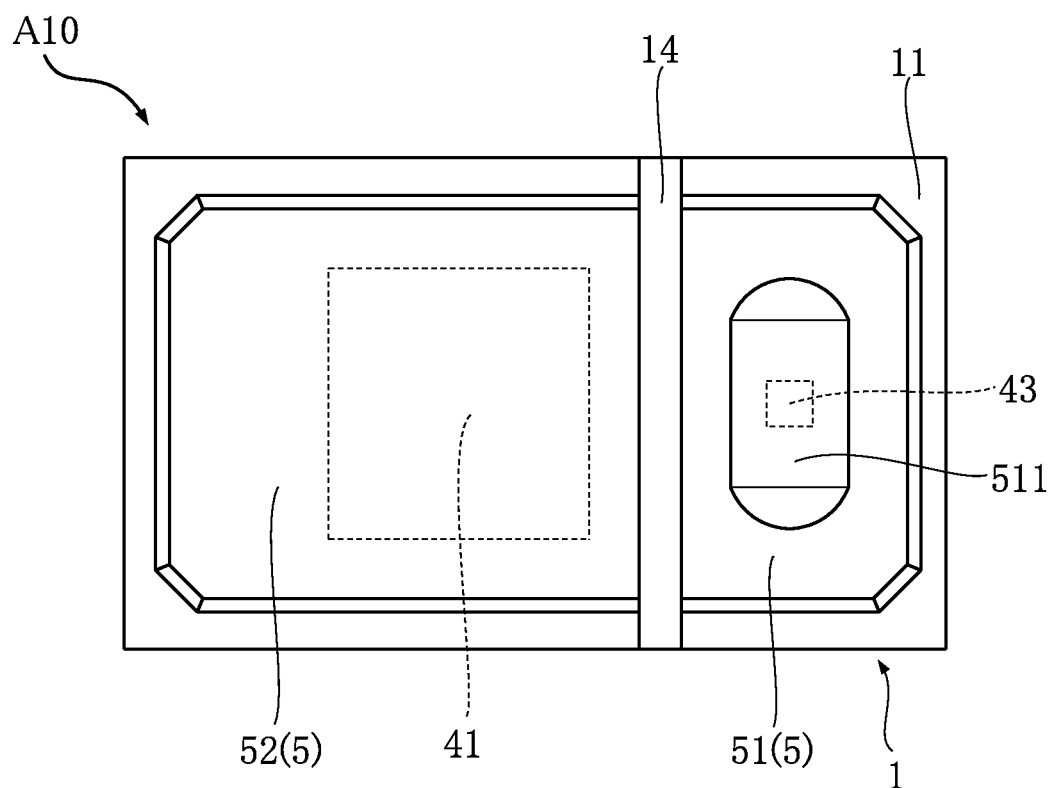
FIG. 2 is a plan view of the semiconductor device of FIG. 1 (with the light-shielding member omitted).
Figure 3:
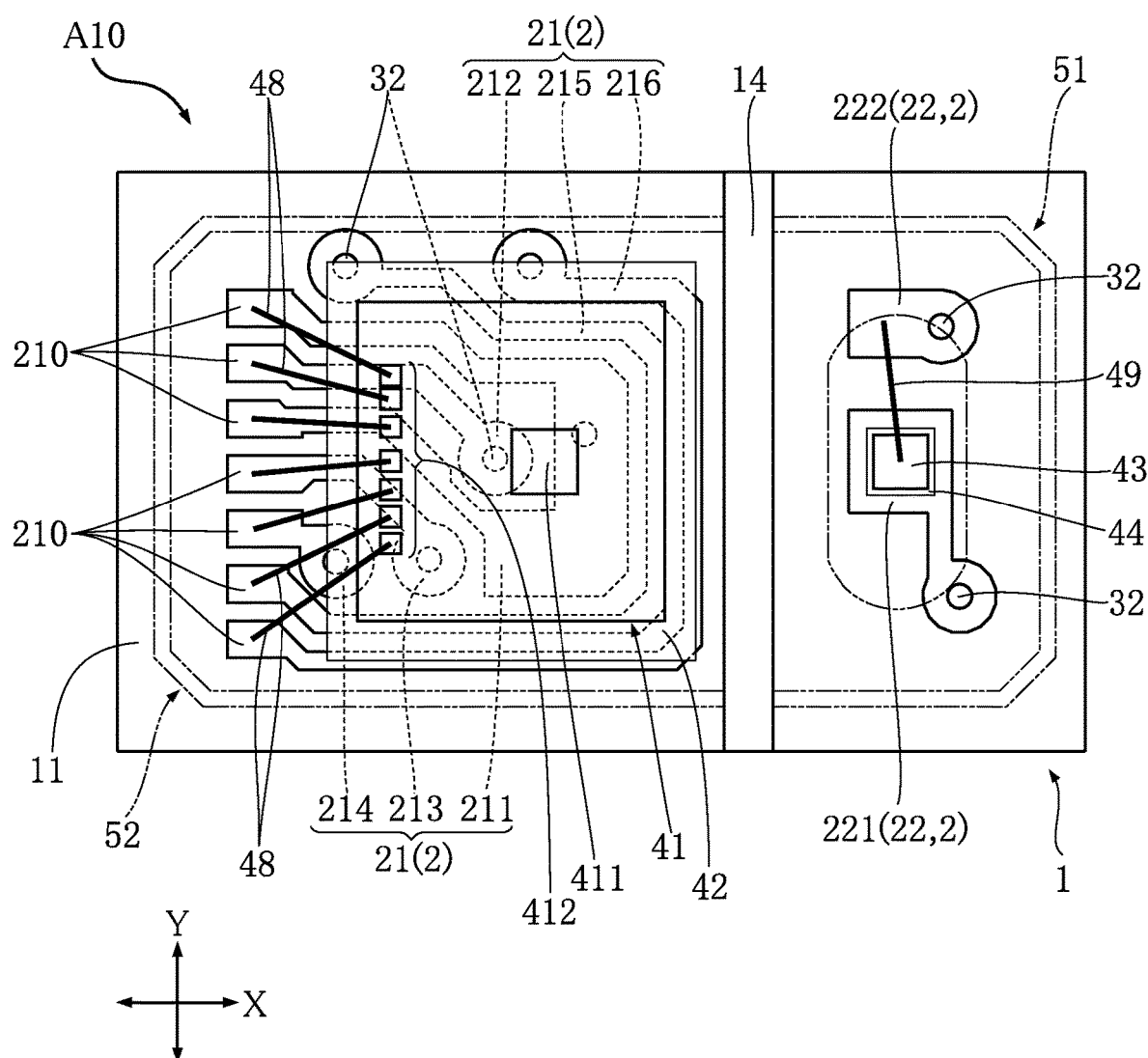
FIG. 3 is a plan view of the semiconductor device of FIG. 1 (with the light-transmitting member and the light-shielding member omitted).
Figure 4:
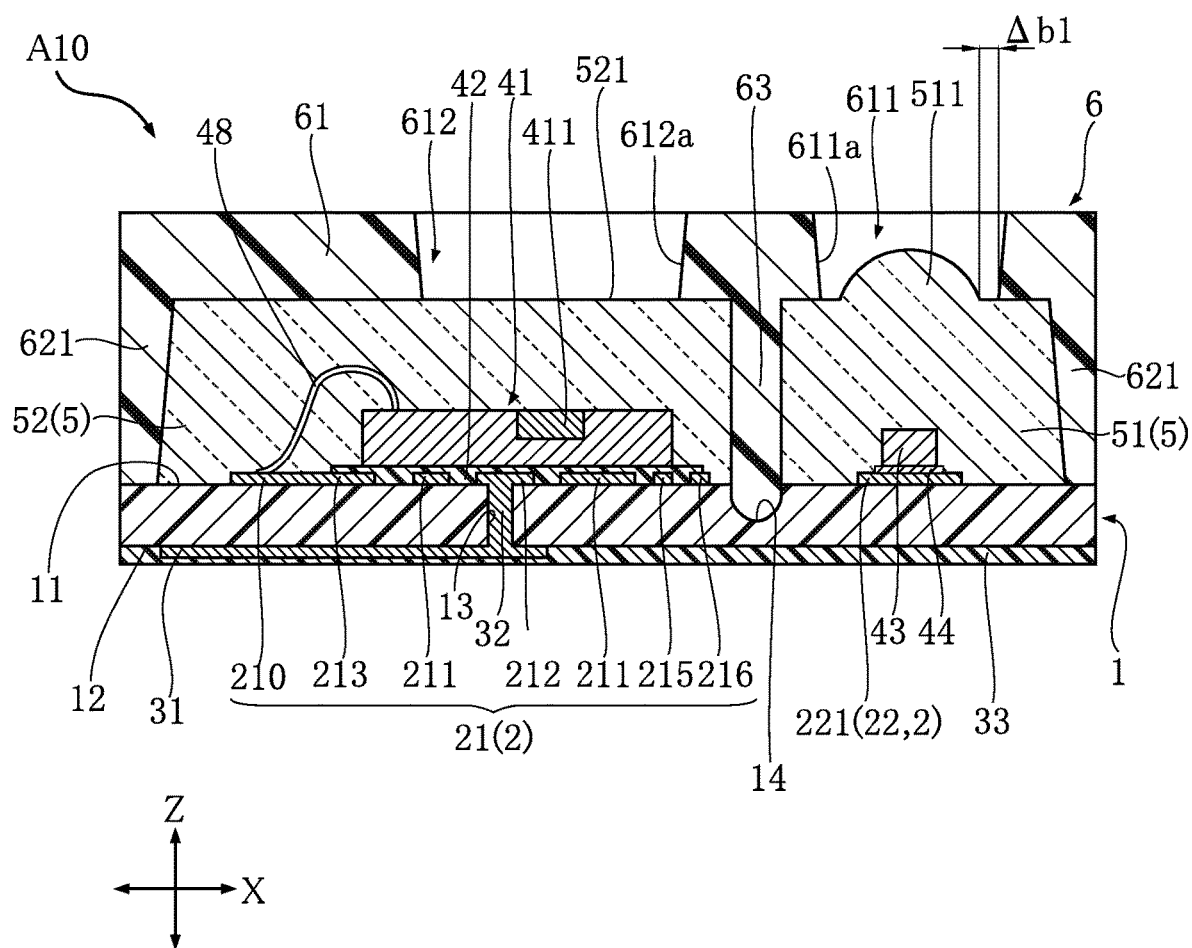
FIG. 4 is a sectional view taken along line IV-IV of FIG. 1.
Figure 5:
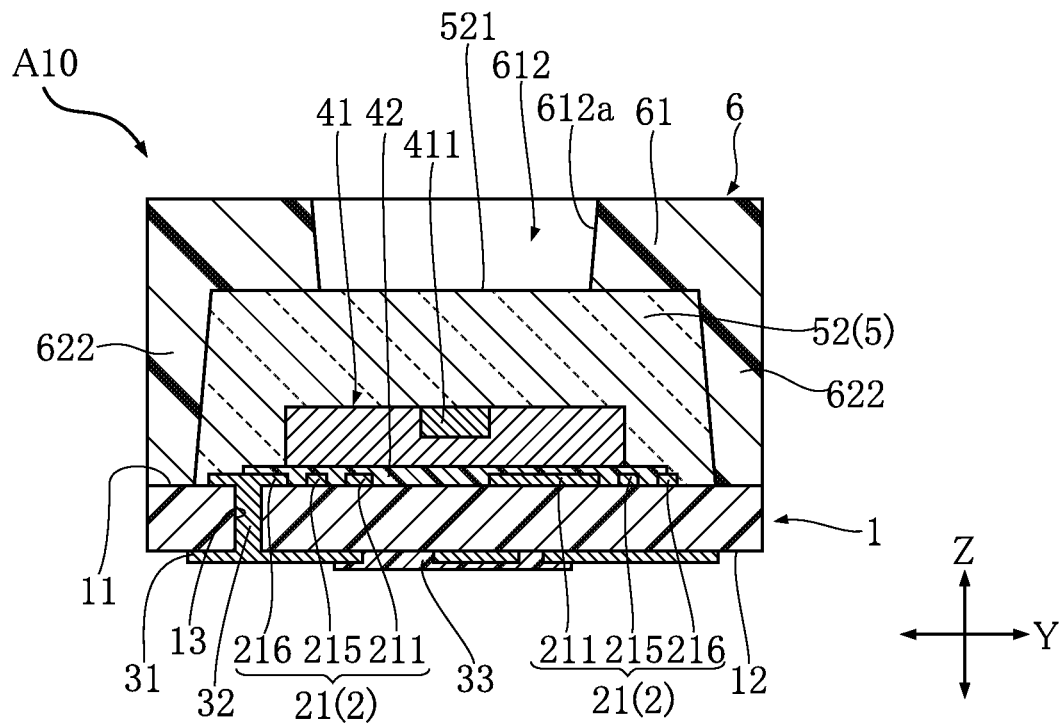
FIG. 5 is a sectional view taken along line V-V of FIG. 1.
Figure 6:
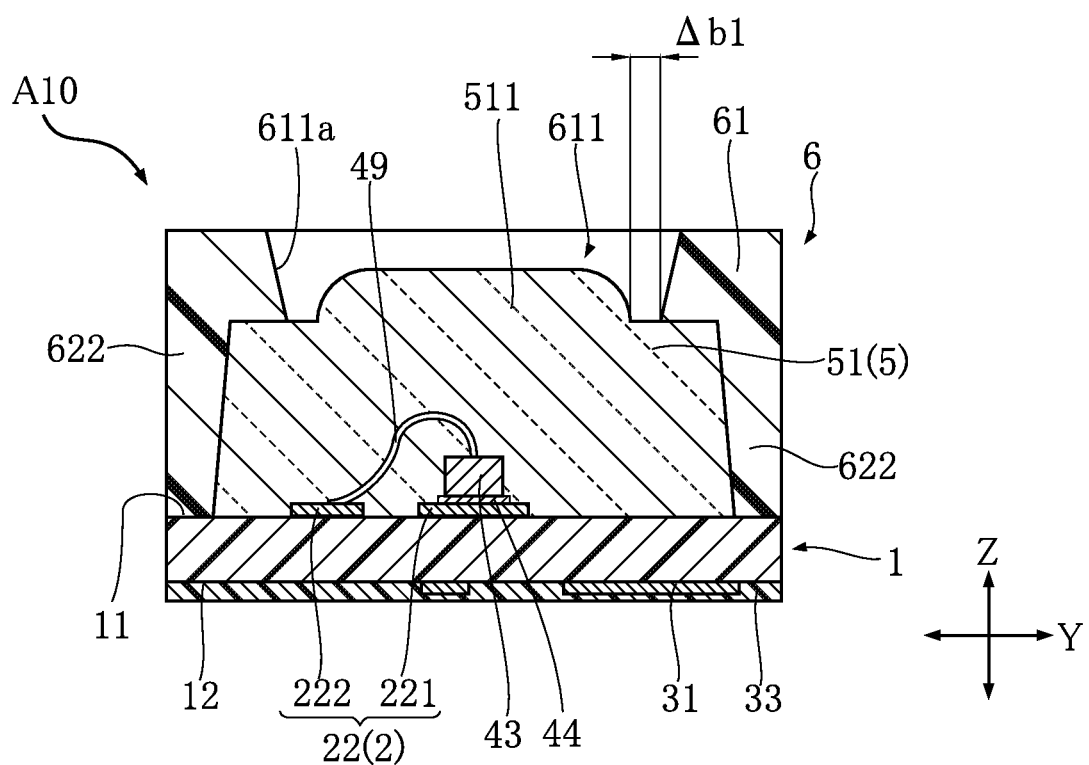
FIG. 6 is a sectional view taken along line VI-VI of FIG. 1.
Figure 7:
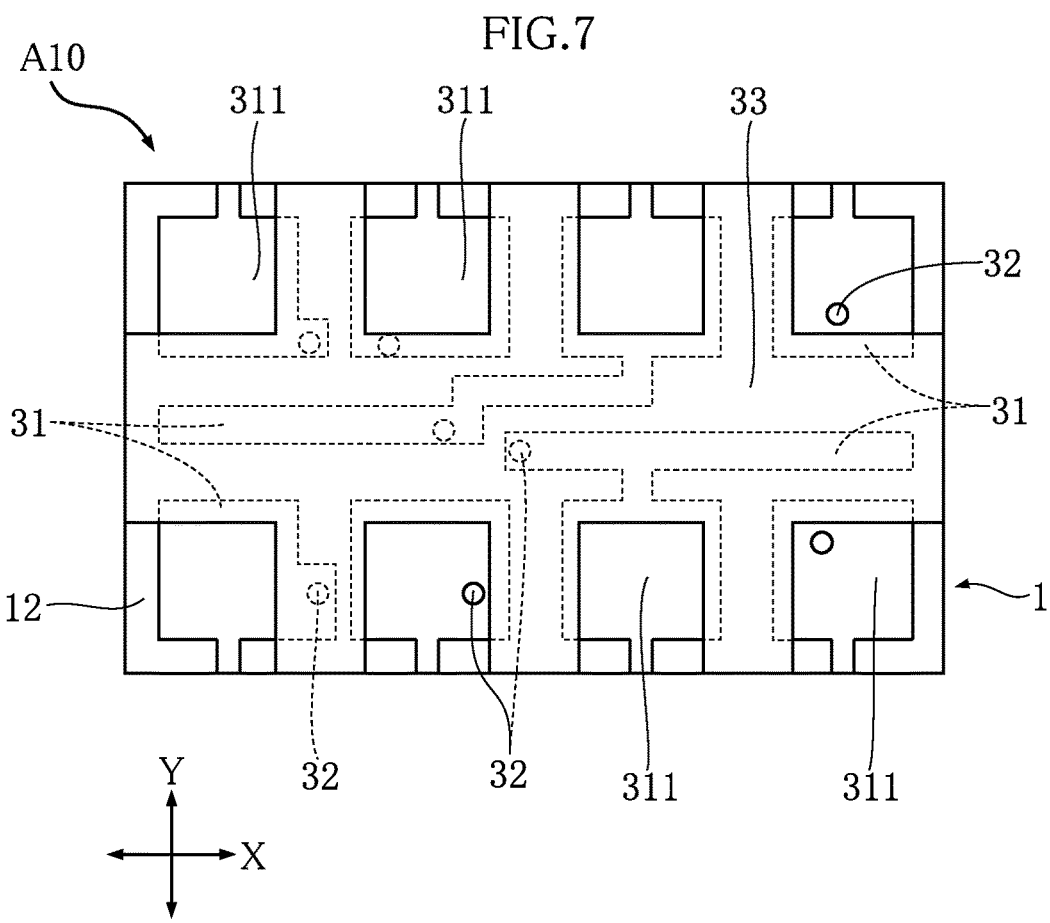
FIG. 7 is a bottom view of the semiconductor device of FIG. 1.

FIG. 1 is a plan view of the semiconductor device A10. FIG. 2 is a plan view of the semiconductor device A10, with the light-shielding member 6 omitted for ease of understanding. FIG. 3 is a plan view of the semiconductor device A10, with the light-transmitting member 5 and the light-shielding member 6 omitted for ease of understanding. The omitted light-transmitting member 5 is indicated by phantom lines (chain double-dashed lines). FIG. 4 is a sectional view taken along line IV-IV of FIG. 1 (the long dashed short dashed line in FIG. 1). FIG. 5 is a sectional view taken along line V-V of FIG. 1. FIG. 6 is a sectional view taken along line VI-VI of FIG. 1 (the long dashed short dashed line in FIG. 1). FIG.

Figure 8:
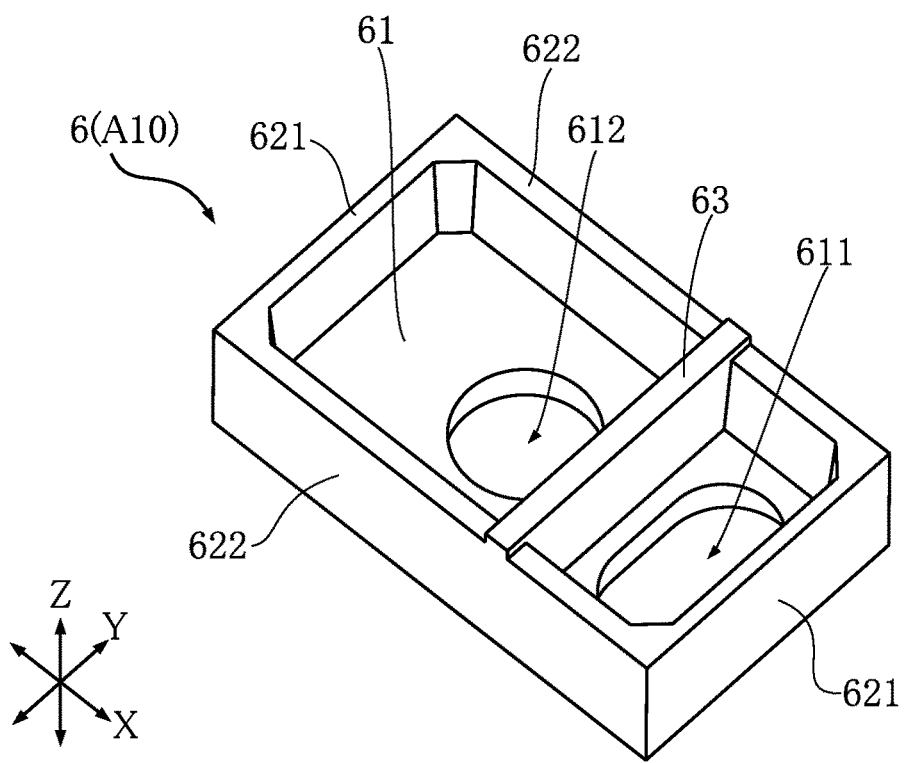
FIG. 8 is a perspective view showing the light-shielding member of the semiconductor device of FIG. 1.
Figure 9:
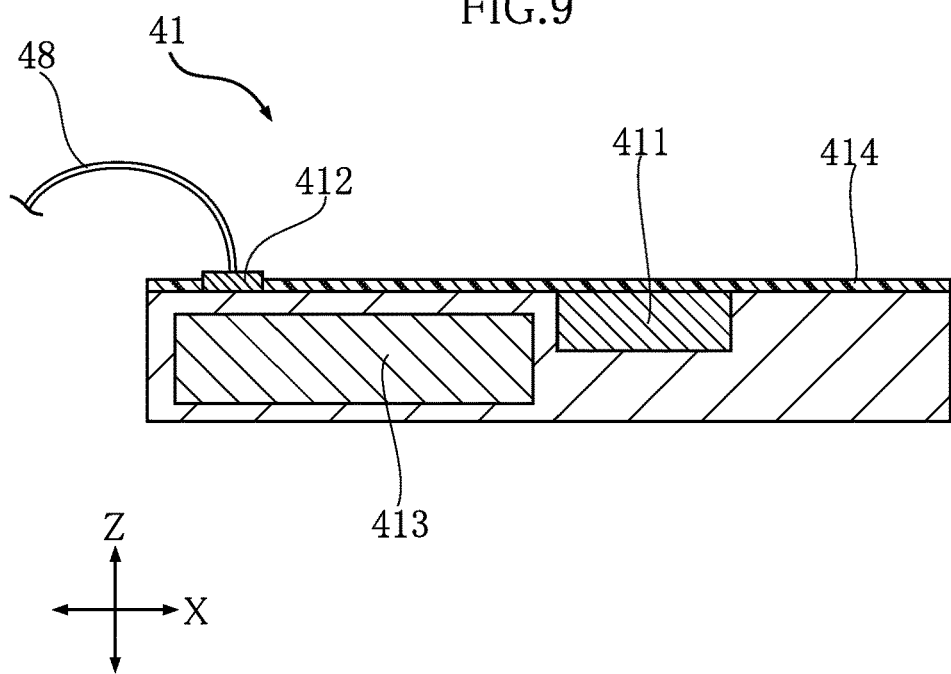
FIG. 9 is a sectional view showing a light-receiving element of the semiconductor device of FIG. 1.

7 is a bottom view of the semiconductor device A10. FIG. 8 is a perspective view showing the light-shielding member 6 of the semiconductor device A10. FIG. 9 is a sectional view showing the light-receiving element 41 of the semiconductor device A10.

The semiconductor device A10 shown in these figures is designed for surface mounting on the circuit boards of electronic devices, such as smartphones and tablet computers. For the purpose of description, the right-and-left direction as seen in the plan view figures and perpendicular to the thickness direction Z of the substrate 1 is defined as a first direction X. Similarly, the up-and-down direction as seen in the plan view figures and perpendicular to both the thickness direction Z of the substrate 1 and the first direction X is defined as a second direction Y. The semiconductor device A10 according to the present embodiment has a rectangular shape in plan view, i.e., as viewed in the thickness direction Z of the substrate 1 (hereinafter, simply "plan view"). The first direction X corresponds to the longitudinal direction of the semiconductor device A10.

As shown in FIGS. 2 to 6, the substrate 1 is a component for mounting the light-receiving element 41 and the light-emitting element 43 thereon and also for mounting the semiconductor device A10 on a circuit board. The substrate 1 is an electrical insulator and made of a glass epoxy resin, for example. In plan view, the substrate 1 is rectangular having the long sides extending in the first direction X. The substrate 1 has a mounting surface 11, an attachment surface 12 and through holes 13.

As shown in FIGS. 3 to 7, the mounting surface 11 and the attachment surface 12 face away from each other in the thickness direction Z of the substrate 1. In addition, both the mounting surface 11 and the attachment surface 12 are flat surfaces and rectangular in plan view with their long sides extending in the first direction X. The mounting surface 11 faces upward as seen in FIGS. 4 to 6. The mounting surface 11 has the light-receiving element 41 and the light-emitting element 43 mounted thereon, along with the internal terminals 2. The entire mounting surface 11 is covered by the light-transmitting member 5 and the light-shielding member 6. The attachment surface 12 faces downward as seen in FIGS. 4 to 6. The attachment surface 12 is a side used to attach the semiconductor device A10. The attachment surface 12 has the external terminals 31 mounted thereon.

As shown in FIGS. 4 and 5, a through hole 13 is formed in the substrate 1 to extend from the mounting surface 11 to the attachment surface 12. In the present embodiment, a plurality of through holes 13 are formed in the substrate 1. Each through hole 13 is filled with a connection terminal 32, which will be described later. In addition, as shown in FIGS. 2 to 4, the substrate 1 has a first groove 14 that is recessed from the mounting surface 11 and extends in the second direction Y. That is, the mounting surface 11 according to the present embodiment is divided into two regions by the first groove 14. The first groove 14 has a curved bottom surface.

As shown in FIGS. 3 to 6, the internal terminals 2 are electric conductors each of which is electrically connected to the light-receiving element 41 or the light-emitting element 43. The internal terminals 2 are made of Cu, for example. The internal terminals 2 according to the present embodiment include a plurality of first internal terminals 21 electrically connected to the light-receiving element 41 and a second internal terminal 22 electrically connected to the light-emitting element 43. The first internal terminals 21 are spaced apart from the second internal terminal 22 in the first direction X across the first groove 14 formed in the substrate 1 as a boundary. The internal terminals 2 according to the present embodiment are each covered by a plating layer 39. The plating layer 39 is composed of a Ni layer and a Au layer laminated on one another.

As shown in FIGS. 3 to 5, the plurality of first internal terminals 21 according to the present embodiment include a first terminal 211, a second terminal 212, a third terminal 213, a fourth terminal 214, a fifth terminal 215 and a sixth terminal 216. Each first internal terminal 21 is electrically connected to the light-receiving element 41 via a first bonding wire 48. Each first internal terminal 21 has an end forming a first pad portion 210 to which the first bonding wire 48 is connected. The first pad portions 210 are arranged along the second direction Y. Each first internal terminal 21 is electrically connected also to a connection terminal 32, which will be described later.

As shown in FIG. 3, the first terminal 211 surrounds the second terminal 212. Unlike the other first internal terminals 21, the first terminal 211 has the first pad portions 210 at either end thereof. As a result, the first pad portion 210 of the second terminal 212 is located between the first pad portions 210 of the first terminal 211 in the second direction Y. The third terminal 213 is adjacent to the first terminal 211, and the fourth terminal 214 is adjacent to the third terminal 213. In the present embodiment, the fourth terminal 214 is the shortest one among the plurality of first internal terminals 21. The fifth terminal 215 is adjacent to each of the first terminal 211, the third terminal 213 and the fourth terminal 214 and surrounds these adjacent terminals. The sixth terminal 216 is adjacent to the fifth terminal 215 and surrounds the fifth terminal 215. The sixth terminal 216 is the closest one to the light-emitting element 43 in the first direction, among the plurality of first internal terminals 21.

As shown in FIG. 3, among the plurality of first internal terminals 21, each of the first terminal 211, the fifth terminal 215 and the sixth terminal 216 has a portion extending in the second direction Y, in a region of the mounting surface 11 of the substrate 1 between the center of the light-receiving element 41 and the center of the light-emitting element 43. Each of the first internal terminals 21, except for the sixth terminal 216, partially overlaps with the light-receiving element 41 in plan view.

As shown in FIGS. 3, 4 and 6, the second internal terminal 22 has a die pad portion 221 on which the light-emitting element 43 is mounted and a second pad portion 222 spaced apart from the die pad portion 221 in the second direction Y. The die pad portion 221 is electrically connected to the light-emitting element 43 via the second bonding layer 44. The second pad portion 222 is connected to the second bonding wire 49, so that the second pad portion 222 is electrically connected to the light-emitting element 43 via the second bonding wire 49. Each of the die pad portion 221 and the second pad portion 222 is connected to a connection terminal 32, which will be described later.

As shown in FIGS. 4 to 7, the external terminals 31 are conductors electrically connected to the internal terminals 2 (the first internal terminal 21 and the second internal terminal 22) via the connection terminals 32 disposed in the through holes 13 of the substrate 1. The external terminals 31 and the connection terminals 32 are made of the same material as the internal terminals 2. In the present embodiment, the material is Cu, for example. The external terminals 31 are partially covered by a resist film 33 of an electrical insulator, and each external terminal has a terminal pad portion 311 exposed from the resist film 33. Each terminal pad portion 311 is rectangular in plan view. When the semiconductor device A10 is mounted on a circuit board, the terminal pad portions 311 are electrically connected to the circuit board wirings via, for example, solder paste.

Similarly to the internal terminals 2, the external terminals 31 according to the present embodiment are each covered by a plating layer 39. In addition, the resist film 33 partially covering the external terminals 31 is made of, for example, solder resist.

The light-receiving element 41 and the light-emitting element 43 are the central components for the function of the semiconductor device A10. As shown in FIG. 9, the light-receiving element 41 according to the present embodiment is an integrated circuit (IC) having a light-receiving region 411, element pad portions 412, a functional region 413 and a laminated optical film 414.

The light-receiving region 411 is a part that senses light emitted from the light-emitting element 43 and then reflected from a target object. Specifically, the light-receiving region in the present embodiment is a photodiode that detects infrared radiation. The light-receiving region 411 outputs the electrical voltage created by the photovoltaic effect occurring when light is detected. The element pad portions 412 are a plurality of components made of, for example, Al and each electrically connected to the light-receiving region 411 or the functional region 413. As shown in FIG. 3, each element pad portion 412 is connected to a first bonding wire 48, so that the element pad portions 412 are electrically connected to the respective first internal terminals 21 via the first bonding wires 48. The functional region 413 is electrically connected to the light-receiving region 411 and outputs a proximity signal indicating the presence of a nearby object based on the output voltage of the light-receiving region 411 obtained as a result of calculation. The functional region 413 outputs a proximity signal to the outside of the semiconductor device A10 when the output voltage exceeds a predetermined threshold. The laminated optical film 414 is made of a synthetic resin that is transparent only to light in the wavelength range corresponding to infrared radiation. In the light-receiving element 41, the laminated optical film 414 covers the light-receiving region 411 and the functional region 413. Thus, the light-receiving region 411 and the functional region 413 are not affected by light having other wavelengths, such as visible light.

The first bonding layer 42 is an electrical insulator and interposed between the light-receiving element 41 and the mounting surface 11 of the substrate 1, as shown in FIGS. 3 to 5. The first bonding layer 42 secures the light-receiving element 41 to the mounting surface 11 by bonding. The first bonding layer 42 is made of an epoxy resin or polyimide, for example. The first bonding layer 42 partially covers the mounting surface 11 and the first internal terminals 21.

As shown in FIGS. 3, 4 and 6, the light-emitting element 43 is a semiconductor element that emits light. In the present embodiment, an infrared light-emitting diode is used. The light-emitting element 43 emits infrared radiation from the upper surface as seen in FIGS. 4 and 6, and the second bonding wire 49 is connected to the upper surface. That is, the upper surface is electrically connected to the second pad portion 222 of the second internal terminal 22 via the second bonding wire 49. In addition, the lower surface of the light-emitting element 43 as seen in FIGS. 4 and 6 is electrically connected to the die pad portion 221 of the second internal terminal 22 via the second bonding layer 44.

The second bonding layer 44 is an electric conductor and interposed between the light-emitting element 43 and the die pad portion 221 of the second internal terminal 22, as shown in FIGS. 3, 4 and 6. The second bonding layer 44 secures the light-emitting element 43, by die bonding, to the die pad portion 221, which is located on the mounting surface 11. The second bonding layer 44 may be made of an epoxy-based synthetic resin containing Ag (so-called Ag paste).

The first bonding wires 48 are electric conductors connecting the element pad portions 412 of the light-receiving element 41 to the first internal terminals 21 among the internal terminals 2, as shown in FIGS. 3 and 4. The first bonding wires 48 according to the present embodiment are located on the side of the light-receiving element 41 opposite the light-emitting element 43 in the first direction X. In addition, the second bonding wire 49 is an electric conductor connecting the light-emitting element 43 to the second pad portion 222 of the second internal terminal 22, as shown in FIGS. 3 and 6. The second bonding wire 49 is made of the same material as the first bonding wires 48. In the present embodiment, both the first bonding wires 48 and the second bonding wire 49 are made of Au.

As shown in FIGS. 2 to 6, the light-transmitting member 5 covers the internal terminals 2, the light-receiving element 41, the light-emitting element 43, the first bonding wires 48 and the second bonding wire 49 on the mounting surface 11 of the substrate 1. The light-transmitting member 5 according to the present embodiment includes a first light-transmitting member 51 and a second light-transmitting member 52. Both the first light-transmitting member 51 and the second light-transmitting member 52 are made of the same transparent synthetic resin that passes light in the wavelength range from visible to infrared. The first light-transmitting member 51 and the second light-transmitting member 52 on the mounting surface 11 are spaced apart from each other in the first direction X across the first groove 14 formed in the substrate 1 as a boundary.

As shown in FIGS. 4 and 6, the first light-transmitting member 51 has the shape of a substantially truncated pyramid and covers the second internal terminal 22, the light-emitting element 43 and the second bonding wire 49. The first light-transmitting member 51 has a convex lens 511 through which light emitted from the light-emitting element 43 is transmitted to the outside of the semiconductor device A10. In plan view, the lens 511 according to the present embodiment has an elliptical shape elongated in the second direction Y.

As shown in FIGS. 4 and 5, the second light-transmitting member 52 has the shape of a substantially truncated pyramid and covers the first internal terminals 21, the light-receiving element 41 and the first bonding wires 48. The second light-transmitting member 52 has an incident region 521 on which light is made incident after the light is emitted from the light-emitting element 43 and reflected from a target object. The incident region 521 is a surface of the second light-transmitting member 52 exposed through a second opening 612 of the light-shielding member 6, which will be described later. The incident region 521 according to the present embodiment is a flat surface.

As shown in FIGS. 1 and 4 to 6, the light-shielding member 6 covers both the first light-transmitting member 51 and the second light-transmitting member 52 of the light-transmitting member 5. As shown in FIG. 8, the light-shielding member 6 has a top portion 61, a pair of first side walls 621, a pair of second side walls 622 and a partition wall 63. The light-shielding member 6 is made of a light-shielding synthetic resin, such as a black epoxy resin. In the present embodiment, the light-shielding member 6 is made of a synthetic resin that differs in the physical property (or physical properties) from the synthetic resin forming the first light-transmitting member 51 and the second light-transmitting member 52. The light-shielding member 6 has a glass transition point lower than the glass transition point of the first light-transmitting member 51 and the second light-transmitting member 52.

As shown in FIGS. 1, 4 to 6 and 8, the top portion 61 overlies the first light-transmitting member 51 and the second light-transmitting member 52 in the thickness direction Z of the substrate 1. In plan view, the top portion 61 is equal in size to the substrate 1. The top portion 61 has a first opening 611 and a second opening 612.

As shown in FIGS. 1, 4, 6 and 8, the first opening 611 is a through hole formed in the top portion 61 to expose the lens 511. In plan view, the first opening 611 has an elliptical shape elongated in the second direction Y. An inner wall 611a of the first opening 611 has a surface inclined toward the center of the first opening as the distance to the light-emitting element 43 decreases in the thickness direction Z of the substrate 1. The inclination angle of the inner wall 611a of the first opening 611 relative to the first direction X is uniform along the entire circumference of the first opening 611. As shown in FIGS. 4 and 6, in addition, on the surface of the first light-transmitting member 51 in contact with the top portion 61, a clearance Δb1 is provided between the lens 511 and the inner wall 611a of the first opening 611. The width of the clearance Δb1 is uniform along the entire circumference of the lens 511.

As shown in FIGS. 1, 4, 5 and 8, the second opening 612 is a through hole formed in the top portion 61 to expose the incident region 521. The second opening 612 is spaced apart from the first opening 611 in the first direction X. In plan view, the second opening 612 is circular. An inner wall 612a of the second opening 612 has a surface inclined toward the center of the second opening as the distance to the light-receiving element 41 decreases in the thickness direction Z of the substrate 1. The inclination angle of the inner wall 612a of the second opening 612 relative to the first direction X is uniform along the entire circumference of the second opening 612.

As shown in FIGS. 4 and 8, the pair of first side walls 621 are spaced apart from each other in the first direction X. In the thickness direction Z of the substrate 1, one end of each first side wall is connected to the top portion 61 and the other end is in contact with the substrate 1. In the second direction Y, the ends of each first side wall 621 are connected to the pair of second side walls 622. As shown in FIGS. 5, 6 and 8, in addition, the pair of second side walls 622 are spaced apart from each other in the second direction Y. In the thickness direction Z of the substrate 1, one end of each second side wall is connected to the top portion 61 and the other end is in contact with the substrate 1. In the first direction X, the opposite ends of each second side wall 622 are connected to the pair of first side walls 621. That is, the pair of first side walls 621 and the pair of second side walls 622 are disposed to surround the first light-transmitting member 51 and the second light-transmitting member 52.

As shown in FIGS. 4 and 8, the partition wall 63 is a barrier isolating the first light-transmitting member 51 from the second light-transmitting member 52. The partition wall 63 is parallel to the pair of first side walls 621, and the opposite ends in the second direction Y are connected to the pair of second side walls 622. In addition, one end of the partition wall in the thickness direction Z of the substrate 1 is connected to the top portion 61, and the other end is fitted in the first groove 14 formed in the mounting surface 11 of the substrate 1.

The following now describes advantages of the semiconductor device A10.

The semiconductor device A10 includes the internal terminals 2, the light-receiving element 41 and the light-emitting element 43 each of which is disposed or mounted on the mounting surface 11 of the substrate 1, and also includes the first bonding wires 48 connecting the element pad portions 412 of the light-receiving element 41 to the internal terminals 2. The light-receiving element 41 and the light-emitting element 43 on the mounting surface 11 are spaced apart from each other in the first direction X that is perpendicular to the thickness direction Z of the substrate 1. The first bonding wires 48 are located on the side of the light-receiving element 41 opposite the light-emitting element 43 in the first direction X. In this configuration, the light-receiving element 41 can be disposed closer to the light-emitting element 43 in the first direction, so that the center distance between the light-receiving element 41 and the light-emitting element 43 in the longitudinal direction (the first direction X) of the device is reduced, as compared to in a conventional configuration. In addition, the distance between the first bonding wires 48 and the light-emitting element 43 in the first direction X is increased, facilitating reduction of noise in the light-receiving element 41 resulting from the electric current flowing in the light-emitting element 43.

The internal terminals 2 include the first internal terminals 21 that are electrically connected to the light-receiving element 41 via the first bonding wires 48. Each first internal terminal 21 has an end forming a first pad portion 210 to which the first bonding wire 48 is connected. The first pad portions 210 are arranged along the second direction Y that is perpendicular to both the thickness direction Z of the substrate 1 land the first direction X. With this configuration, the first bonding wires 48 are closely located to be in a localized area, enabling further reduction of noise in the light-receiving element 41.

The first internal terminals 21 partially overlap with the light-receiving element 41 in plan view. In addition, the semiconductor device A10 has the first bonding layer 42 that is an electrical insulator and that is interposed between the light-receiving element 41 and the mounting surface 11 of the substrate 1. That is, in the semiconductor device A10, the light-receiving element 41 disposed on the mounting surface 11 partially overlies the first internal terminals 21. This configuration provides an effective means to avoid upsizing of the semiconductor device A10.

The lens 511 in the first light-transmitting member 51 that covers the light-emitting element 43 is formed in an elliptical shape elongated in the second direction Y in plan view. This shape of the lens 511 enables the length of the second light-transmitting member 52 to be reduced in the second direction, while ensuring the lens 511 to have a sufficient size lens surface. In this way, the center distance between the light-receiving element 41 and the light-emitting element 43 in the first direction X can be shortened, while ensuring that the semiconductor device A10 is able to emit a certain amount of light.

The light-shielding member 6 covering the first light-transmitting member 51 and the second light-transmitting member 52 has the partition wall 63 that isolates the first light-transmitting member 51 from the second light-transmitting member 52. This configuration blocks light emitted from the light-emitting element 43 from directly made incident on the light-emitting element 43 and thus prevents erroneous detection by the light-receiving element 41. In addition, the partition wall 63 is fitted in the first groove 14 formed in the mounting surface 11 of the substrate 1. This configuration improves the bond strength between the light-shielding member 6 and the substrate 1.

The light-shielding member 6 is made of a synthetic resin that differs in the physical property (or physical properties) from the synthetic resin forming the first light-transmitting member 51 and the second light-transmitting member 52. The light-shielding member 6 has a glass transition point lower than the glass transition point of the first light-transmitting member 51 and the second light-transmitting member 52. Consequently, the light-shielding member 6 will have a higher elastic modulus than the first light-transmitting member 51 and the second light-transmitting member 52 at high temperatures experienced by the semiconductor device A10 in use. This configuration thus reduces the temperature stress on the first light-transmitting member 51 and the second light-transmitting member 52 caused by thermal expansion of the light-shielding member 6. Consequently, crack formation is prevented in the first light-transmitting member 51 and the second light-transmitting member 52.

The respective plating layers 39 covering the internal terminals 2 and the external terminals 31 are composed of a Ni layer and a Au layer laminated on one another. The plating layers 39 of this configuration can protect the internal terminals 2 from impacts such as heat, which may occur at the time of mounting the light-receiving element 41 and the light-emitting element 43 or at the time of connecting the first bonding wires 48 or the second bonding wire 49. After the semiconductor device A10 is mounted on a circuit board, in addition, the plating layers can protect the terminal pad portions 311 of the external terminals 31 from erosion caused by solder paste or by other factors.

Embodiment A2

With reference to FIGS. 10 to 13, a semiconductor device A20 according to Embodiment A2 of the present disclosure will be described. In these figures, components identical or similar to the components of the semiconductor device A10 described above are denoted by the same reference signs, and redundant descriptions thereof are omitted.

Figure 10:
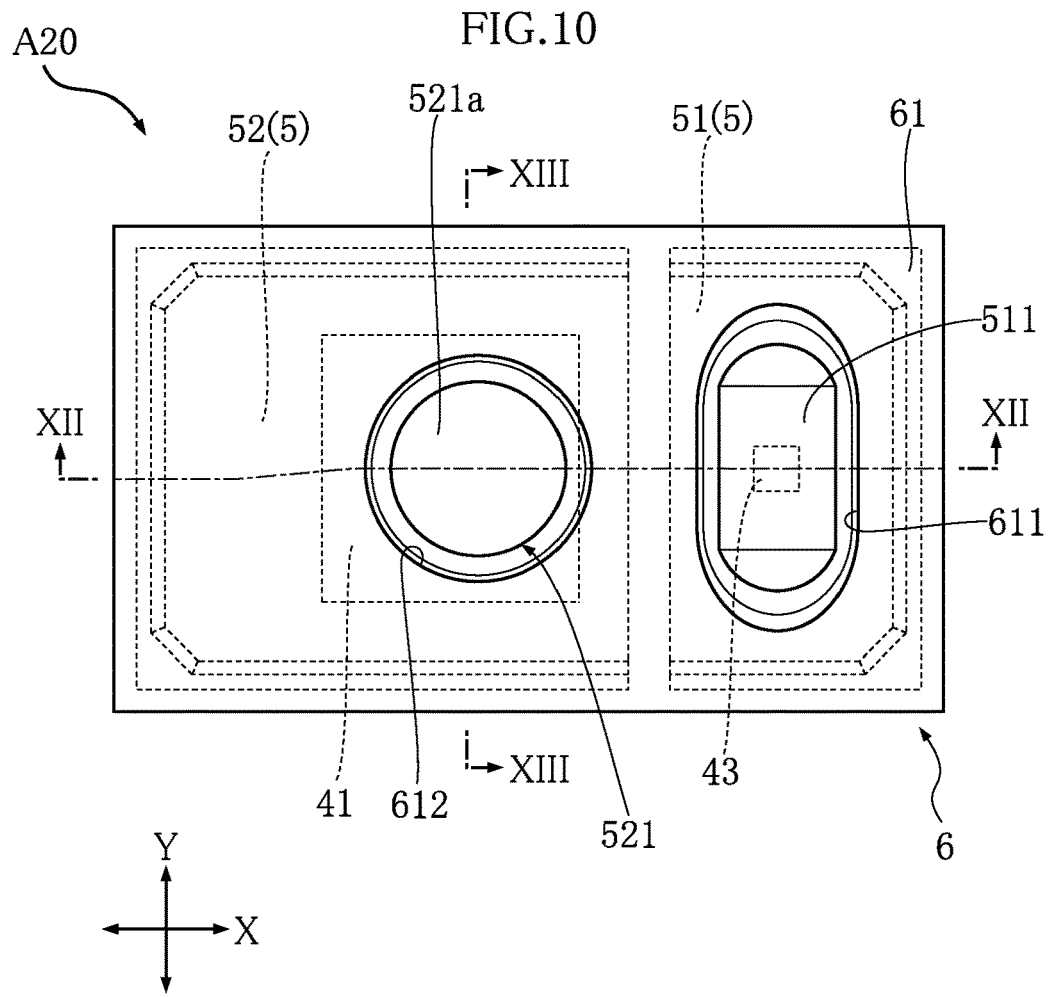
FIG. 10 is a plan view of a semiconductor device according to Embodiment A2 of the present disclosure.
Figure 11:
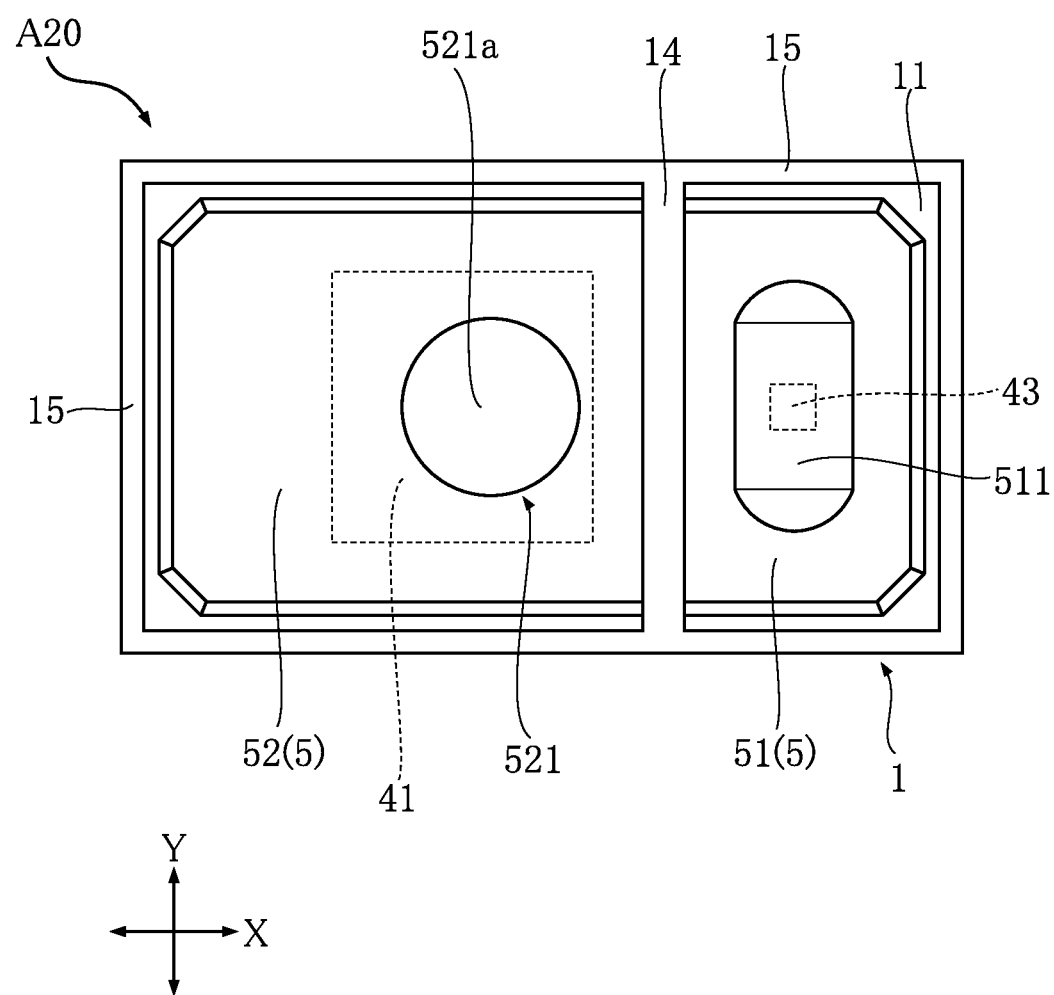
FIG. 11 is a plan view of the semiconductor device of FIG. 10 (with the light-shielding member omitted).
Figure 12:
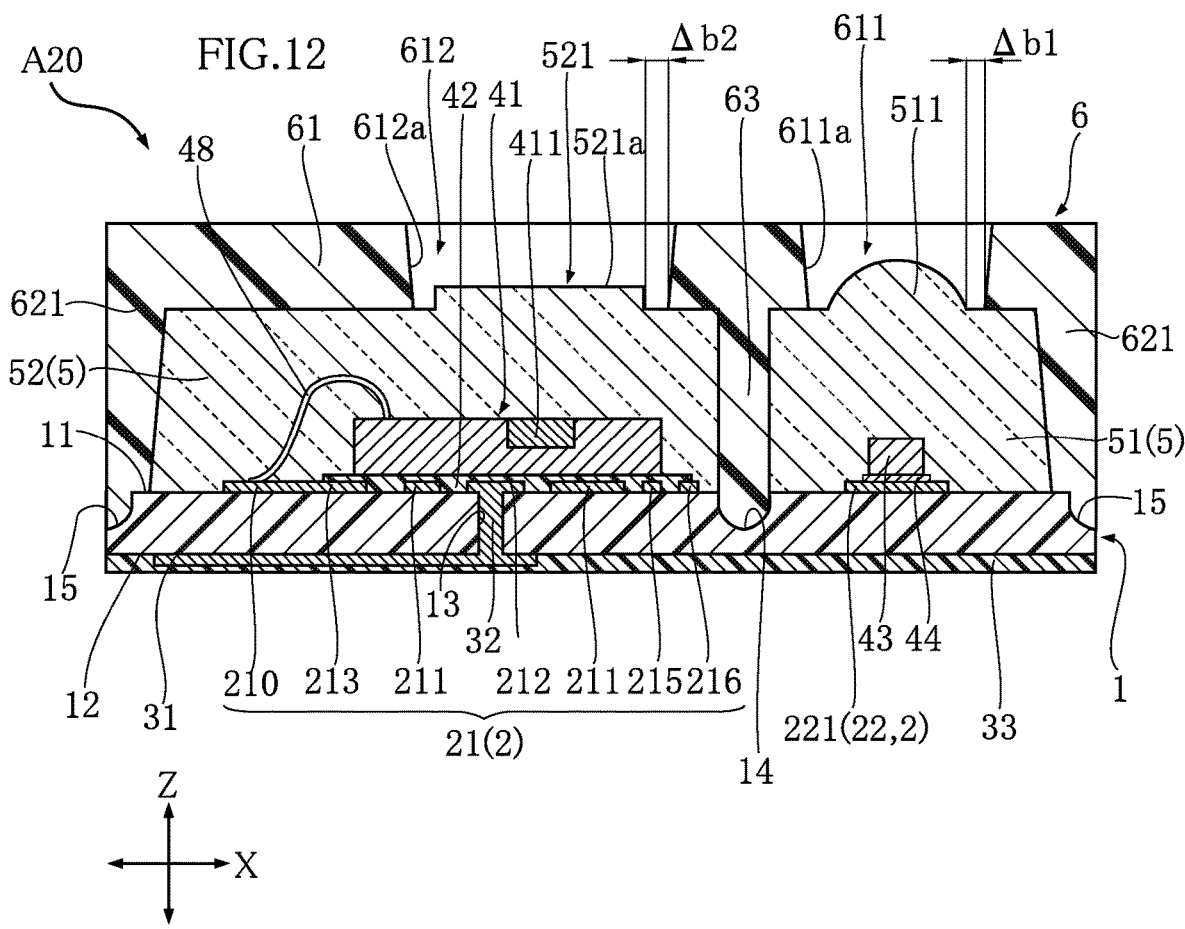
FIG. 12 is a sectional view taken along line XII-XII of FIG. 10.
Figure 13:
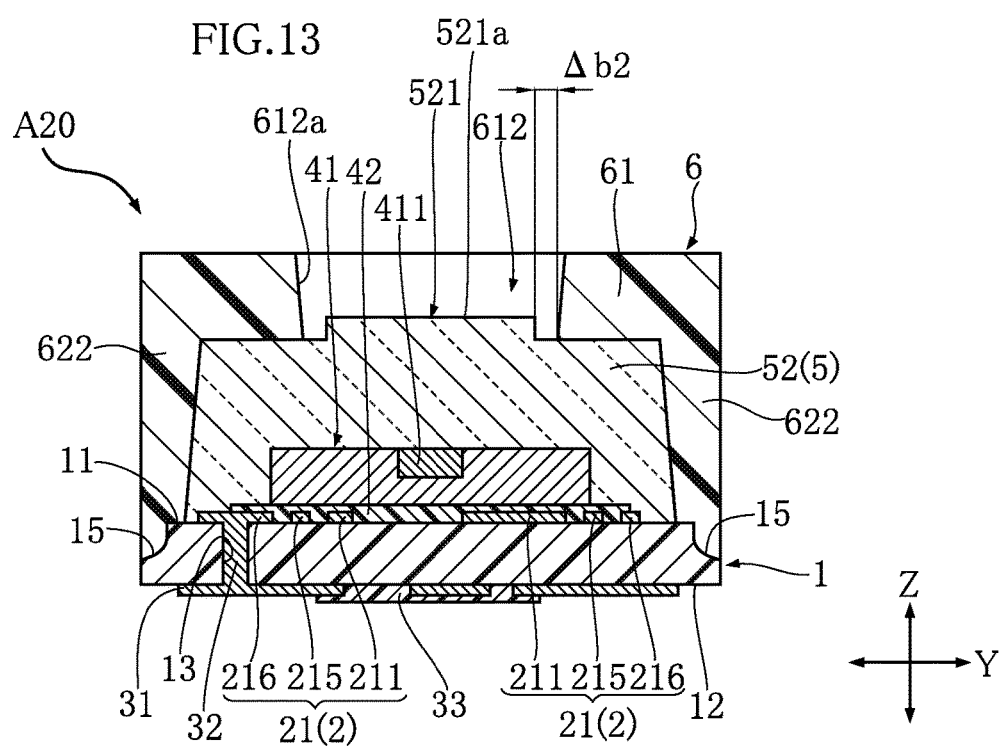
FIG. 13 is a sectional view taken along line XIII-XIII of FIG. 10.

FIG. 10 is a plan view of the semiconductor device A20. FIG. 11 is a plan view of the semiconductor device A20, with the light-shielding member 6 omitted for ease of understanding. FIG. 12 is a sectional view taken along line XII-XII of FIG. 10 (the long dashed short dashed line in FIG. 10). FIG. 13 is a sectional view taken along line XIII-XIII of FIG. 10.

The semiconductor device A20 according to the present embodiment differs from the semiconductor device A10 in the configuration of the substrate 1, the second light-transmitting member 52 and the light-shielding member 6. The semiconductor device A20 according to the present embodiment is rectangular in plan view.

As shown in FIGS. 11 to 13, the substrate 1 according to the present embodiment has a second groove 15 in addition to the first groove 14. The second groove is recessed from the mounting surface 11 and surrounds the first light-transmitting member 51 and the second light-transmitting member 52. The opposite ends of the first groove 14 are connected to the second groove 15. The pair of first side walls 621 and the pair of second side walls 622 of the light-shielding member 6 are fitted in the first groove 14. In the present embodiment, the second groove 15 has a depth (length in the thickness direction Z of the substrate 1) equal to the depth of the first groove 14.

As shown in FIGS. 10 to 13, the incident region 521 of the second light-transmitting member 52 is raised in the thickness direction Z of the substrate 1. The incident region 521 has an incident surface 521a on which light is made incident. The incident surface 521a is a flat surface perpendicular to the thickness direction Z of the substrate 1. In plan view, the incident region 521 according to the present embodiment is circular.

As shown in FIGS. 12 and 13, the present embodiment provides, on the surface of the second light-transmitting member 52 in contact with the top portion 61, a clearance Δb2 between the incident region 521 and the inner wall 612a of the second opening 612. The width of the clearance Δb2 is uniform along the entire circumference of the incident region 521.

The following now describes advantages of the semiconductor device A20.

Similar to the semiconductor device A10 described above, the semiconductor device A20 includes the internal terminals 2, the light-receiving element 41 and the light-emitting element 43 each of which is disposed on the mounting surface 11 of the substrate 1, and also includes the first bonding wires 48 connecting the element pad portions 412 of the light-receiving element 41 to the internal terminals 2. Also in this embodiment, the first bonding wires 48 are located on the side of the light-receiving element 41 opposite the light-emitting element 43. That is, the semiconductor device A20 can reduce the center distance between the light-receiving element 41 and the light-emitting element 43 in the longitudinal direction of the device, while reducing noise in the light-receiving element 41 resulting from the electric current flowing in the light-emitting element 43.

The mounting surface 11 of the substrate 1 has the first groove 14 and also the second groove 15. The light-shielding member 6 is disposed such that the partition wall 63 is fitted in the first groove 14 and the pair of the first side walls 621 and the pair of the second side walls 622 are fitted in the second groove 15. This configuration can further increase the bond strength of the light-shielding member 6 to the substrate 1, as compared to the semiconductor device A10.

The incident region 521 of the second light-transmitting member 52 is raised in the thickness direction Z of the substrate 1. This configuration ensures that light emitted from the light-emitting element 43 and reflected off a target object travels a longer distance in the second light-transmitting member 52, as compared to the semiconductor device A10. In addition, the angle of refraction made of the light passing through the second light-transmitting member 52 at the entrance surface 521a of the entrance region 521 is smaller than the angle of incidence of light at the incident region 521. Consequently, the amount of light reaching the light-receiving region 411 increases as compared to the semiconductor device A10, so that the accuracy of detection by the light-receiving element 41 can be improved.

The following clauses summarizes the embodiments described above.

[Clause 1]

A semiconductor device comprising:

a substrate having a mounting surface and an attachment surface facing away from each other;

a plurality of internal terminals disposed on the mounting surface;

a light-receiving element mounted on the mounting surface of the substrate, the light-receiving element having a light-receiving region that detects light and a plurality of element pad portions, at least one of the plurality of element pad portions being electrically connected to the light-receiving region;

a light-emitting element mounted on the mounting surface of the substrate and spaced apart from the light-receiving element in a first direction perpendicular to a thickness direction of the substrate;

a first bonding wire connecting one of the plurality of element pad portions of the light-receiving element to one of the plurality of internal terminals, the first bonding wire being located on a side of the light-receiving element opposite the light-emitting element in the first direction; and a light-transmitting member covering the light-receiving element, the light-emitting element and the first bonding wire.

[Clause 2]

The semiconductor device according to Clause 1, wherein the plurality of internal terminals include a plurality of first internal terminals each connected to the light-receiving element and a second internal terminal connected to the light-emitting element, and wherein the plurality of first internal terminals are spaced apart from the second internal terminal in the first direction.

[Clause 3]

The semiconductor device according to Clause 2, wherein each of the plurality of first internal terminals has an end forming a first pad portion, one of the first pad portions being connected to the first bonding wire, the first pad portions being arranged along a second direction perpendicular to both the thickness direction of the substrate and the first direction.

[Clause 4]

The semiconductor device according to Clause 3, wherein the plurality of first internal terminals have a portion extending in the second direction in plan view and in a region of the mounting surface of the substrate between a center of the light-receiving element and a center of the light-emitting element.

[Clause 5]

The semiconductor device according to Clause 3 or 4, wherein at least one of the plurality of first internal terminals overlaps with the light-receiving element in plan view.

[Clause 6]

The semiconductor device according to Clause 5, further comprising a first bonding layer that is an electrical insulator and that is interposed between the light-receiving element and the mounting surface of the substrate.

[Clause 7]

The semiconductor device according to any one of Clauses 3 to 6, wherein the light-receiving element comprises an integrated circuit, and the light-receiving region comprises a photodiode.

[Clause 8]

The semiconductor device according to any one of Clauses 3 to 7, wherein the second internal terminal includes a die pad portion on which the light-emitting element is mounted and a second pad portion spaced apart from the die pad portion in the second direction, and wherein the semiconductor device comprises a second bonding wire connecting the light-emitting element to the second pad portion.

[Clause 9]

The semiconductor device according to Clause 8, wherein the second bonding wire extends in the second direction.

[Clause 10]

The semiconductor device according to Clause 8 or 9, wherein the second bonding wire and the first bonding wire are both made of an identical material.

[Clause 11]

The semiconductor device according to any one of Clauses 8 to 10, further comprising a second bonding layer that is an electric conductor and that is interposed between the light-emitting element and the die pad portion.

[Clause 12]

The semiconductor device according to any one of Clauses 3 to 11, wherein the light-transmitting member includes a first light-transmitting member and a second light-transmitting member, the first light-transmitting member covers the light-emitting element and has a convex lens from which light is emitted, and the second light-transmitting member covers the first bonding wire and has an incident region on which light is made incident, and wherein the first light-transmitting member and the second light-transmitting member are disposed on the mounting surface of the substrate and spaced apart from each other in the first direction.

[Clause 13]

The semiconductor device according to Clause 12, further comprising a light-shielding member having a first opening and a second opening and covering the first light-transmitting member and the second light-transmitting member, wherein the lens is exposed through the first opening, and the incident region is exposed through the second opening 39.

[Clause 14]

The semiconductor device according to Clause 13, wherein the lens has an elliptical shape elongated in the second direction in plan view.

[Clause 15]

The semiconductor device according to Clause 14, wherein the first opening has an elliptical shape elongated in the second direction in plan view.

[Clause 16]

The semiconductor device according to any one of Clauses 13 to 15, wherein a clearance is provided between the lens and an inner wall of the first opening.

[Clause 17]

The semiconductor device according to Clause 16, wherein the inner wall of the first opening has a surface inclined toward a center of the first opening with a decreasing distance to the light-emitting element in the thickness direction of the substrate.

[Clause 18]

The semiconductor device according to any one of Clauses 13 to 17, wherein the second opening has a circular shape in plan view.

[Clause 19]

The semiconductor device according to any one of Clauses 13 to 18, wherein the inner wall of the second opening has a surface inclined toward a center of the second opening with a decreasing distance to the light-receiving element in the thickness direction of the substrate.

[Clause 20]

The semiconductor device according to Clause 19, wherein the incident region is raised in the thickness direction of the substrate, the entrance region comprising an incident surface on which light is made incident, the incident surface being a flat surface perpendicular to the thickness direction of the substrate.

[Clause 21]

The semiconductor device according to Clause 20, wherein the incident region has a circular shape in plan view.

[Clause 22]

The semiconductor device according to Clause 20 or 21, wherein a clearance is provided between the incident region and the inner wall of the second opening.

[Clause 23]

The semiconductor device according to any one of Clauses 13 to 22, wherein the light-shielding member includes a partition wall isolating the first light-transmitting member from the second light-transmitting member.

[Clause 24]

The semiconductor device according to Clause 23, wherein the substrate has a first groove recessed from the mounting surface and located between the first light-transmitting member and the second light-transmitting member, and wherein the partition wall is fitted in the first groove.

[Clause 25]

The semiconductor device according to Clause 24, wherein the substrate has a second groove that is recessed from the mounting surface and surrounds the first light-transmitting member and the second light-transmitting member, and wherein the light-shielding member is fitted in the second groove.

[Clause 26]

The semiconductor device according to Clause 25, wherein the first groove has a first end and a second end each of which is connected to the second groove.

[Clause 27]

The semiconductor device according to any one of Clauses 13 to 26, wherein the first light-transmitting member and the second light-transmitting member are both made of an identical synthetic resin.

[Clause 28]

The semiconductor device according to Clause 27, wherein the light-shielding member is made of a synthetic resin having a different physical property from the synthetic resin of the first light-transmitting member and the second light-transmitting member, and a glass transition point of the light-shielding member is lower than a glass transition point of the first light-transmitting member and the second light-transmitting member.

[Clause 29]

The semiconductor device according to any one of Clauses 1 to 28, further comprising a plurality of external terminals disposed on the attachment surface of the substrate, wherein each of the plurality of external terminals is electrically connected to one of the plurality of internal terminals.

[Clause 30]

The semiconductor device according to Clause 29, further comprising a plating layer covering at least one of: the plurality of internal terminals; and the plurality of external terminals.

[Clause 31]

The semiconductor device according to any one of Clauses 1 to 30, wherein the light-emitting element comprises a light-emitting diode.

Embodiment B1

With reference to FIGS. 14 to 23, the following describes a semiconductor device A10 according to Embodiment B1 of the present disclosure. The semiconductor device A10 includes a substrate 1, internal terminals 2, external terminals 31, a light-receiving element 41, a first bonding layer 42, a light-emitting element 43, a second bonding layer 44, first bonding wires 48, a second bonding wire 49, a light-transmitting member 5 and a light-shielding member 6.

Figure 14:
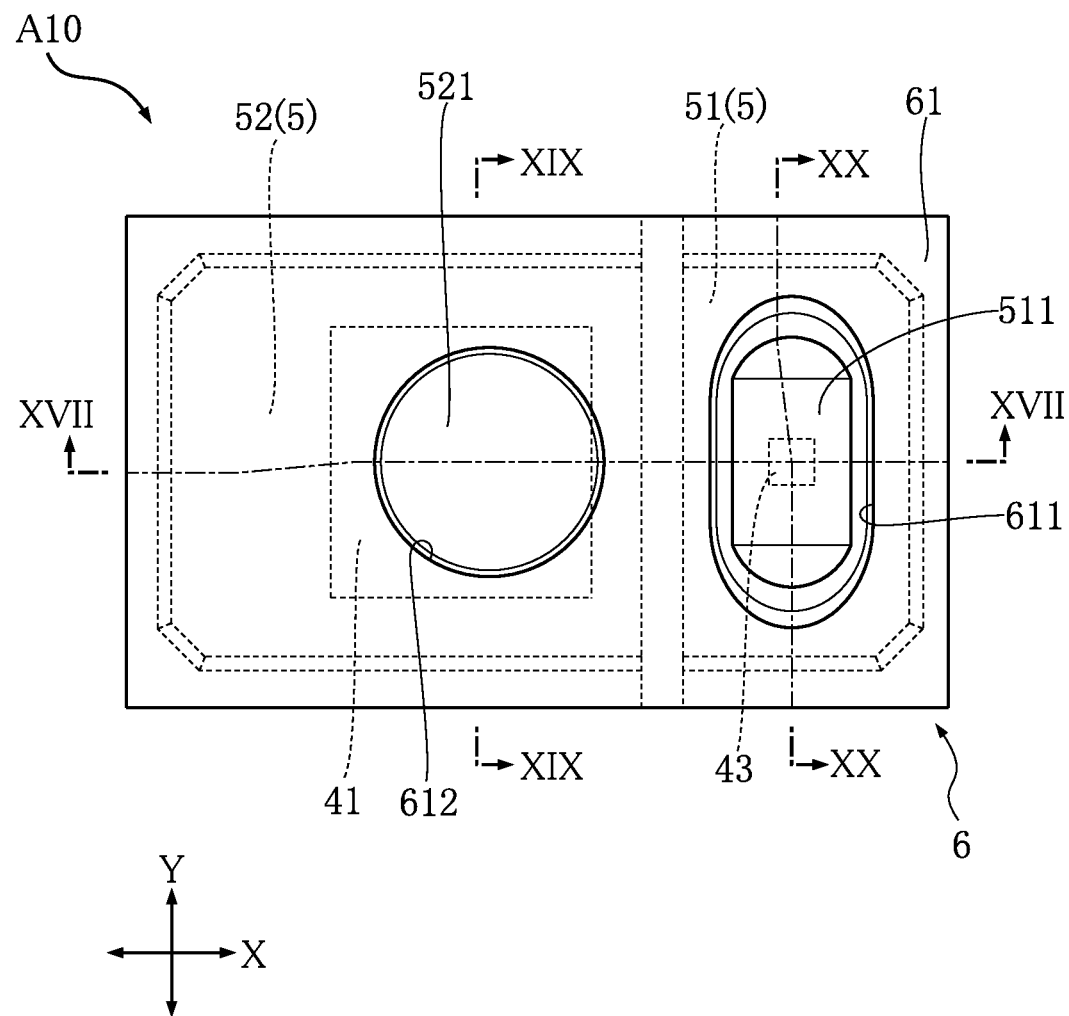
FIG. 14 is a plan view of a semiconductor device according to Embodiment B1 of the present disclosure.
Figure 15:
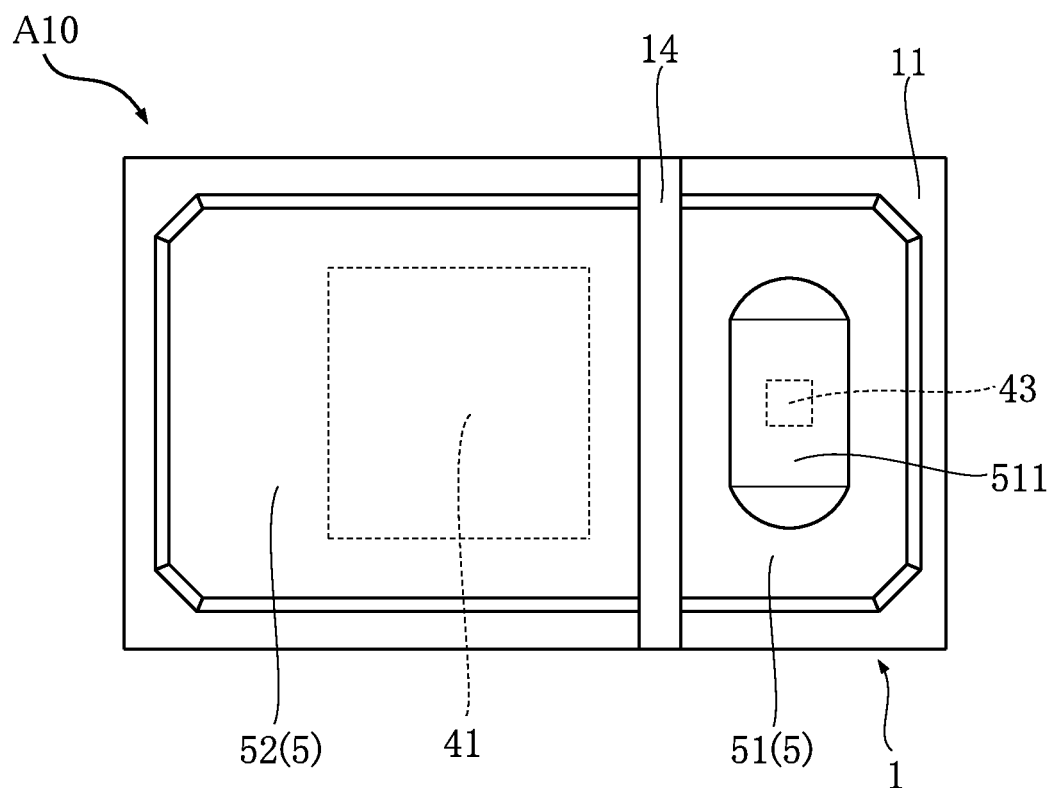
FIG. 15 is a plan view of the semiconductor device of FIG. 14 (with the light-shielding member omitted).
Figure 16:
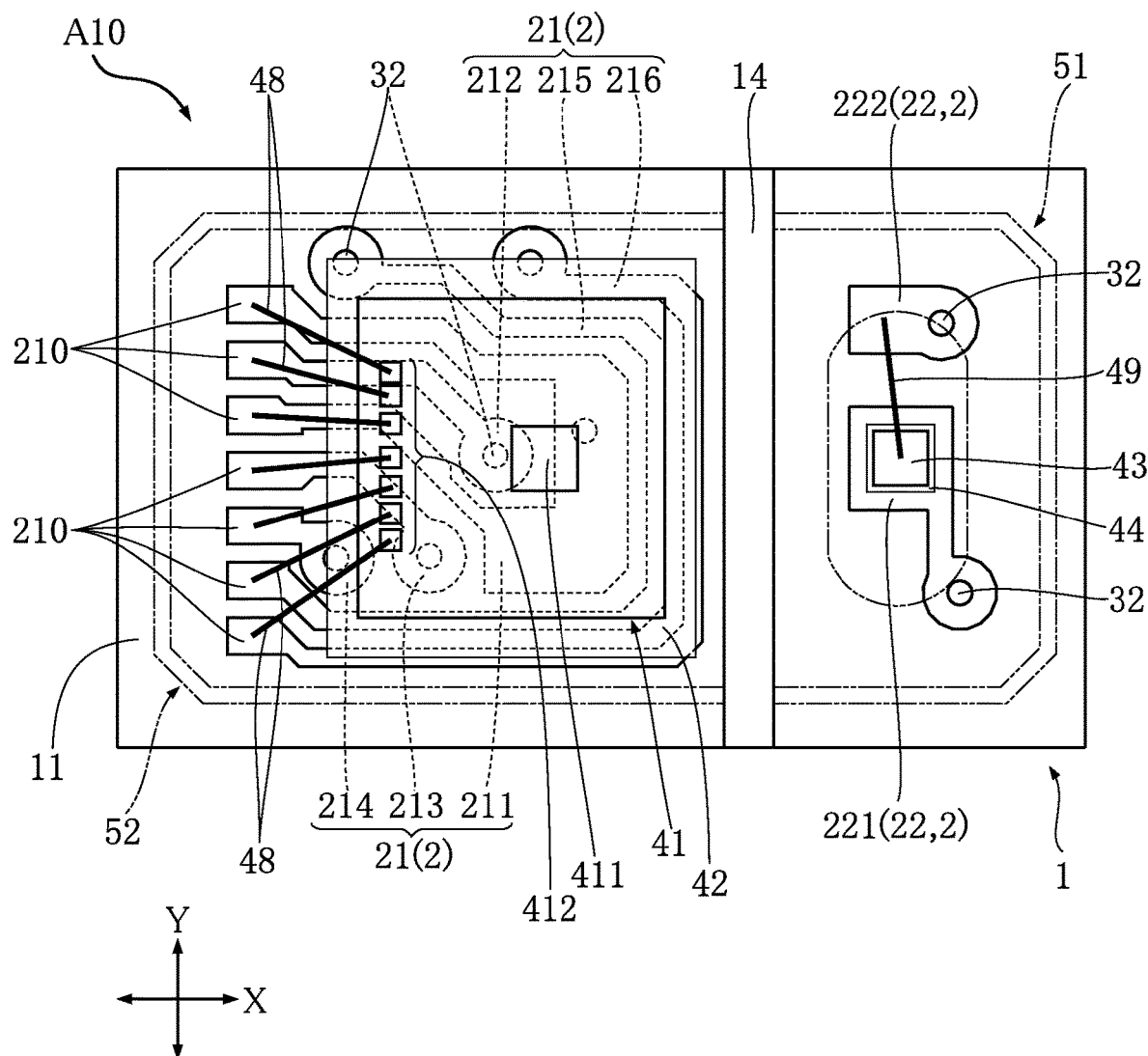
FIG. 16 is a plan view of the semiconductor device of FIG. 14 (with the light-transmitting member and the light-shielding member omitted).
Figure 17:
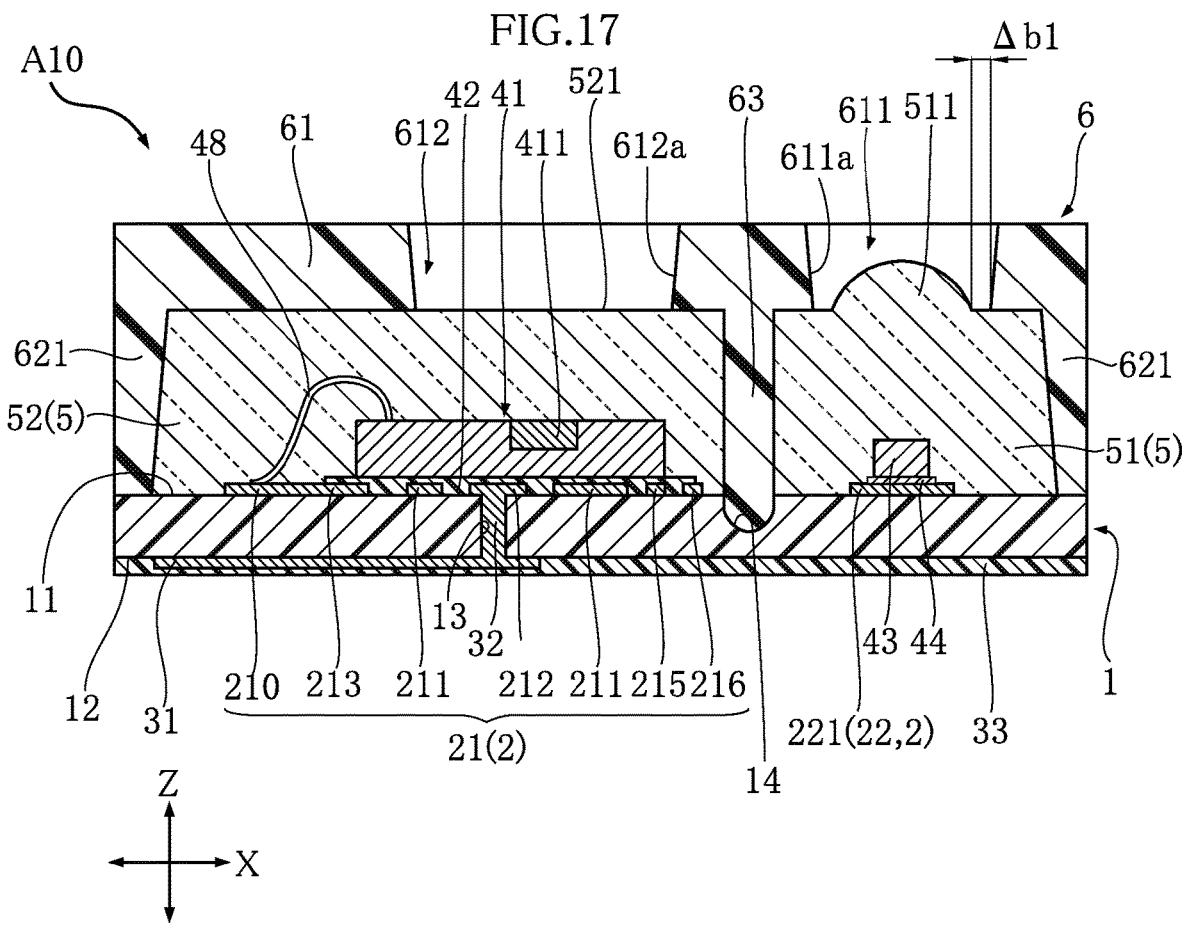
FIG. 17 is a sectional view taken along line XVII-XVII of FIG. 14.
Figure 18:
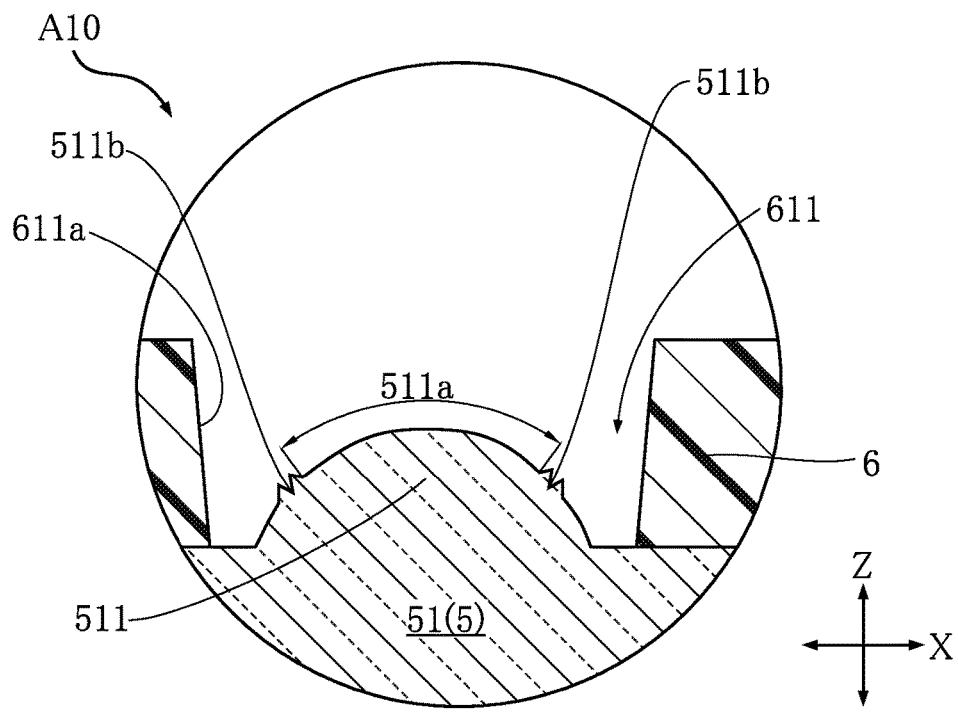
FIG. 18 is a partially enlarged view of FIG. 17.
Figure 19:
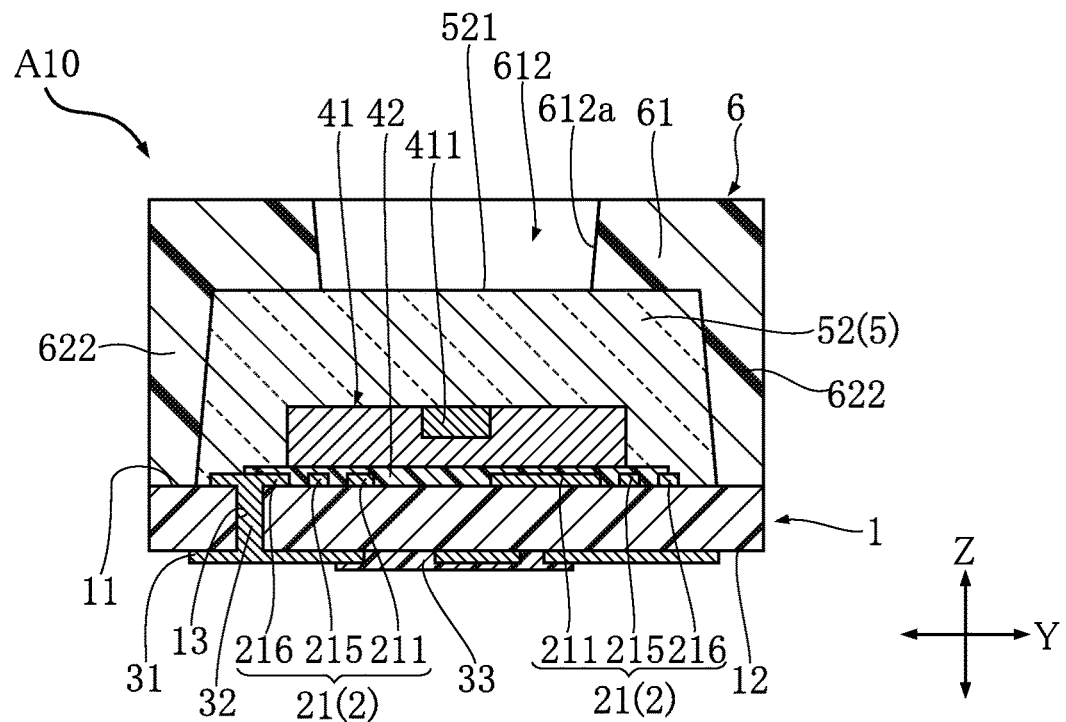
FIG. 19 is a sectional view taken along line XIX-XIX of FIG. 14.
Figure 20:
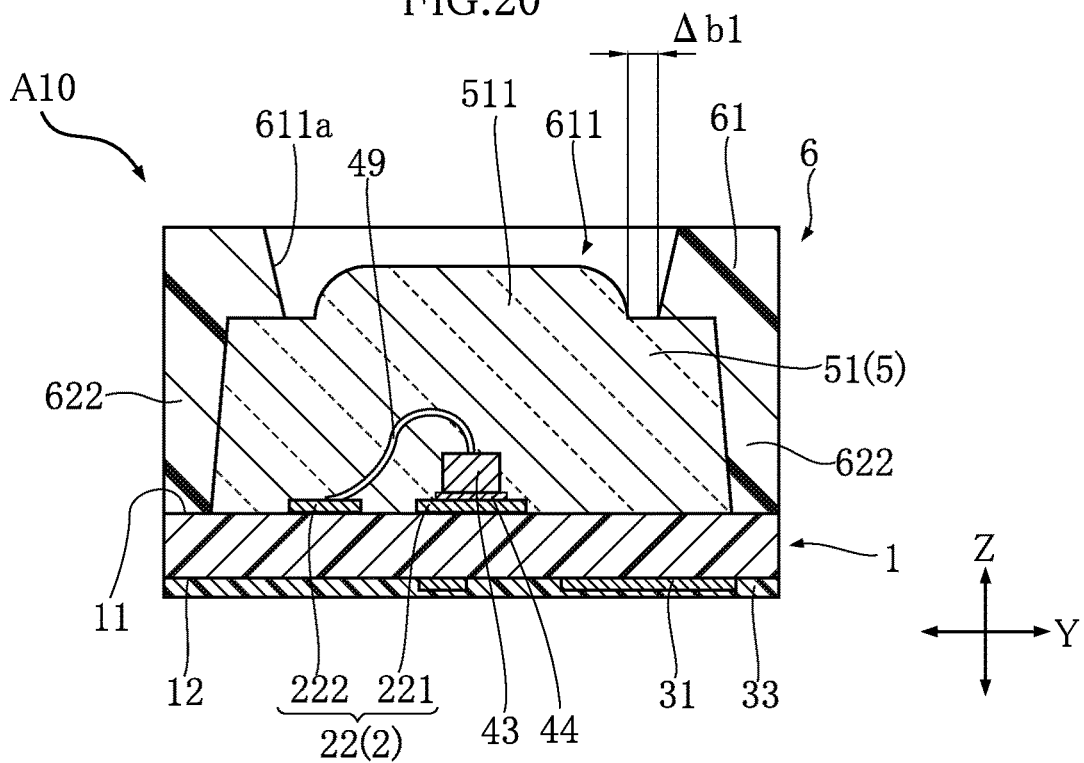
FIG. 20 is a sectional view taken along line XX-XX of FIG. 14.
Figure 21:
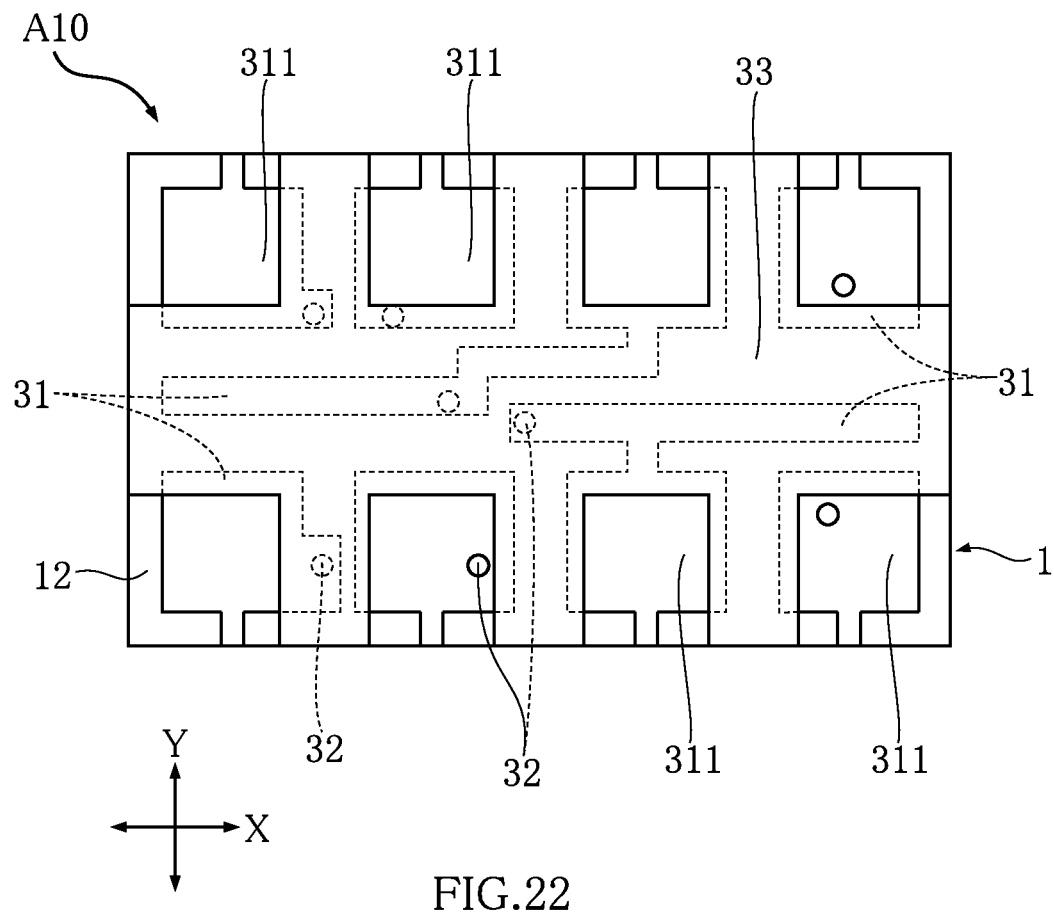
FIG. 21 is a bottom view of the semiconductor device of FIG. 14.
Figure 22:
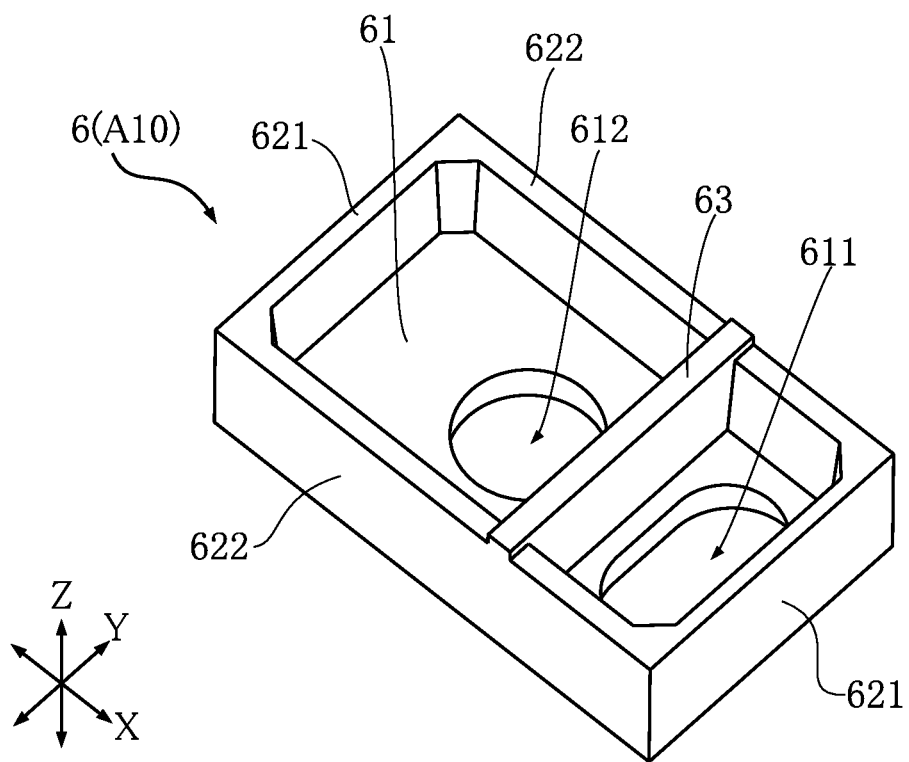
FIG. 22 is a perspective view showing the light-shielding member of the semiconductor device of FIG. 14.
Figure 23:
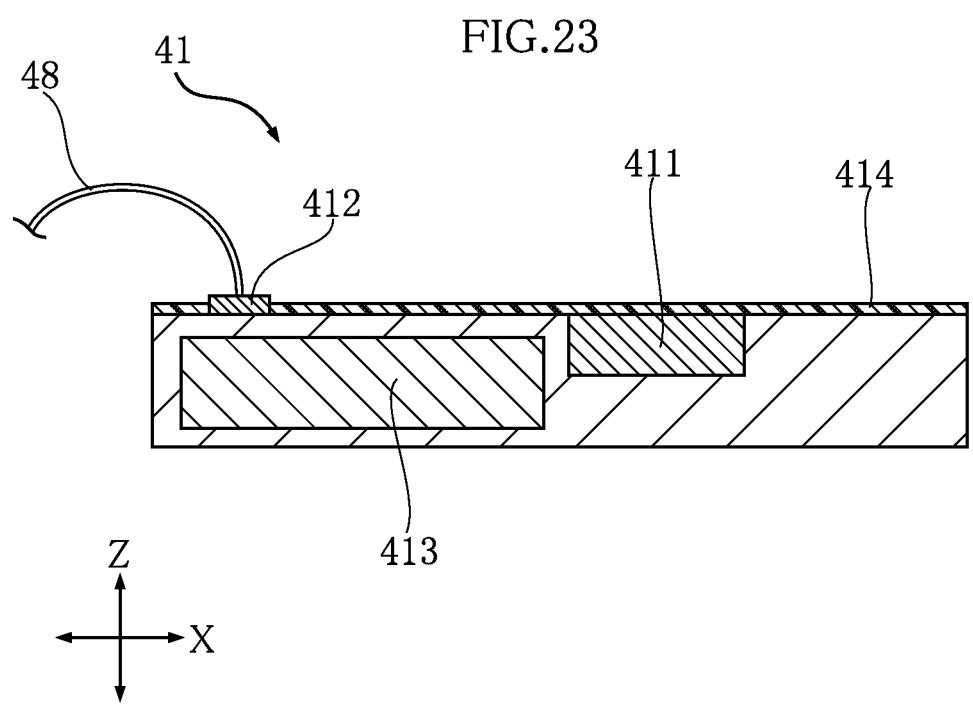
FIG. 23 is a sectional view showing a light-receiving element of the semiconductor device of FIG. 14.

FIG. 14 is a plan view of the semiconductor device A10. FIG. 15 is a plan view of the semiconductor device A10, with the light-shielding member 6 omitted for ease of understanding. FIG. 16 is a plan view of the semiconductor device A10, with the light-transmitting member 5 and the light-shielding member 6 omitted for ease of understanding. The omitted light-transmitting member 5 is indicated by phantom lines (chain double-dashed lines). FIG. 17 is a sectional view taken along line XVII-XVII of FIG. 14 (the long dashed short dashed line in FIG. 14). FIG. 18 is a partially enlarged view of FIG. 17. FIG. 19 is a sectional view taken along line XIX-XIX of FIG. 14. FIG. 20 is a sectional view taken along line XX-XX of FIG. 14 (the long dashed short dashed line in FIG. 14). FIG. 21 is a bottom view of the semiconductor device A10. FIG. 22 is a perspective view of the light-shielding member 6 of the semiconductor device A10. FIG. 23 is a cross-sectional view of the light-receiving element 41 of the semiconductor device A10.

The semiconductor device A10 shown in these figures is designed for surface mounting on the circuit boards of electronic devices, such as smartphones and tablet computers. For the purpose of description, the right-and-left direction as seen in the plan view figures and perpendicular to the thickness direction Z of the substrate 1 is defined as a first direction X. Similarly, the up-and-down direction as seen in the plan view figures and perpendicular to both the thickness direction Z of the substrate 1 and the first direction X is defined as a second direction Y. As shown in FIG. 14, the semiconductor device A10 according to the present embodiment has a rectangular shape in plan view, i.e., as viewed in the thickness direction Z of the substrate 1 (hereinafter, simply "plan view"). The first direction X corresponds to the longitudinal direction of the semiconductor device A10.

As shown in FIGS. 15 to 17, the substrate 1 is a component for mounting the light-receiving element 41 and the light-emitting element 43 thereon and also for mounting the semiconductor device A10 on a circuit board. The substrate 1 is an electrical insulator and made of a glass epoxy resin, for example. In plan view, the substrate 1 is rectangular having the long sides extending in the first direction X. The substrate 1 has a mounting surface 11, an attachment surface 12 and through holes 13.

As shown in FIGS. 16, 17 and 21, the mounting surface 11 and the attachment surface 12 face away from each other in the thickness direction Z of the substrate 1. In addition, both the mounting surface 11 and the attachment surface 12 are flat surfaces and rectangular in plan view with their long sides extending in the first direction X. The mounting surface 11 faces upward as seen in FIG. 17. The light-receiving element 41 and the light-emitting element 43 are mounted on the mounting surface 11, along with the internal terminals 2. The entire mounting surface 11 is covered by the light-transmitting member 5 and the light-shielding member 6. The attachment surface 12 faces downward as seen in FIG. 17. The attachment surface 12 is a side used to attach the semiconductor device A10. The external terminals 31 are mounted on the attachment surface 12.

As shown in FIGS. 17 and 19, a through hole 13 is formed in the substrate 1 to extend from the mounting surface 11 to the attachment surface 12. In the present embodiment, a plurality of through holes 13 are formed in the substrate 1. Each through hole 13 is filled with a connection terminal 32, which will be described later. In addition, as shown in FIGS.

15 to 17, the substrate 1 has a first engagement groove 14 that is recessed from the mounting surface 11 and extends in the second direction Y. That is, the mounting surface 11 according to the present embodiment is divided into two regions by the first engagement groove 14. The first engagement groove 14 has a curved bottom surface.

As shown in FIGS. 16, 17, 19 and 20, the internal terminals 2 are electric conductors each of which is electrically connected to the light-receiving element 41 or the light-emitting element 43. The internal terminals 2 are made of Cu, for example. The internal terminals 2 according to the present embodiment include a plurality of first internal terminals 21 electrically connected to the light-receiving element 41 and a second internal terminal 22 electrically connected to the light-emitting element 43. The first internal terminals 21 are spaced apart from the second internal terminal 22 in the first direction X across the first engagement groove 14 formed in the substrate 1 as a boundary. The internal terminals 2 according to the present embodiment are covered by a plating layer 39. The plating layer 39 is composed of a Ni layer and a Au layer laminated on one another.

As shown in FIGS. 16, 17 and 19, the first internal terminals 21 according to the present embodiment include a first terminal 211, a second terminal 212, a third terminal 213, a fourth terminal 214, a fifth terminal 215 and a sixth terminal 216. Each first internal terminal 21 is electrically connected to the light-receiving element 41 via a first bonding wire 48. Each first internal terminal 21 has an end forming a first pad portion 210 to which the first bonding wire 48 is connected. The first pad portions 210 are arranged along the second direction Y. Each first internal terminal 21 is electrically connected also to a connection terminal 32, which will be described later.

As shown in FIG. 16, the first terminal 211 surrounds the second terminal 212. Unlike the other first internal terminals 21, the first terminal 211 has the first pad portions 210 at either end thereof. As a result, the first pad portion 210 of the second terminal 212 is located between the first pad portions 210 of the first terminal 211 in the second direction Y. The third terminal 213 is adjacent to the first terminal 211, and the fourth terminal 214 is adjacent to the third terminal 213. In the present embodiment, the fourth terminal 214 is the shortest one among the plurality of first internal terminals 21. The fifth terminal 215 is adjacent to each of the first terminal 211, the third terminal 213 and the fourth terminal 214 and surrounds these adjacent terminals. The sixth terminal 216 is adjacent to the fifth terminal 215 and surrounds the fifth terminal 215. The sixth terminal 216 is the closest one to the light-emitting element 43 in the first direction, among the plurality of first internal terminals 21.

As shown in FIG. 16, among the plurality of first internal terminals 21, each of the first terminal 211, the fifth terminal 215 and the sixth terminal 216 has a portion extending in the second direction Y, in a region of the mounting surface 11 of the substrate 1 between the center of the light-receiving element 41 and the center of the light-emitting element 43. Each of the first internal terminals 21, except for the sixth terminal 216, partially overlaps with the light-receiving element 41 in plan view.

As shown in FIGS. 16, 17 and 20, the second internal terminal 22 has a die pad portion 221 on which the light-emitting element 43 is mounted and a second pad portion 222 spaced apart from the die pad portion 221 in the second direction Y. The die pad portion 221 is electrically connected to the light-emitting element 43 via the second bonding layer 44. The second pad portion 222 is connected to the second bonding wire 49, so that the second pad portion 222 is electrically connected to the light-emitting element 43 via the second bonding wire 49. Each of the die pad portion 221 and the second pad portion 222 is connected to a connection terminal 32, which will be described later.

As shown in FIGS. 17 and 19 to 21, each external terminal 31 is a conductor electrically connected to the light-receiving element 41 or the light-emitting element 43 via a connection terminal 32 disposed in a through hole 13 of the substrate 1 and an internal terminal 2. The external terminals 31 and the connection terminals 32 are made of the same material as the internal terminals 2. In the present embodiment, the material is Cu, for example. The external terminals 31 are partially covered by a resist film 33 of an electrical insulator, and each external terminal has a terminal pad portion 311 exposed from the resist film 33. Each terminal pad portion 311 is rectangular in plan view. When the semiconductor device A10 is mounted on a circuit board, the terminal pad portions 311 are electrically connected to the circuit board wiring via, for example, solder paste.

Similarly to the internal terminals 2, the external terminals 31 according to the present embodiment are covered by a plating layer 39. In addition, the resist film 33 partially covering the external terminals 31 is made of, for example, solder resist.

The light-receiving element 41 and the light-emitting element 43 are the central components for the function of the semiconductor device A10. As shown in FIG. 23, the light-receiving element 41 according to the present embodiment is an integrated circuit (IC) having a light-receiving region 411, element pad portions 412, a functional region 413 and a laminated optical film 414.

The light-receiving region 411 is a portion that detects light emitted from the light-emitting element 43 and then reflected from a target object. Specifically, the light-receiving region in the present embodiment is a photodiode that detects infrared radiation. The light-receiving region 411 outputs the electrical voltage created by the photovoltaic effect occurring when light is detected. The element pad portions 412 are a plurality of components made of, for example, Al and each electrically connected to the light-receiving region 411 or the functional region 413. As shown in FIG. 16, each element pad portion 412 is connected to a first bonding wire 48, so that the element pad portions 412 are electrically connected to the respective first internal terminals 21 via the first bonding wires 48. The functional region 413 is electrically connected to the light-receiving region 411 and outputs a proximity signal indicating the presence of a nearby object based on the output voltage of the light-receiving region 411 obtained as a result of calculation. The functional region 413 outputs a proximity signal to the outside of the semiconductor device A10 when the output voltage exceeds a predetermined threshold. The laminated optical film 414 is made of a synthetic resin that is transparent only to light in the wavelength range corresponding to infrared radiation. In the light-receiving element 41, the laminated optical film 414 covers the light-receiving region 411 and the functional region 413. Thus, the light-receiving region 411 and the functional region 413 are not affected by light having other wavelengths, such as visible light.

The first bonding layer 42 is an electrical insulator and interposed between the light-receiving element 41 and the mounting surface 11 of the substrate 1, as shown in FIGS. 16, 17 and 19. The first bonding layer 42 secures the light-receiving element 41 to the mounting surface 11 by bonding. The first bonding layer 42 is made of an epoxy resin or polyimide, for example. The first bonding layer 42 partially covers the mounting surface 11 and the first internal terminals 21.

As shown in FIGS. 16, 17 and 20, the light-emitting element 43 is a semiconductor element that emits light. In the present embodiment, an infrared light-emitting diode is used. The light-emitting element 43 emits infrared radiation from the upper surface as seen in FIGS. 17 and 20, and the second bonding wire 49 is connected to the upper surface. That is, the upper surface is electrically connected to the second pad portion 222 of the second internal terminal 22 via the second bonding wire 49. In addition, the lower surface of the light-emitting element 43 as seen in FIGS. 17 and 20 is electrically connected to the die pad portion 221 of the second internal terminal 22 via the second bonding layer 44.

The second bonding layer 44 is an electric conductor and interposed between the light-emitting element 43 and the die pad portion 221 of the second internal terminal 22, as shown in FIGS. 16, 17 and 20. The second bonding layer 44 secures the light-emitting element 43, by die bonding, to the die pad portion 221 disposed on the mounting surface 11. The second bonding layer 44 may be made of an epoxy-based synthetic resin containing Ag (so-called Ag paste).

The first bonding wires 48 are electric conductors connecting the element pad portions 412 of the light-receiving element 41 to the first internal terminals 21 among the internal terminals 2, as shown in FIGS. 16 and 17. In the present embodiment, the first bonding wires 48 are located on the side of the light-receiving element 41 opposite the light-emitting element 43 in the first direction X. In addition, the second bonding wire 49 is an electric conductor connecting the light-emitting element 43 to the second pad portion 222 of the second internal terminal 22, as shown in FIGS. 16 and 20. The second bonding wire 49 is made of the same material as the first bonding wires 48. In the present embodiment, both the first bonding wires 48 and the second bonding wire 49 are made of Au.

As shown in FIGS. 15 to 17, 19 and 20, the light-transmitting member 5 covers the internal terminals 2, the light-receiving element 41, the light-emitting element 43, the first bonding wires 48 and the second bonding wire 49 on the mounting surface 11 of the substrate 1. The light-transmitting member 5 according to the present embodiment includes a first light-transmitting member 51 and a second light-transmitting member 52. Both the first light-transmitting member 51 and the second light-transmitting member 52 are made of the same transparent synthetic resin that passes light in the wavelength range from visible to infrared. The first light-transmitting member 51 and the second light-transmitting member 52 on the mounting surface 11 are spaced apart from each other in the first direction X across the first groove 14 formed in the substrate 1 as a boundary.

As shown in FIGS. 15, 17 and 20, the first light-transmitting member 51 has the shape of a substantially truncated pyramid and covers the second internal terminal 22, the light-emitting element 43 and the second bonding wire 49. As shown in FIGS. 14 and 15, the first light-transmitting member 51 has a convex lens 511 through which light emitted by the light-emitting element 43 is transmitted to the outside of the semiconductor device A10. In plan view, the lens 511 according to the present embodiment has an elliptical shape elongated in the second direction Y. As shown in FIG. 18, the lens 511 according to the present embodiment has a central portion 511*a* located centrally in plan view and an annular portion 511*b* surrounding the central portion 511*a*. The annular portion 511*b* has higher surface roughness than the central portion 511*a*.

As shown in FIGS. 15, 17 and 19, the second light-transmitting member 52 has the shape of a substantially truncated pyramid and covers the first internal terminals 21, the light-receiving element 41 and the first bonding wires 48. As shown in FIGS. 14 and 15, the second light-transmitting member 52 has an incident region 521 on which light is made incident after the light is emitted from the light-emitting element 43 and reflected from a target object. The incident region 521 is a surface of the second light-transmitting member 52 exposed through a second opening 612 of the light-shielding member 6, which will be described later. The incident region 521 according to the present embodiment is a flat surface.

As shown in FIGS. 14, 15, 17, 19 and 20, the light-shielding member 6 covers both the first light-transmitting member 51 and the second light-transmitting member 52 of the light-transmitting member 5. As shown in FIG. 22, the light-shielding member 6 has a top portion 61, a pair of first side walls 621, a pair of second side walls 622 and a partition wall 63. The light-shielding member 6 is made of a light-shielding synthetic resin, such as a black epoxy resin. In the present embodiment, the light-shielding member 6 is made of a synthetic resin that differs in the physical property (or physical properties) from the synthetic resin forming the first light-transmitting member 51 and the second light-transmitting member 52. The light-shielding member 6 has a glass transition point lower than the glass transition point of the first light-transmitting member 51 and the second light-transmitting member 52.

As shown in FIGS. 14, 15, 17, 19, 20 and 22, the top portion 61 overlies the first light-transmitting member 51 and the second light-transmitting member 52 in the thickness direction Z of the substrate 1. In plan view, the top portion 61 is equal in size to the substrate 1. The top portion 61 has a first opening 611 and a second opening 612. As shown in FIGS. 14, 15, 17, 20 and 22, the first opening 611 is a through hole formed in the top portion 61 to expose the lens 511. In plan view, the first opening 611 has an elliptical shape elongated in the second direction Y. An inner wall 611*a* of the first opening 611 has a surface inclined toward the center of the first opening as the distance to the light-emitting element 43 decreases in the thickness direction Z of the substrate 1. The inclination angle of the inner wall 611*a* of the first opening 611 relative to the first direction X is uniform along the entire circumference of the first opening 611. In addition, as shown in FIGS. 17 and 20, on the surface of the first light-transmitting member 51 in contact with the top portion 61, a clearance Δb1 is provided between the lens 511 and the inner wall 611*a* of the first opening 611. The width of the clearance Δb1 is uniform along the entire circumference of the lens 511.

As shown in FIGS. 14, 15, 17, 19 and 22, the second opening 612 is a through hole formed in the top portion 61 to expose the incident region 521. The second opening 612 is spaced apart from the first opening 611 in the first direction X. In plan view, the second opening 612 is circular. An inner wall 612*a* of the second opening 612 has a surface inclined toward the center of the second opening as the distance to the light-receiving element 41 decreases in the thickness direction Z of the substrate 1. The inclination angle of the inner wall 612*a* of the second opening 612 relative to the first direction X is uniform along the entire circumference of the second opening 612.

As shown in FIGS. 17 and 22, the pair of first side walls 621 are spaced apart from each other in the first direction X.

In the thickness direction Z of the substrate 1, one end of each first side wall is connected to the top portion 61 and the other end is in contact with the substrate 1. In the second direction Y, the ends of each first side wall 621 are connected to the pair of second side walls 622. As shown in FIGS. 19, 20 and 22, in addition, the pair of second side walls 622 are spaced apart from each other in the second direction Y. In the thickness direction Z of the substrate 1, one end of each second side wall is connected to the top portion 61 and the other end is in contact with the substrate 1. In the first direction X, the opposite ends of each second side wall 622 are connected to the pair of first side walls 621. That is, the pair of first side walls 621 and the pair of second side walls 622 are disposed to surround the first light-transmitting member 51 and the second light-transmitting member 52.

As shown in FIGS. 17 and 22, the partition wall 63 is a barrier isolating the first light-transmitting member 51 from the second light-transmitting member 52. The partition wall 63 is parallel to the pair of first side walls 621, and the opposite ends in the second direction Y are connected to the pair of second side walls 622. In addition, one end of the partition wall in the thickness direction Z of the substrate 1 is connected to the top portion 61, and the other end is fitted in the first groove 14 formed in the mounting surface 11 of the substrate 1.

The following now describes one example of a method for manufacturing the semiconductor device A10 with reference to FIGS. 24 to 32.

Figure 26:
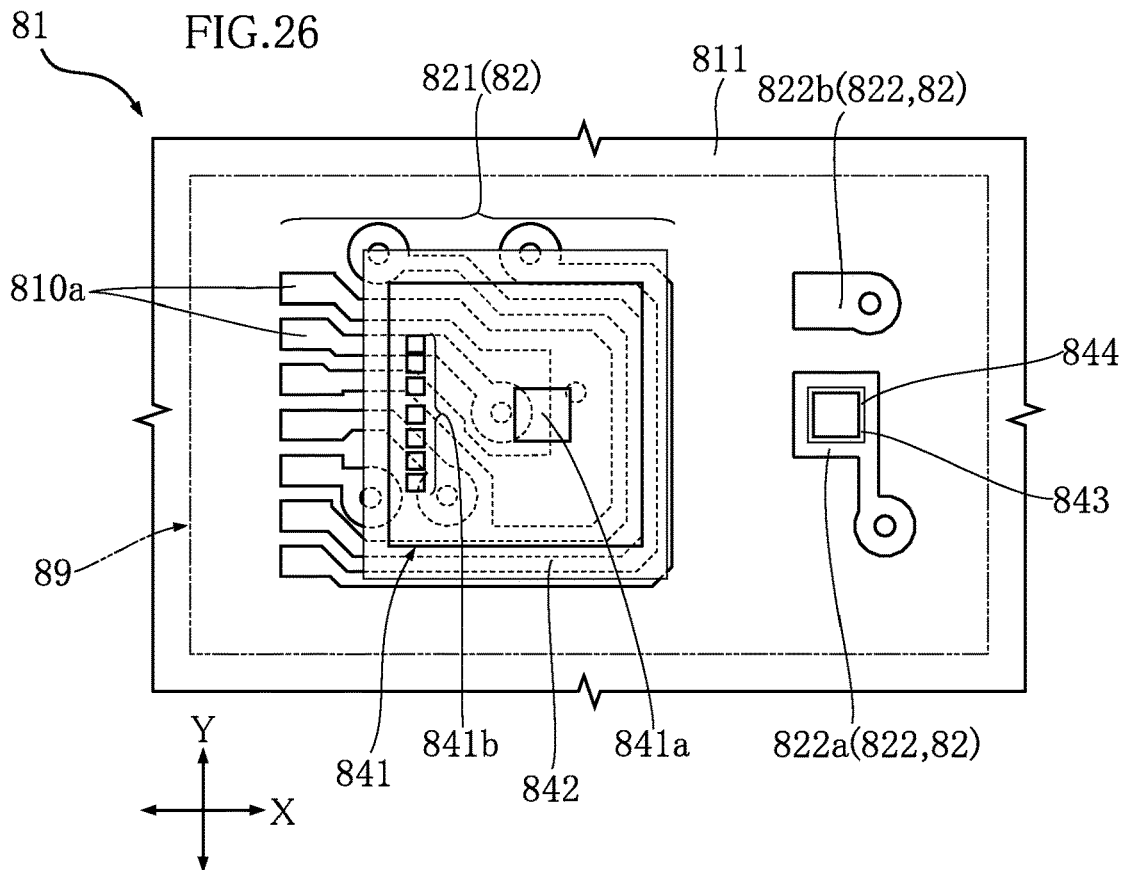
FIG. 26 is a plan view illustrating the method of manufacturing the semiconductor device of FIG. 14.
Figure 27:
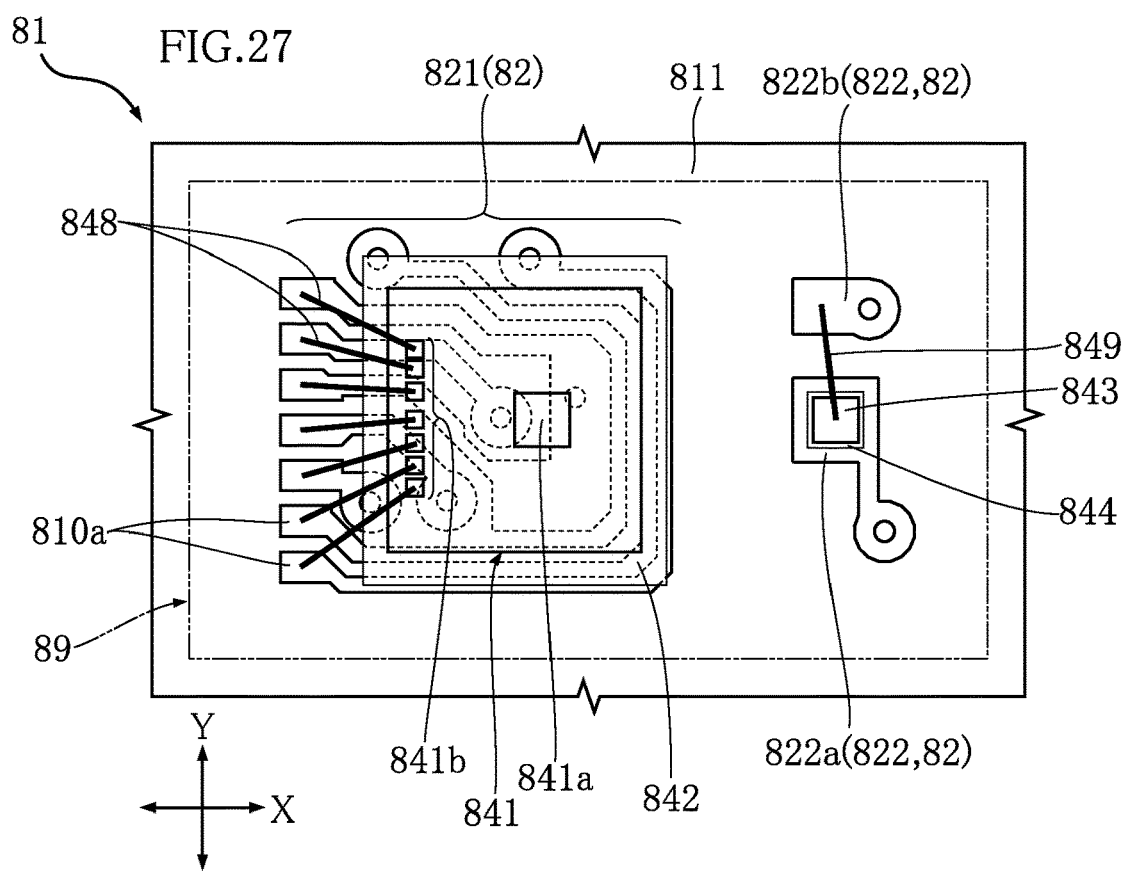
FIG. 27 is a plan view illustrating the method of manufacturing the semiconductor device of FIG. 14.
Figure 30:
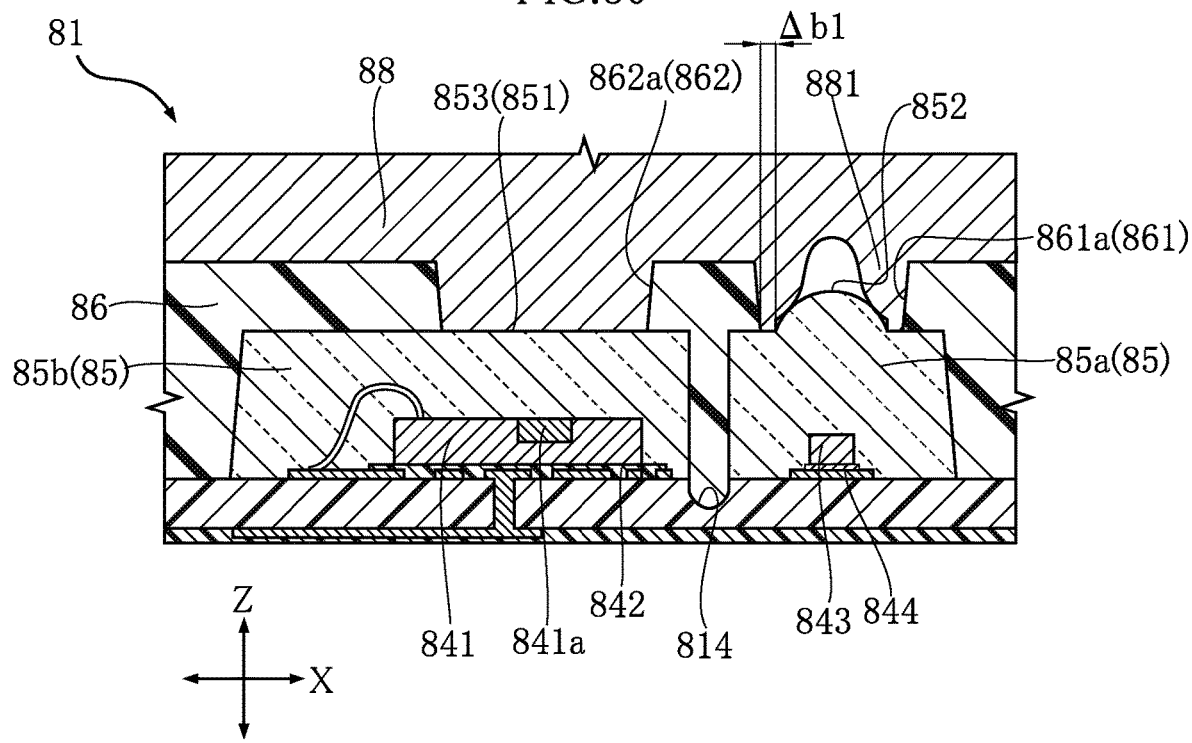
FIG. 30 is a sectional view illustrating the method of manufacturing the semiconductor device of FIG. 14.
Figure 31:
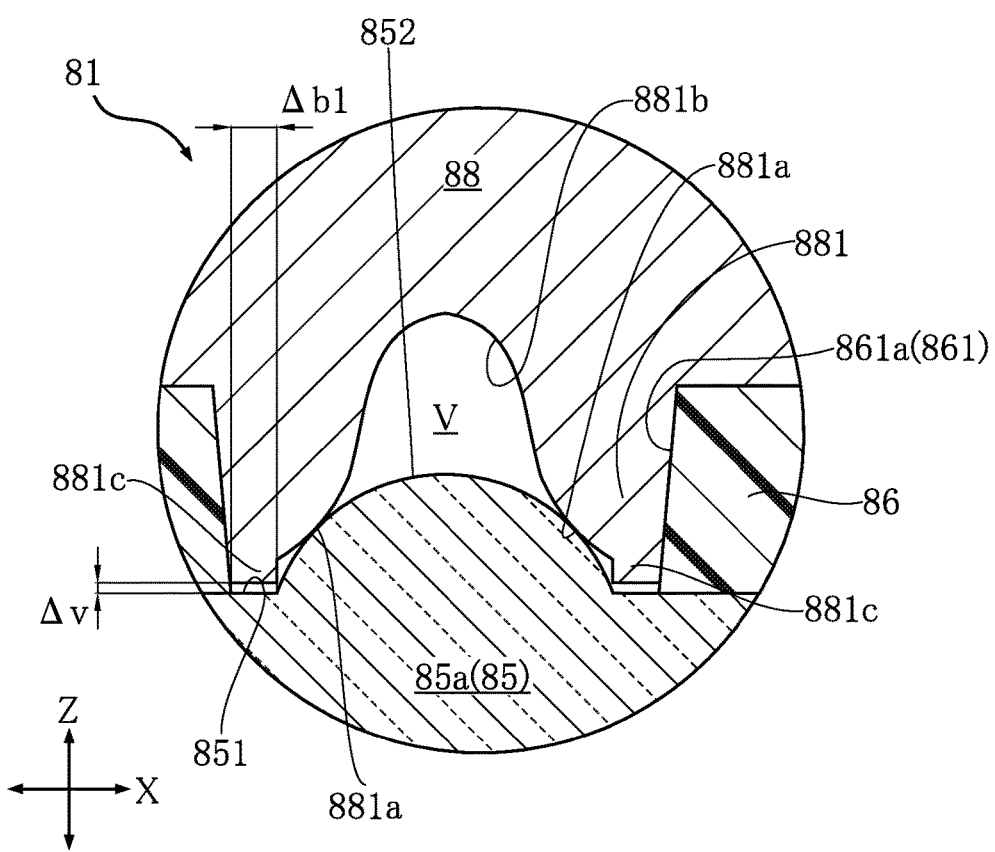
FIG. 31 is a partially enlarged view of FIG. 30.
Figure 32:
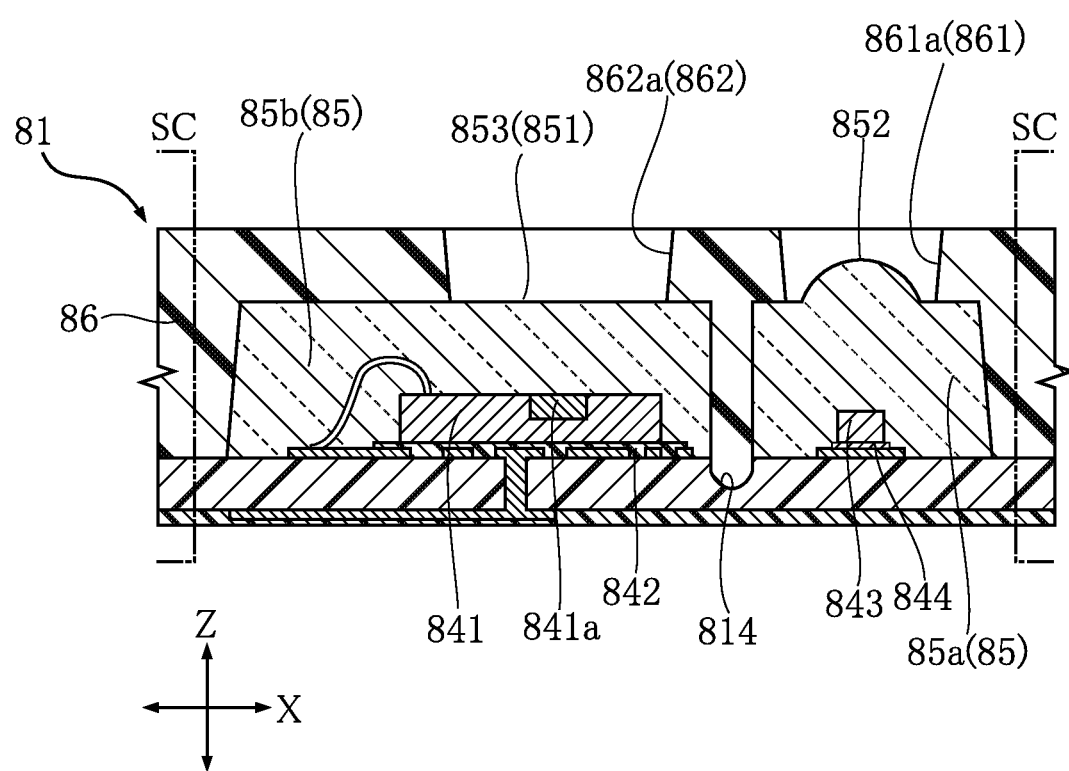
FIG. 32 is a sectional view illustrating the method of manufacturing the semiconductor device of FIG. 14.

FIGS. 24, 26 and 27 are plan views illustrating the method for manufacturing the semiconductor device A10. FIG. 25 is a bottom view illustrating the method for manufacturing the semiconductor device A10. FIGS. 28 to 30 and 32 are sectional views illustrating the method for manufacturing the semiconductor device A10. The sections in these figures are taken along the same plane as in FIG. 17. FIG. 31 is a partially enlarged view of FIG. 30. The thickness direction Z, first direction X and second direction Y of a base member 81 shown in these figures are defined in a similar manner to the thickness direction Z, first direction X and second direction Y of the substrate 1 shown in FIGS. 14 to 23.

First, as shown in FIG. 24, internal electroconductive layers 82 are formed on a surface 811 of the base member 81. The base member 81 is an integral piece corresponding to multiple substrates 1 of semiconductor devices A10. In FIG. 24, a region 89 enclosed in phantom lines (chain double-dashed lines) corresponds to one substrate 1. The base member 81 is an electrical insulator and made of, for example, a glass epoxy resin. The base member 81 has an obverse surface 811 and a reverse surface 812 facing away from each other in the thickness direction Z. The internal electroconductive layers 82 include first internal electroconductive layers 811 each having a first pad portion 821a and also include a second internal electroconductive layer 822. The second internal electroconductive layer 822 includes a die pad portion 822a and a second pad portion 822b. The internal electroconductive layers 82 correspond to the internal terminals 2 of the semiconductor device A10. Specifically, the first internal electroconductive layers 821 correspond to the first internal terminals 21 of the semiconductor device A10, and the second internal electroconductive layer 822 corresponds to the second internal terminal 22 of the semiconductor device A10. In one example, the internal electroconductive layers 82 are formed in the following way. First, a thin metal film is formed on the surface 811 of the base member 81 by sputtering. The thin metal film is then patterned by photolithography and etching. Finally, a metal layer is formed by electrolytic plating to cover the patterned pieces of the thin metal film. According to the present embodiment, the thin metal film and the metal layer are both made of Cu.

The step of forming the internal electroconductive layers 82 includes the step of forming external electroconductive layers 831 on the reverse surface 812 of the base member 81, as shown in FIG. 25. The external electroconductive layers 831 correspond to the external terminals 31 of the semiconductor device A10. The external electroconductive layers 831 are formed in the same manner as the internal electroconductive layer 82 and made of Cu. As shown in FIGS. 24 and 25, the external electroconductive layers 831 are electrically connected to the internal electroconductive layers 82 via electroconductive connection layers 832. The electroconductive connection layers 832 correspond to the connection terminals 32 of the semiconductor device A10. The electroconductive connection layers 832 are cylindrical metal pieces buried in the base member 81 before the internal electroconductive layers 82 and the external electroconductive layers 831 are formed. In the present embodiment, the metal pieces are made of Cu.

The step of forming the internal electroconductive layers 82 includes the step of forming plating layers 839 to cover the internal electroconductive layers 82 and the external electroconductive layers 831. The plating layers 839 correspond to the plating layers 39 of the semiconductor device A10. The plating layers 839 are formed by electrolytic plating after the internal electroconductive layers 82 and the external electroconductive layers 831 are formed. Each plating layer 839 according to the present embodiment is composed of a Ni layer and a Au layer laminated on one another.

The step of forming the internal electroconductive layers 82 additionally includes the step of forming a resist layer 833 to cover portions of the external electroconductive layers 831 as shown in FIG. 25. The resist layer 833 corresponds to the resist film 33 of the semiconductor device A10. The resist layer 833 is formed by way of application after the plating layers 839 are formed. The resist layer 833 according to the present embodiment is an electrical insulator, such as solder resist. The resist layer 833 has openings 833a each of which is rectangular in plan view. Through the openings 833a, portions of the external electroconductive layers 831 and reverse surface 812 of the base member 81 are exposed.

Subsequently, as shown in FIG. 26, the light-receiving element 841 and the light-emitting element 843 are mounted on the corresponding internal electroconductive layers 82 and spaced apart from each other in the first direction X. The light-receiving element 841 corresponds to the light-receiving element 41 of the semiconductor device A10, and the light-emitting element 843 corresponds to the light-emitting element 43 of the semiconductor device A10. The light-receiving element 841 according to the present embodiment is an integrated circuit having a light-receiving region 841a, and the light-receiving region 841a is a photodiode. The light-receiving region 841a corresponds to the light-receiving region 411 of the light-receiving element 41 in the semiconductor device A10. The light-receiving element 841 is secured by bonding via an electrically insulative first bonding member 842, so as to partially cover the first internal electroconductive layers 821 among the internal electroconductive layers 82. The first bonding member 842 corresponds to the first bonding layer 42 of the semiconductor device A10. The first bonding member 842 according to the present embodiment is made of, for example, an epoxy resin or polyimide. In addition, the light-emitting element 843 according to the present embodiment is a light-emitting diode. The light-emitting element 843 is secured by die bonding to the die pad portion 822a of the second internal electroconductive layer 822 of in the internal electroconductive layers 82 via an electrically conductive second bonding member 844. The second bonding member 844 corresponds to the second bonding layer 44 of the semiconductor device A10. The second bonding member 844 according to the present embodiment is made of, for example, an epoxy-based synthetic resin containing Ag (so-called Ag paste).

Subsequently, as shown in FIG. 27, first bonding wires 848 are formed to connect the internal electroconductive layers 82 to the light-receiving element 841, and a second bonding wire 849 is formed to connect the internal electroconductive layer 82 to the light-emitting element 843. The first bonding wires 848 correspond to the first bonding wires 48 of the semiconductor device A10, and the second bonding wire 849 corresponds to the second bonding wire 49 of the semiconductor device A10. Specifically, the respective first bonding wires 848 connect the element pad portions 841b of the light-receiving element 841 to the first pad portions 821a of the first internal electroconductive layers 82 among the internal electroconductive layer 82. The element pad portions 841b correspond to the element pad portions 412 of the light-receiving element 41 of the semiconductor device A10. The second bonding wire 849 connects the light-emitting element 843 to the second pad portion 822b of the second internal electroconductive layer 822 among the internal electroconductive layers 82. The first bonding wires 848, as well as the second bonding wire 849, are connected by wire bonding. The first bonding wires 848 and the second bonding wire 849 according to the present embodiment are made of the same material, which is Au, for example.

Figure 28:
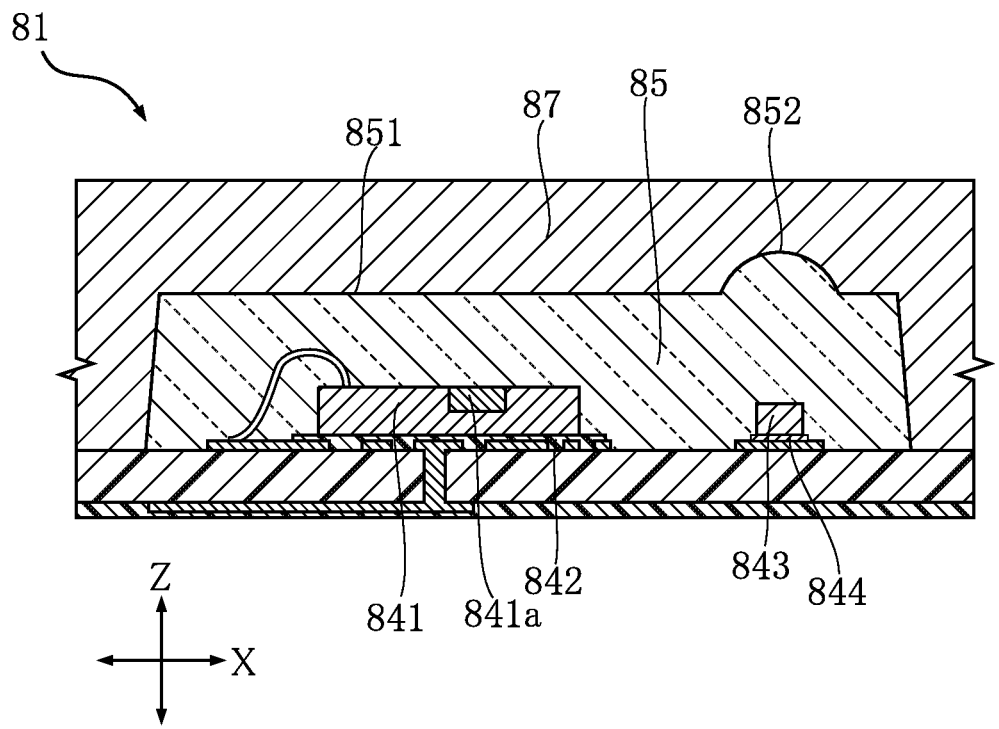
FIG. 28 is a sectional view illustrating the method of manufacturing the semiconductor device of FIG. 14.

Subsequently, as shown in FIG. 28, a light-transmitting resin 85 is formed using a primary mold 87 to cover the light-receiving element 841 and the light-emitting element 843. The light-transmitting resin 85 corresponds to the light-transmitting member 5 of the semiconductor device A10. The light-transmitting resin 85 is a part formed by transfer molding using the primary mold 87, involving thermally curing an electrically insulating thermoset synthetic resin (for example, transparent epoxy resin) that is transparent to light in the wavelength range from visible to infrared. The resulting light-transmitting resin 85 also covers the internal electroconductive layers 82, the first bonding wires 848 and the second bonding wire 849. The light-transmitting resin 85 has a top surface 851 facing upward as seen in FIG. 28 and has a convex lens surface 852, which curves outward from the top surface 851 and through which light emitted from the light-emitting element 843 passes. In plan view, among the region of the light-transmitting resin 85, the lens surface 852 corresponds to the lens 511 of the semiconductor device A10. The lens surface 852 according to the present embodiment is formed to have an elliptical shape elongated in the second direction Y.

Figure 29:
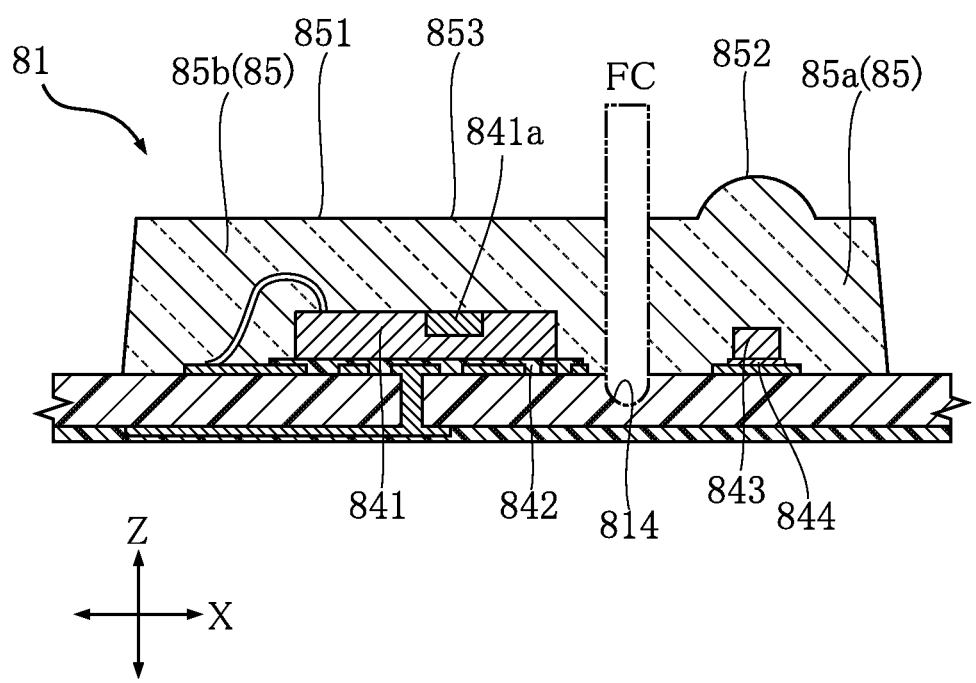
FIG. 29 is a sectional view illustrating the method of manufacturing the semiconductor device of FIG. 14.

Subsequently, as shown in FIG. 29, the light-transmitting resin 85 is divided into a first light-transmitting resin 85a having the lens surface 852 and a second light-transmitting resin 85b having an incident region 853 on which light is made incident. The first light-transmitting resin 85a corresponds to the first light-transmitting member 51 of the semiconductor device A10, whereas the second light-transmitting resin 85b corresponds to the second light-transmitting member 52 of the semiconductor device A10. In the present embodiment, a dicing saw may be used cut the light-transmitting resin 85 along a primary cutline FC shown in FIG. 29 to divide it into the first light-transmitting resin 85a and the second light-transmitting resin 85b. Here, the first light-transmitting resin 85a covers the first internal electroconductive layers 821 among the internal electroconductive layers 82, and also covers the first bonding wires 848. The second light-transmitting resin 85b covers the second internal electroconductive layer 822 among the internal electroconductive layers 82, and also covers the second bonding wire 849. The incident region 853 according to the present embodiment is a region of the top surface 851. Specifically, the region is located above the light-receiving region 841a of the light-receiving element 841 as seen in FIG. 30. In addition, the region is surrounded by a second opening 862 of a light-shielding resin 86, which will be described later. The incident region 853 corresponds to the incident region 521 of the semiconductor device A10. In the present embodiment, in the process of dividing the light-transmitting resin 85 into the first light-transmitting resin 85a and the second light-transmitting resin 85b, a portion of the base member 81 is removed from the surface 811 and in the thickness direction Z of the base member 81. By removing the portion of the base member 81, a first engagement groove 814 recessed from the surface 811 of the base member 81 is formed. The first engagement groove 814 corresponds to the first engagement groove 14 of the semiconductor device A10.

Subsequently, as shown in FIG. 30, a secondary mold 88 is used to form the light-shielding resin that covers the light-transmitting resin 85 and has a first opening 861 exposing the lens surface 852 of the light-transmitting resin 85 (the first light-transmitting resin 85a). The light-shielding resin 86 corresponds to the light-shielding member 6 of the semiconductor device A10. The light-shielding resin 86 is a part formed by transfer molding using the secondary mold 88, involving thermally curing an electrically insulating, thermosetting synthetic resin that blocks light (for example, black epoxy resin). The light-shielding resin 86 according to the present embodiment is a part made of a synthetic resin that differs in the physical property (or physical properties) from the synthetic resin forming the light-transmitting resin 85. The light-shielding resin 86 has a glass transition point lower than the glass transition point of the light-transmitting resin 85. The secondary mold 88 has a weir 881. As shown in FIG. 31, the weir 881 has an annular surface 881a, a concave surface 881b and a ridge 881c.

As shown in FIG. 31, when the secondary mold 88 is set to form the light-shielding resin 86, the weir 881 covers the lens surface 852 of the light-transmitting resin 85. In the present embodiment, the first opening 861 in the light-shielding resin 86 is formed by the presence of the weir 881. The first opening 861 corresponds to the first opening 611 in the light-shielding member 6 of the semiconductor device A10. The annular surface 881a is an inner surface of the weir 881 that surrounds a portion of the lens surface 852 in plan view. The annular surface 881a is designed to have a uniform curvature radius equal to the curvature radius of the lens surface 852. In the present embodiment, during the process of forming the light-shielding resin 86 using the secondary mold 88, the annular surface 852a makes a line contact with the lens surface 852. The line contact used herein refers to the state in which the annular surface 881a contacts the lens surface 852 along the line defined by connecting the contact points between the annular surface 881a and the lens surface 852 in the circumferential direction in plan view. The concept of the line contact used herein also encompass the state where a small amount of surface-to-surface contact is made between the annular surface 881a and the lens surface 852, due tolerances and deformations associated with the manufacture of the semiconductor device A10.

As shown in FIG. 31, the concave surface 881*b* of the weir 881 is an inner surface that extends continuously from an edge of the annular surface 881*a* and away from the lens surface 852 in the thickness direction Z of the base member 81. The concave surface 881*b* is a curved surface. When the secondary mold 88 is used to form the light-shielding resin 86, a cavity V is left in the weir 881 between the concave surface 881*b* and the lens surface 852.

As shown in FIG. 31, the ridge 881*c* is a portion that extends continuously from the other edge of the annular surface 881*a* and toward a point closer to the top surface 851 than the annular surface 881*a*. In the present embodiment, by the presence of the ridge 881*c*, a clearance Δb1 is formed between the lens surface 852 and an inner wall 861*a* of the first opening 861. In addition, the inner wall 861*a* of the first opening 861 is formed to have a surface inclined toward the center of the first opening as the distance to the base member 81 decreases in the thickness direction Z of the base member 81. In the present embodiment, when the secondary mold 88 is used to form the light-shielding resin 86, a gap Δv is left between the top surface 851 and the ridge 881*c*.

As shown in FIG. 30, in the process of forming the light-shielding resin 86, such that the light-shielding resin 86 is formed such that a portion thereof extends along the full length in the thickness direction Z of the base member 81 between the first light-transmitting resin 85*a* and the second light-transmitting resin 85*b*. This portion of the light-shielding resin 86 corresponds to the partition wall 63 of the light-shielding member 6 in the semiconductor device A10. In the present embodiment, the light-shielding resin 86 is fitted in the first engagement groove 814 of the base member 81. In addition, in the process of forming the light-shielding resin 86, a second opening 862 is formed to expose the incident region 853 of the light-transmitting resin 85 (the second light-transmitting resin 85*b*). The second opening 862 corresponds to the second opening 612 in the light-shielding member 6 of the semiconductor device A10. The inner wall 862*a* of the second opening 862 is formed to have a surface inclined toward the center of the second opening as the distance to the base member 81 decreases in the thickness direction Z of the base member 81.

The base member 81 is then divided into individual pieces by cutting along the first direction X and the second direction Y. In the process of cutting, a dicing saw may be used to cut the base member 81 along the primary cutlines SC shown in FIG. 32. The individual pieces obtained in this step each correspond to a semiconductor device A10. Through the above steps, the semiconductor device A10 is manufactured.

The following now describes advantages of the method of manufacturing the semiconductor device A10, as well as of the semiconductor device A10.

In the method of manufacturing the semiconductor device A10, the step of forming the light-transmitting resin 85 to cover the light-shielding resin 86 is performed by using the secondary mold 88 that has the weir 881 for masking the lens surface 852 of the light-transmitting resin 85 (the first light-transmitting resin 85*a*). The weir 881 has the annular surface 881*a* that surrounds a portion of the lens surface 852 in plan view and the concave surface 881*b* that extends continuously from an edge of the annular surface 881*a* and away from the lens surface 852 in the thickness direction Z of the base member 81. As shown in FIG. 31, when the weir 881 masks the lens surface 852, the annular surface 881*a* makes line contact with the lens surface 852. In this state, a cavity V is left between the concave surface 881*b* and the lens surface 852. That is, the secondary mold 88 does not make contact with the entire lens surface 852 in the process of forming the light-shielding resin 86. Thus, the present embodiment can reduce the risk of scratches on the lens surface 852, while reducing the size of the opening (the first opening 861) formed in the light-shielding resin 86 to expose the lens surface 852.

The lens 511 of the first light-transmitting member 51 of the semiconductor device A10 has the central portion 511*a* located centrally in plan view and the annular portion 511*b* surrounding the central portion 511*a*. The annular portion 511*b* has higher surface roughness than the central portion 511*a*. The annular portion 511*b* is formed in the step of forming the light-shielding resin 86 performed using the secondary mold 88 in the manufacture of the semiconductor device A10. Specifically, the annular portion is formed as a result that the annular surface 881*a* of the weir 881 makes line contact with the lens surface 852. In this respect, the annular portion 511*b* of the semiconductor device A10 corresponds to a special technical feature of the method of manufacturing the semiconductor device A10.

The weir 881 has the ridge 881*c* that extends continuously from the annular surface 881*a* to a point closer than the annular surface 881*a* to the top surface 851 of the light-transmitting resin 85. In the process of forming the light-shielding resin 86, the ridge 881*c* prevents the light-shielding resin 86 from adhering to the lens surface 852. Also in the process of forming the light-shielding resin 86, the gap Δv is left between the top surface 851 and the ridge 881*c*. The presence of the gap Δv prevents the ridge 881*c* from contacting the light-transmitting resin 85 to cause damage.

Between the step of forming the light-transmitting resin 85 and the step of forming the light-shielding resin 86, the step is provided of dividing the light-transmitting resin 85 into the first light-transmitting resin 85*a* and the second light-transmitting resin 85*b*. Due to this step, in the subsequent step of forming the light-shielding resin 86, the light-shielding resin 86 is formed to have a portion extending along the full length in the thickness direction Z of the base member 81 between the first light-transmitting resin 85*a* and the second light-transmitting resin 85*b*. With this method of manufacturing, the light-shielding member 6 of the semiconductor device A10 can have the partition wall 63. This partition wall 63 blocks light emitted from the light-emitting element 43 from directly made incident on the light-emitting element 43, thereby preventing erroneous detection by the light-receiving element 41. In addition, the step of dividing the light-transmitting resin 85 involves removing a portion of the base member 81 in the thickness direction Z of the base member 81. As a result of this process, the first engagement groove 814 is formed in the base member 81, and the light-shielding resin 86 is fitted in the first engagement groove 814. This configuration can increase the bonding strength of the light-shielding resin 86 to the base member 81.

In the step of forming the light-shielding resin 86, the first opening 861 and the second opening 862 are formed. The inner wall 861*a* of the first opening 861, as well as the inner wall 862*a* of the second opening 862, is formed to have a surface inclined toward the center of the opening as the distance to the base member 81 decreases in the thickness direction of the base member 81. The inclined surfaces allows the secondary mold 88 to be smoothly detached from the thermally cured light-shielding resin 86.

In the step of forming the light-transmitting resin 85, the lens surface 852 is formed in an elliptical shape elongated in the second direction Y in plan view. In the resulting semiconductor device A10, the first light-transmitting member 51 covering the light-emitting element 43 is provided with the lens 511 having an elliptical shape elongated in the second direction Y in plan view. This shape of the lens 511 enables the length of the first light-transmitting member 51 to be reduced in the first direction, while ensuring the lens 511 to have a sufficient surface area. In this way, the center distance between the light-receiving element 41 and the light-emitting element 43 in the first direction X can be shortened, while ensuring that the semiconductor device A10 is able to emit a certain amount of light.

The light-shielding resin 86 is made of a synthetic resin that differs in the physical property (or physical properties) from the synthetic resin forming the light-transmitting resin 85. The light-shielding resin 86 has a glass transition point lower than the glass transition point of the light-transmitting resin 85. With this configuration, the light-shielding member 6 will have a higher elastic modulus than the light-transmitting member 5 (the first light-transmitting member 51 and the second light-transmitting member 52) at high temperatures experienced by the semiconductor device A10 in use. This is effective to reduce the temperature stress on the light-transmitting member 5 caused by thermal expansion of the light-shielding member 6. Consequently, crack formation is in the light-transmitting member 5 can be prevented.

The respective plating layers 839 covering the internal electroconductive layers 82 and the external electroconductive layers 831 are composed of a Ni layer and a Au layer laminated on one another. The plating layers 839 of this configuration can protect the internal electroconductive layers 82 from impacts such as heat occurring at the time of mounting the light-receiving element 841 and the light-emitting element 843 or at the time of connecting the first bonding wires 848 or the second bonding wire 849. After the semiconductor device A10 is mounted on a circuit board, in addition, the plating layers can protect the terminal pad portions 311 of the external terminals 31 from erosion caused by solder paste or by other factors.

The semiconductor device A10 includes the internal terminals 2 disposed on the mounting surface 11 of the substrate 1 and also includes the first bonding wires 48 connecting the element pad portions 412 of the light-receiving element 41 to the internal terminals 2. The light-receiving element 41 and the light-emitting element 43 on the mounting surface 11 are spaced apart from each other in the first direction X that is perpendicular to the thickness direction Z of the substrate 1. Here, the first bonding wires 48 are located on the side of the light-receiving element 41 opposite the light-emitting element 43 in the first direction X. In this configuration, the light-receiving element 41 can be disposed closer to the light-emitting element 43 in the first direction. As a result, the center distance between the light-receiving element 41 and the light-emitting element 43 in the longitudinal direction of the device is shorter than in a conventional configuration. In addition, the distance between the first bonding wires 48 and the light-emitting element 43 in the first direction X is longer. This configuration is effective to reduce noise in the light-receiving element 41 resulting from the electric current flowing in the light-emitting element 43.

The internal terminals 2 include the first internal terminals 21 electrically connected to the light-receiving element 41 via the first bonding wires 48. Each first internal terminal 21 has an end forming a first pad portion 210 to which the first bonding wire 48 is connected. The first pad portions 210 are arranged along the second direction Y that is perpendicular to both the thickness direction Z of the substrate 1 and the first direction X. With this configuration, the first bonding wires 48 are closely located to be in a localized area, which is effective to achieve further reduction of noise in the light-receiving element 41.

The first internal terminals 21 partially overlap with the light-receiving element 41 in plan view. In addition, the semiconductor device A10 has the first bonding layer 42 that is an electrical insulator and that is interposed between the light-receiving element 41 and the mounting surface 11 of the substrate 1. That is, in the semiconductor device A10, the light-receiving element 41 disposed on the mounting surface 11 partially overlies the first internal terminals 21. This configuration is an effective way to avoid upsizing of the semiconductor device A10.

Embodiment B2

With reference to FIGS. 33 to 36, the following describes a semiconductor device A20 according to Embodiment B2 of the present disclosure. In these figures, components identical or similar to the components of the semiconductor device A10 described above are denoted by the same reference signs, and redundant descriptions thereof are omitted.

Figure 33:
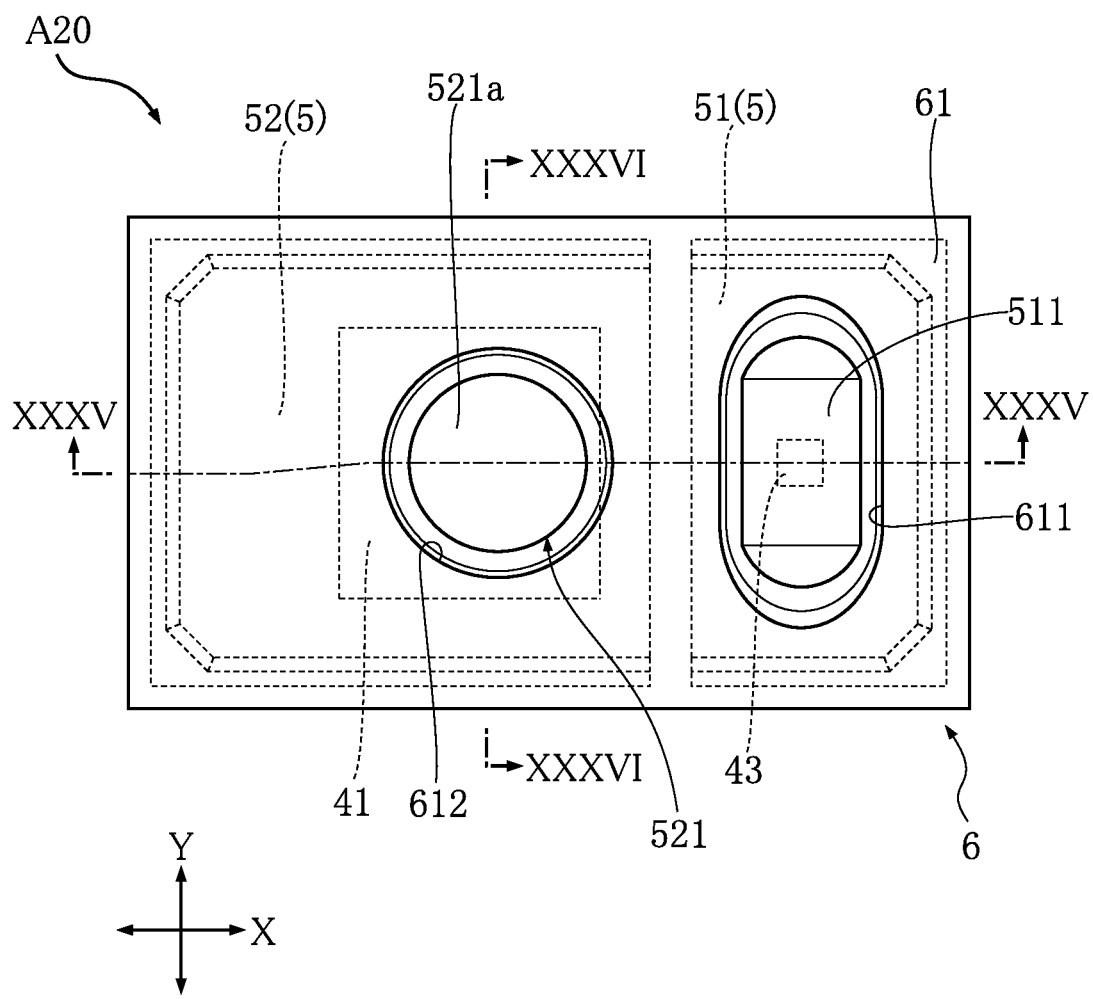
FIG. 33 is a plan view of a semiconductor device according to Embodiment B2 of the present disclosure.
Figure 34:
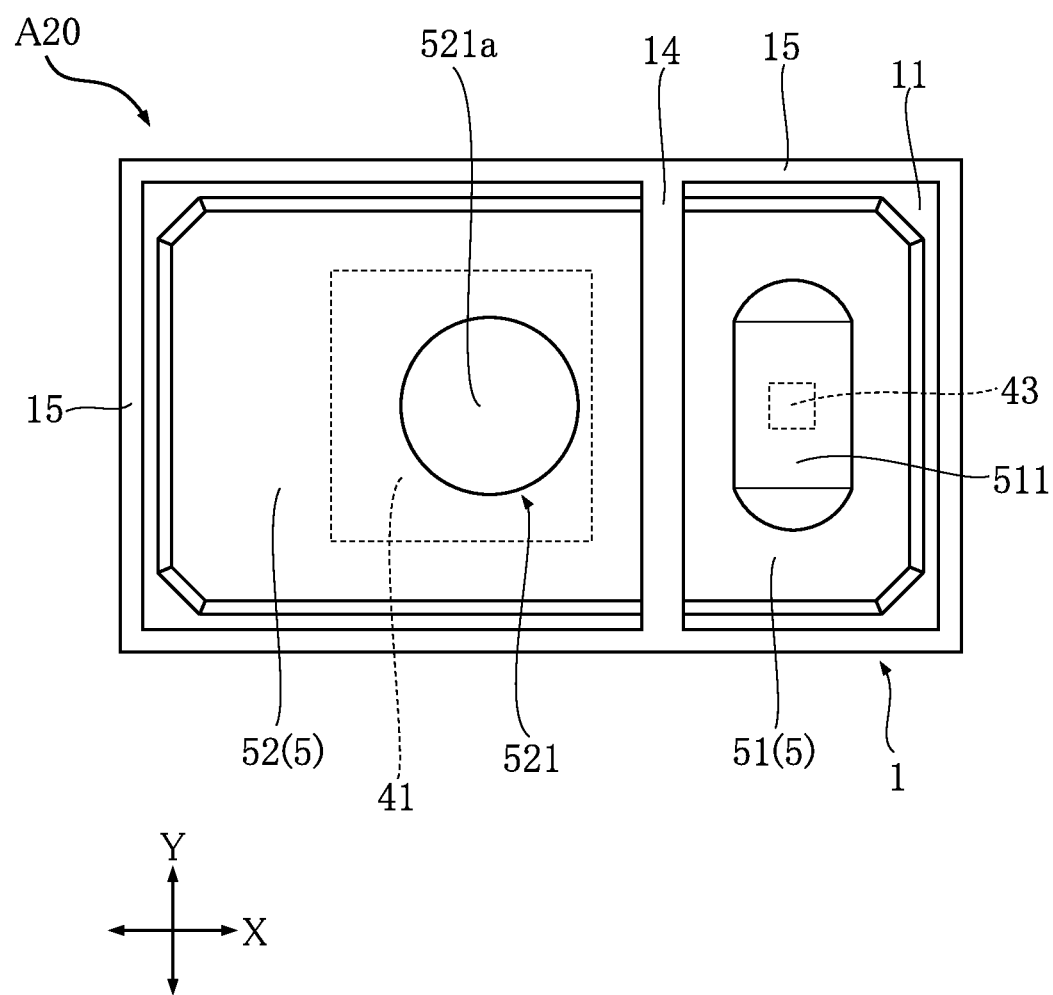
FIG. 34 is a plan view of the semiconductor device of FIG. 33 (with the light-shielding member omitted).
Figure 35:
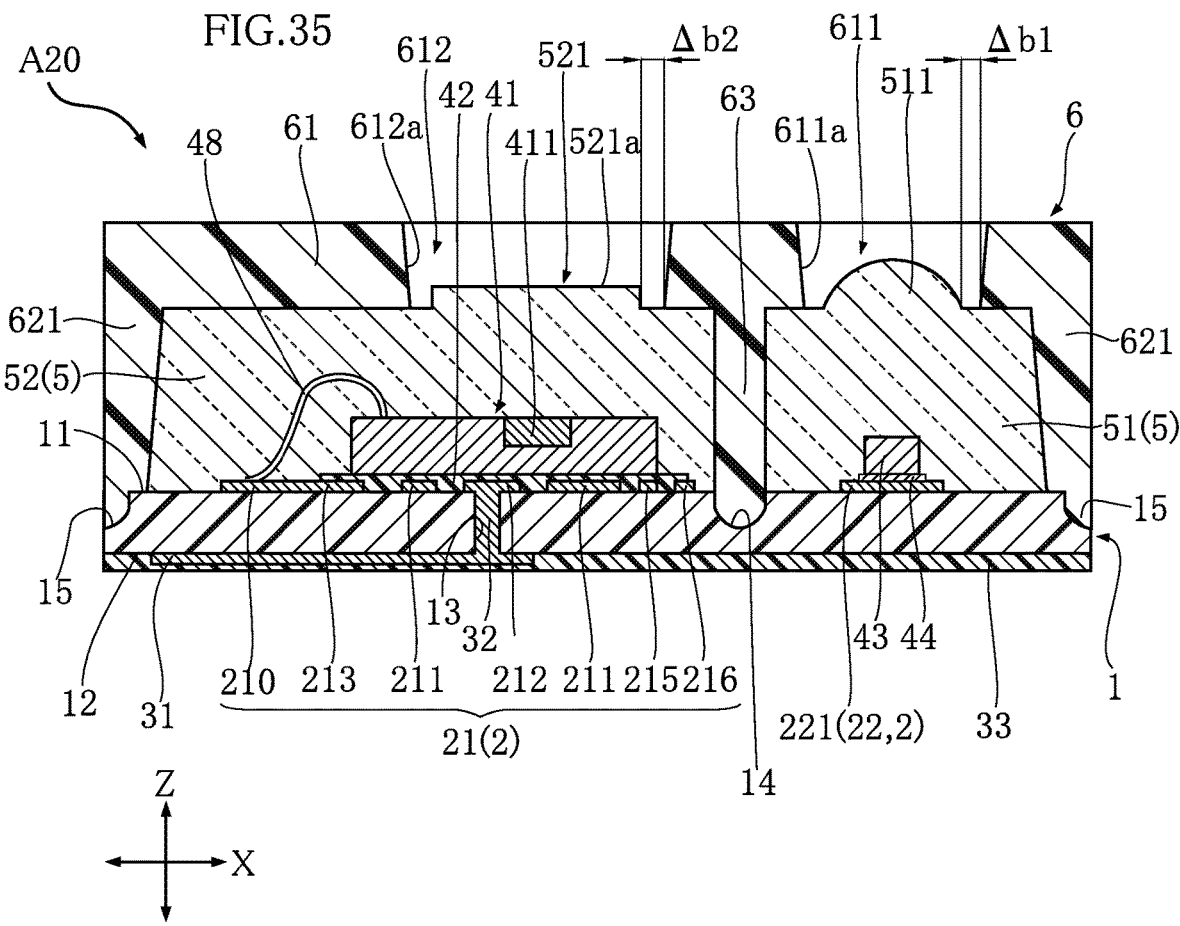
FIG. 35 is a sectional view taken along line XXXV-XXXV of FIG. 33.
Figure 36:
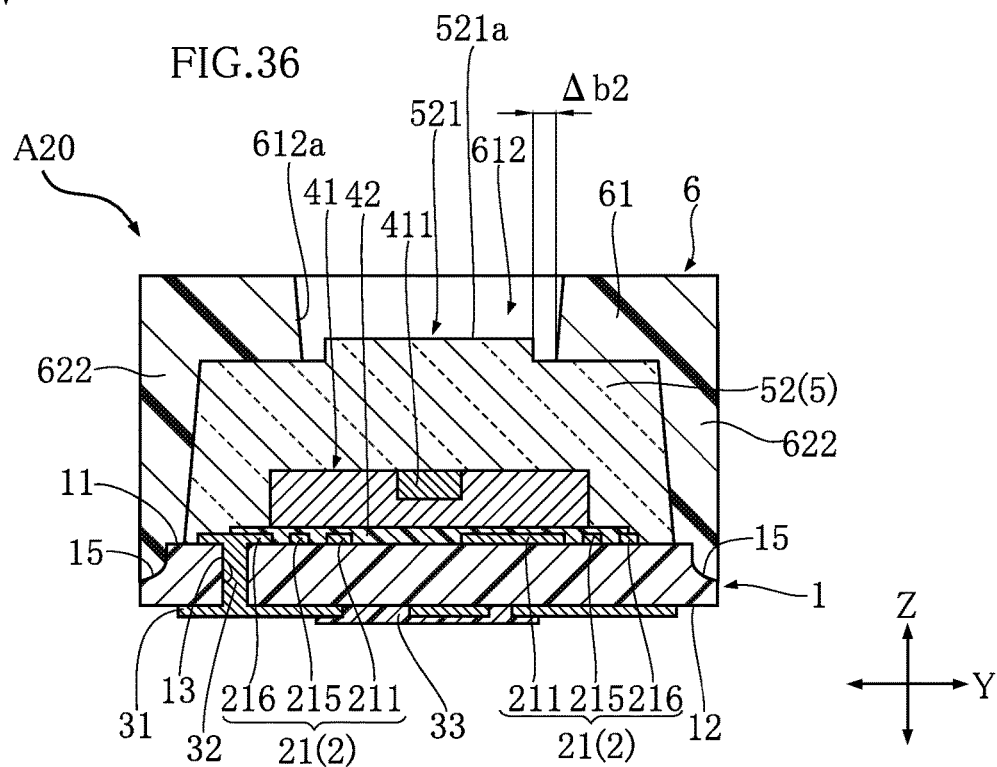
FIG. 36 is a sectional view taken along line XXXVI-XXXVI of FIG. 33.

FIG. 33 is a plan view of the semiconductor device A20. FIG. 34 is a plan view of the semiconductor device A20, with the light-shielding member 6 omitted for ease of understanding. FIG. 35 is a sectional view taken along line XXXV-XXXV of FIG. 33 (the long dashed short dashed line in FIG. 33). FIG. 36 is a sectional view taken along line XXXVI-XXXVI of FIG. 33 (the long dashed short dashed line in FIG. 33).

The semiconductor device A20 according to the present embodiment differs from the semiconductor device A10 in the configuration of the substrate 1, the second light-transmitting member 52 and the light-shielding member 6. As shown in FIG. 33, the semiconductor device A20 according to the present embodiment is rectangular in plan view.

As shown in FIGS. 34 to 36, the substrate 1 according to the present embodiment has a second engagement groove 15 in addition to the first engagement groove 14. The second engagement groove 15 is recessed from the mounting surface 11 and surrounds the first light-transmitting member 51 and the second light-transmitting member 52. The opposite ends of the first engagement groove 14 are connected to the second engagement groove 15. The pair of first side walls 621 and the pair of second side walls 622 of the light-shielding member 6 are fitted in the first engagement groove 14. In the present embodiment, the second engagement groove 15 has a depth (a length in the thickness direction Z of the substrate 1) equal to the depth of the first engagement groove 14.

As shown in FIGS. 33 to 36, the incident region 521 of the second light-transmitting member 52 is raised in the thickness direction Z of the substrate 1. The incident region 521 has an incident surface 521a on which light is made incident. The incident surface 521a is a flat surface perpendicular to the thickness direction Z of the substrate 1. The incident region 521 according to the present embodiment is circular in plan view.

As shown in FIGS. 35 and 36, the present embodiment provides, on the surface of the second light-transmitting member 52 in contact with the top portion 61, a clearance Δb2 between the incident region 521 and the inner wall 612a of the second opening 612. The width of the clearance Δb2 is uniform along the entire circumference of the incident region 521.

Figure 37:
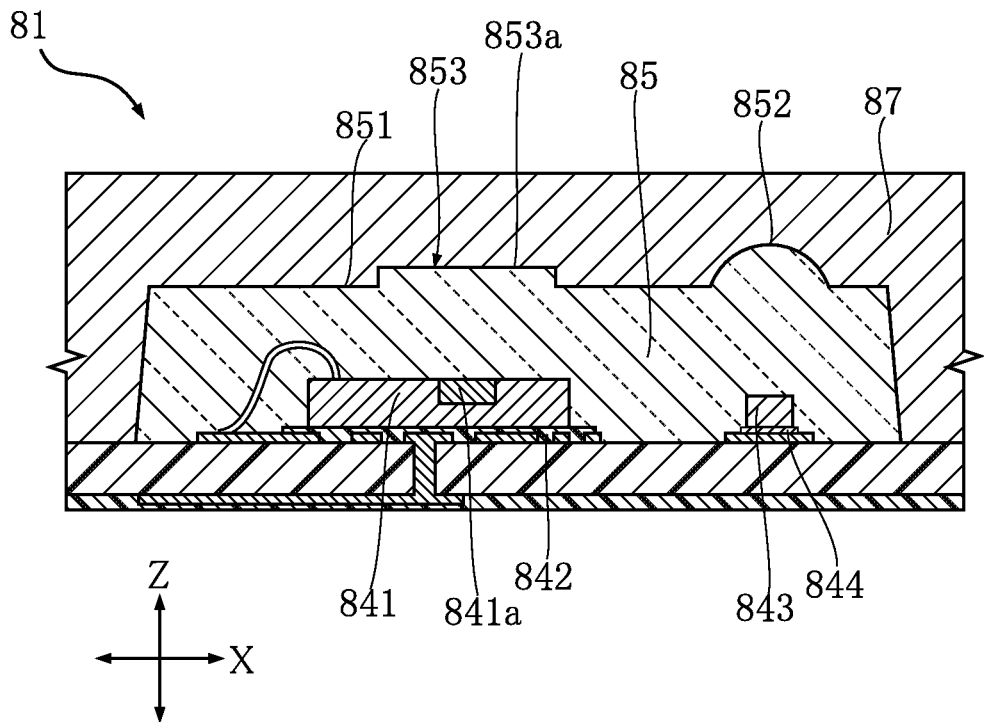
FIG. 37 is a sectional view illustrating a method of manufacturing the semiconductor device of FIG. 33.
Figure 38:
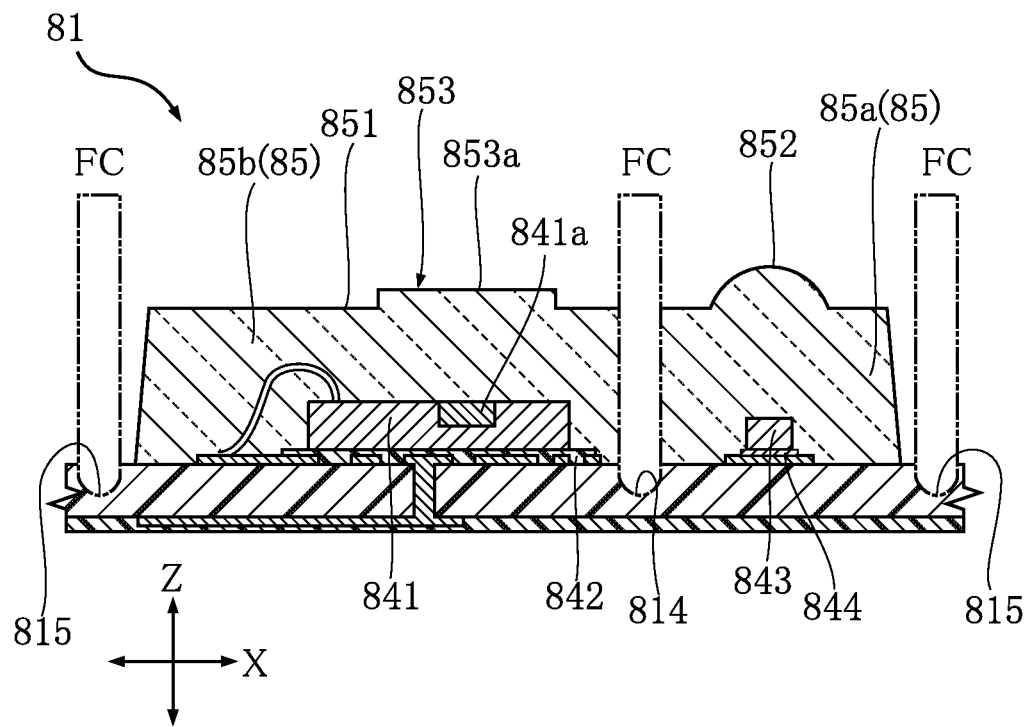
FIG. 38 is a sectional view illustrating the method of manufacturing the semiconductor device of FIG. 33.
Figure 39:
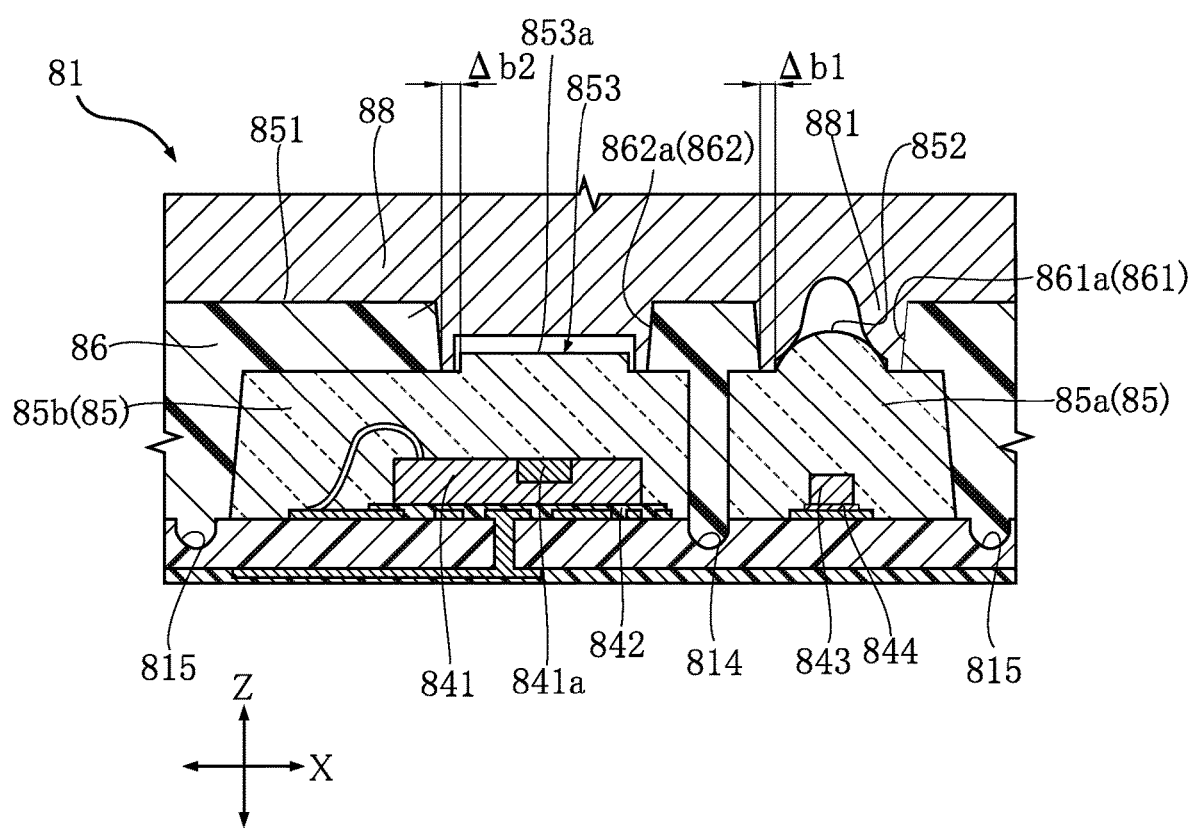
FIG. 39 is a sectional view illustrating the method of manufacturing the semiconductor device of FIG. 33.

The following now describes a method for manufacturing the semiconductor device A20 with reference to FIGS. 37 to 39.

FIGS. 37 to 39 are sectional views illustrating the method for manufacturing the semiconductor device A20. The sections in these figures are taken along the same plane as in FIG. 35.

The method for manufacturing the semiconductor device A20 according to the present embodiment differs from the method for manufacturing the semiconductor device A10 descried above in the step of forming the light-transmitting resin 85, the step of dividing the light-transmitting resin 85 and the step of forming the light-shielding resin 86.

As shown in FIG. 37, in the step of forming the light-transmitting resin 85, the resulting light-transmitting resin 85 has the incident region 853 that is raised from the top surface 851 in the thickness direction Z of the base member 81. In addition, the incident region has a flat surface perpendicular to the thickness direction Z of the base member 81. This flat surface is the incident surface 853a on which light is made incident.

As shown in FIG. 38, the step of dividing the light-transmitting resin 85 involves removing portions of the base member 81 from the surface 811, along the opposite sides of the light-transmitting member 5 in the first direction X. For example, a dicing saw may be used to remove portions of the base member 81 in the thickness direction Z, along the primary cutlines FC shown in FIG. 38. In a similar manner, portions of the base member 81 are removed from the surface 811 along the opposite sides of the light-transmitting member 5 in the second direction Y. As a result of removing the portions of the base member 81, a second engagement groove 815 is formed in the base member 81 in addition to the first engagement groove 814. The second engagement groove thus formed is recessed from the surface 811 to surround the light-transmitting resin 85. The second engagement groove 815 corresponds to the second engagement groove 15 of the semiconductor device A10.

As shown in FIG. 39, the step of forming the light-shielding resin 86 involves setting the secondary mold 88 so as to enclose the incident region 853. In this step, the clearance Δb2 is formed between the incident region 853 and the inner wall 862a of the second opening 862. In the present embodiment, in addition, the light-shielding resin 86 is fitted in the first engagement groove 814 and the second engagement groove 815 of the base member 81.

The following now describes advantages of the method of manufacturing the semiconductor device A20, as well as of the semiconductor device A20.

In the method of manufacturing the semiconductor device A20, the step of forming the light-transmitting resin 85 to cover the light-shielding resin 86 is similar to the corresponding manufacturing step of the semiconductor device A10. That is, the step is performed by using the secondary mold 88 having the weir 881 for masking the lens surface 852 of the light-transmitting resin 85. When the weir 881 masks the lens surface 852, the annular surface 881a makes line contact with the lens surface 852. In this state, a cavity V is left between the concave surface 881b and the lens surface 852. That is, the method of manufacturing the semiconductor device A20 ensures that the process of forming the light-shielding resin 86 is performed without causing the secondary mold 88 to make contact with the entire lens surface 852. That is, the present embodiment can reduce the risk of scratches on the lens surface 852, while reducing the size of the opening (the first opening 861) formed in the light-shielding resin 86 to expose the lens surface 852.

In the step of forming the light-transmitting resin 85, the resulting light-transmitting resin 85 has the incident region 853 that is raised from the top surface 851 in the thickness direction Z of the base member 81. In addition, the incident region has a flat surface perpendicular to the thickness direction Z of the base member 81. This flat surface is the incident surface 853a on which light is made incident. Consequently, the semiconductor device A20 includes the second light-transmitting member 52 having the incident region 521 raised in the thickness direction Z of the substrate 1. This configuration ensures that light emitted by the light-emitting element 43 and reflected by a target object travels a longer distance in the second light-transmitting member 52, as compared to the semiconductor device A10. In addition, the second light-transmitting member 52 is configured such that the angle of refraction of light at the incident surface 521a of the incident region 521 is smaller than the angle of incidence at the incident region 521. Consequently, the amount of light reaching the light-receiving region 411 increases as compared to the semiconductor device A10, so that the accuracy of detection by the light-receiving element 41 can be improved.

On the mounting surface 11 of the substrate 1, the second groove 15 is formed in addition to the first groove 14. The light-shielding member 6 is disposed such that the partition wall 63 is fitted in the first engagement groove 14 and the pair of first side walls 621 and the pair of second side walls 622 are fitted in the second engagement groove 15. This configuration can further increase the bond strength of the light-shielding member 6 to the substrate 1 than in the semiconductor device A10.

The following clauses summarizes the embodiments described above.

[Clause 1]

A method for manufacturing a semiconductor device, comprising:

forming an internal electroconductive layer on a surface of a base member;

mounting a light-receiving element and a light-emitting element on the internal electroconductive layer in a spaced relationship to each other in a first direction perpendicular to a thickness direction of the base member;

forming a light-transmitting resin using a primary mold to cover the light-receiving element and the light-emitting element, the light-transmitting resin having a top surface and a lens surface through which light emitted from the light-emitting element is transmitted, the lens surface having a convex shape projecting from the top surface in the thickness direction of the base member; and forming a light-shielding resin using a secondary mold to cover the light-transmitting resin, the light-shielding resin having a first opening exposing the lens surface, the secondary mold having a weir that masks the lens surface, the weir having an annular surface surrounding a portion of the lens surface in plan view and a concave surface that extends continuously from a first edge of the annular surface and away from the lens surface in the thickness direction of the base member, the annular surface of the weir making line contact with the lens surface.

[Clause 2]
The method according to Clause 1,
wherein the weir has a ridge that extends continuously from a second edge of the annular surface to a point closer than the annular surface to the top surface of the light-transmitting resin, and
wherein the forming of the light-shielding resin includes forming a clearance between the lens surface and an inner wall of the first opening.

[Clause 3]
The method according to Clause 2, wherein the forming of the light-shielding resin includes leaving a gap between the top surface of the light-transmitting resin and the ridge of the weir.

[Clause 4]
The method according to any one of Clauses 1 to 3, wherein the forming of the light-shielding resin includes forming the inner wall of the first opening having a surface inclined toward the center of the first opening with a decreasing distance to the base in the thickness direction of the base.

[Clause 5]
The method according to any one of Clauses 1 to 4, wherein the forming of the light-transmitting resin includes forming the lens surface having an elliptical shape elongated in a second direction in plan view, the second direction being perpendicular to both the thickness direction of the base member and the first direction.

[Clause 6]
The method according to any one of Clauses 1 to 5, further comprising, between the forming of the light-transmitting resin and the forming of the light-shielding resin, dividing the light-transmitting resin into a first light-transmitting resin and a second light-transmitting lens, the first light-transmitting resin covering the light-emitting element and having the lens surface, the second light-transmitting resin covering the light-receiving element and having an incident region on which light is made incident.

[Clause 7]
The method according to Clause 6, wherein the dividing of the light-transmitting resin includes dividing the light-transmitting resin into the first light-transmitting resin and the second light-transmitting resin, using a dicing saw.

[Clause 8]
The method according to Clause 6 or 7, wherein the dividing of the light-transmitting resin includes removing a portion of the base member from the surface in the thickness direction of the base member.

[Clause 9]
The method according to any one of Clauses 6 to 8, wherein the forming of the light-shielding resin includes forming the light-shielding resin having a portion that extends along a full length in the thickness direction of the base between the first light-transmitting resin and the second light-transmitting resin.

[Clause 10]
The method according to any one of Clauses 6 to 9, wherein the forming of the light-shielding resin includes forming a second opening to expose the incident region.

[Clause 11]
The method according to Clause 10, wherein the forming of the light-shielding resin includes forming the inner wall of the second opening having a surface inclined toward the center of the second opening with a decreasing distance to the base in the thickness direction of the base.

[Clause 12]
The method according to Clause 11, wherein the forming of the light-transmitting resin includes forming the incident region that is raised from the top surface in the thickness direction of the base member and has a flat surface perpendicular to the thickness direction of the base member, the flat surface comprising an incident surface on which light is made incident.

[Clause 13]
The method according to Clause 12, wherein the forming of the light-shielding resin includes forming a clearance between the incident region and the inner wall of the second opening.

[Clause 14]
The method according to any one of Clauses 1 to 13, wherein the light-shielding resin is made of a thermosetting synthetic resin.

[Clause 15]
The method according to Clause 14, wherein the light-shielding resin is made of a synthetic resin having a physical property different from the synthetic resin forming the light-transmitting resin, and a glass transition point of the light-shielding resin is lower than a glass transition point of the light-transmitting resin.

[Clause 16]
The method according to any one of Clauses 1 to 15, further comprising, prior to the forming of the light-transmitting resin, forming, by wire bonding, a first bonding wire between the internal electroconductive layer and the light-receiving element and a second bonding wire between the internal electroconductive layer and the light-emitting element.

[Clause 17]
The method according to any one of Clauses 1 to 16, wherein the base member has a reverse surface facing away from the surface in the thickness direction of the base, and
the forming of the internal electroconductive layer includes forming an external electroconductive layer on the reverse surface of the base member, the external electroconductive layer being electrically connected to the internal electroconductive layer.

[Clause 18]
The method according to Clause 17, the forming of the internal electroconductive layer includes forming at least one plating layer, by electrolytic plating, that covers the internal electroconductive layer and the external electroconductive layer.

[Clause 19]
The method according to Clause 18, wherein the at least one plating layer includes a Ni layer and a Au layer laminated on one another.

[Clause 20]
The method according to any one of Clauses 17 to 19, wherein the forming of the internal electroconductive layer includes forming, by application, a resist layer that is an electrical insulator and that covers a portion of the external electroconductive layer.

[Clause 21]
The method according to any one of Clauses 1 to 20, wherein the light-receiving element comprises an integrated circuit, and the light-receiving element having a light-receiving region that detects light, the light-receiving region comprising a photodiode.

[Clause 22]
The method according to any one of Clauses 1 to 21, wherein the light-emitting element comprises a light-emitting diode.

[Clause 23]

A semiconductor device comprising:

a substrate having a mounting surface and an attachment surface facing away from each other;

a light-receiving element mounted on the mounting surface of the substrate, the light-receiving element having a light-receiving region that detects light;

a light-emitting element mounted on the mounting surface of the substrate and spaced apart from the light-receiving element in a first direction perpendicular to a thickness direction of the substrate;

a light-transmitting member that covers the light-receiving element and the light-emitting element, the light-transmitting member having a convex lens from which light is emitted, the lens having a central portion located centrally in plan view and an annular portion surrounding the central portion, the annular portion has higher surface roughness than the central portion; and a light-shielding member covering the light-transmitting element and having a first opening exposing the lens.

Embodiment C1

With reference to FIGS. 40 to 50, the following describes a semiconductor device A10 according to Embodiment C1 of the present disclosure. The semiconductor device A10 includes a substrate 1, internal terminals 2, external terminals 31, a light-receiving element 41, a first bonding layer 42, a light-emitting element 43, a second bonding layer 44, first bonding wires 48, a second bonding wire 49, a light-transmitting member 5 and a light-shielding member 6.

Figure 40:
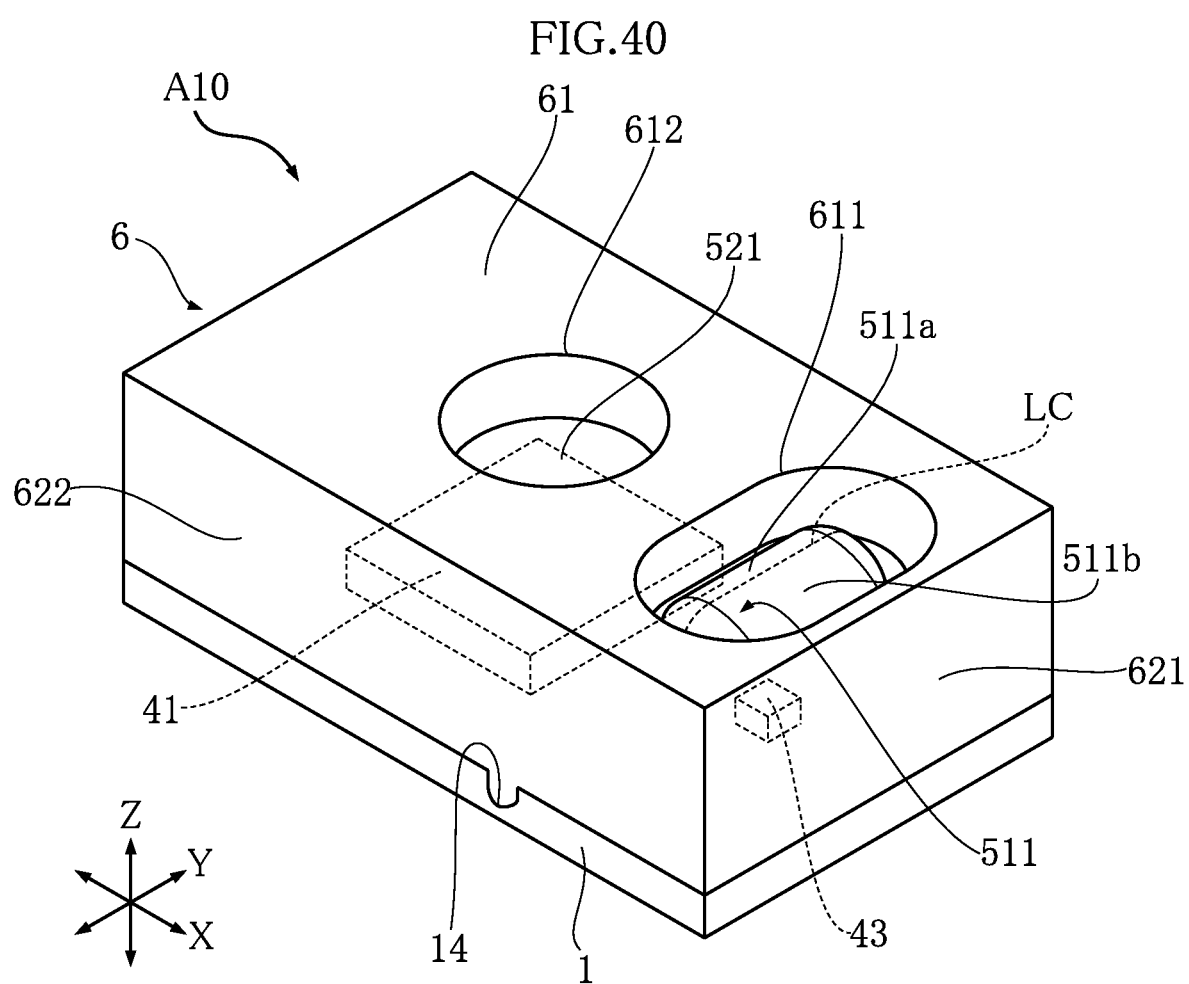
FIG. 40 is a perspective view of a semiconductor device according to Embodiment C1 of the present disclosure.
Figure 41:
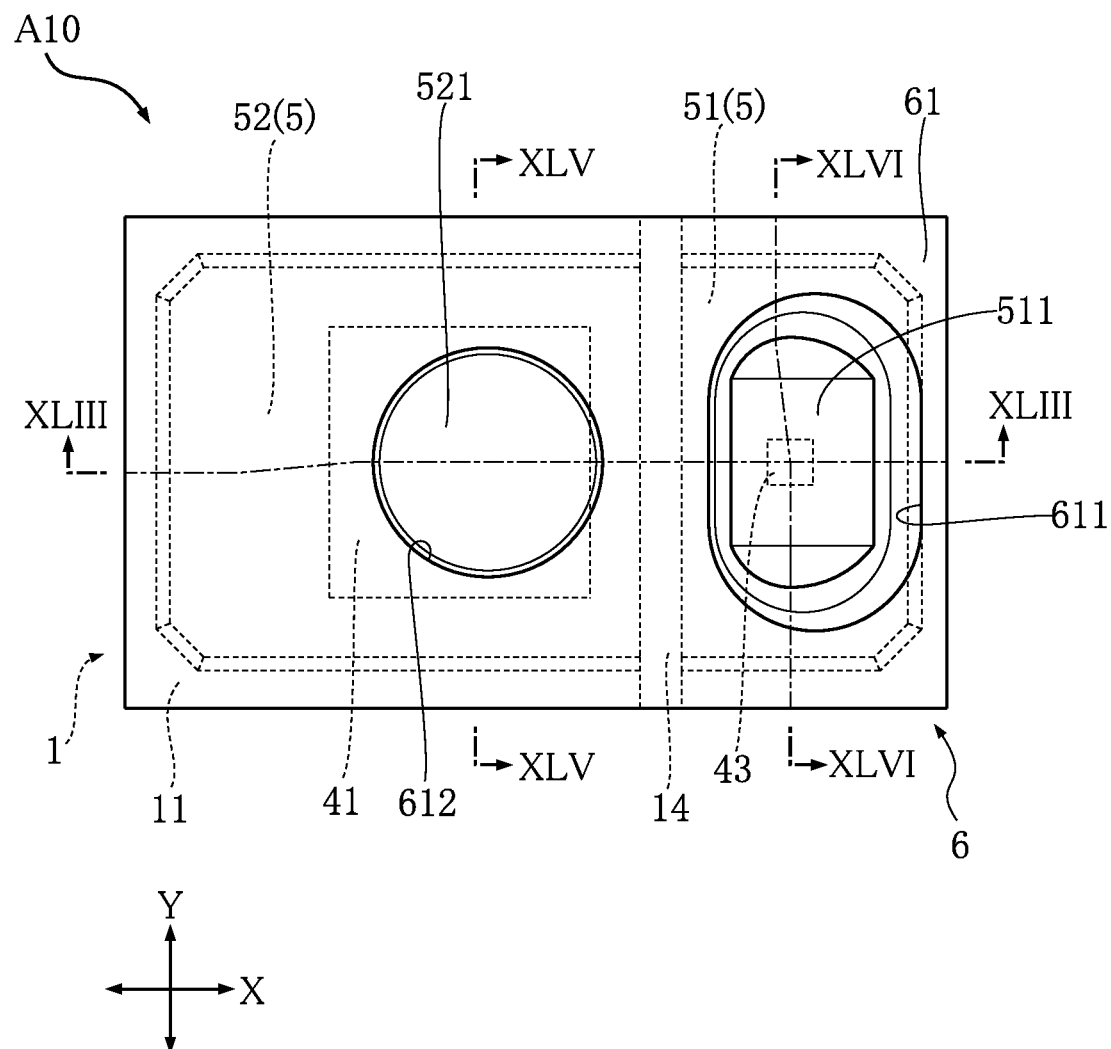
FIG. 41 is a plan view of the semiconductor device of FIG. 40.
Figure 42:
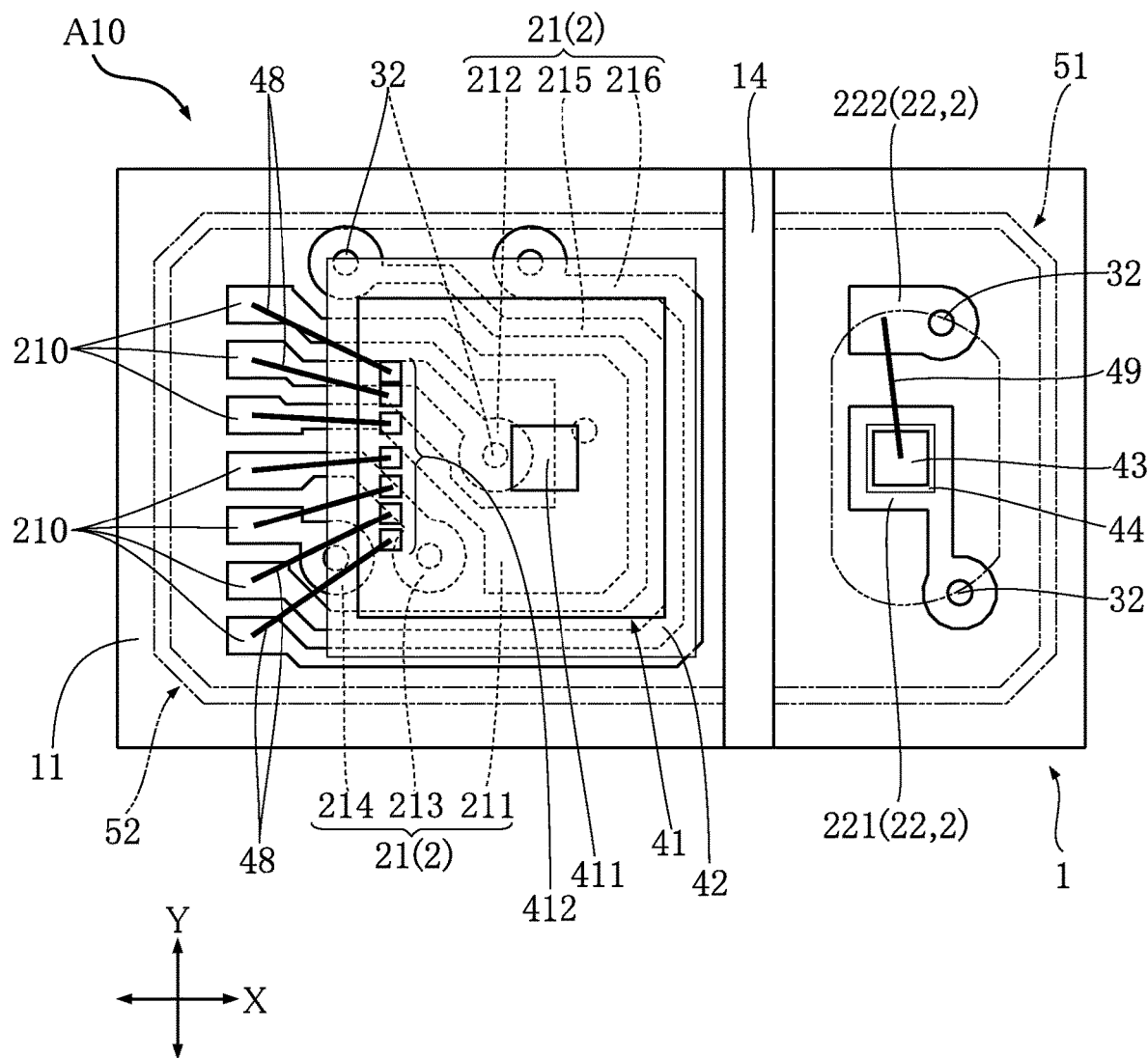
FIG. 42 is a plan view of the semiconductor device of FIG. 40 (with the light-transmitting member and the light-shielding member omitted).
Figure 43:
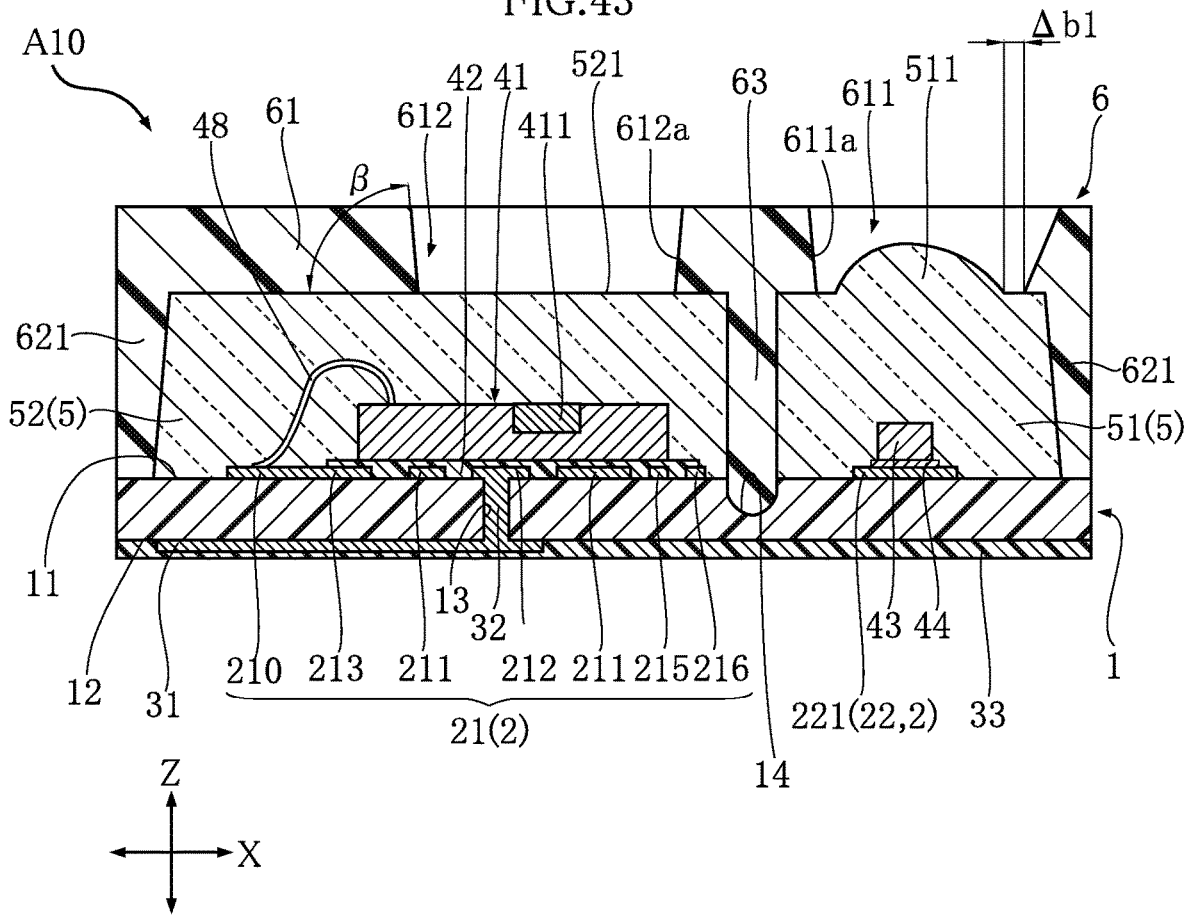
FIG. 43 is a sectional view taken along line XLIII-XLIII of FIG. 41.
Figure 44:
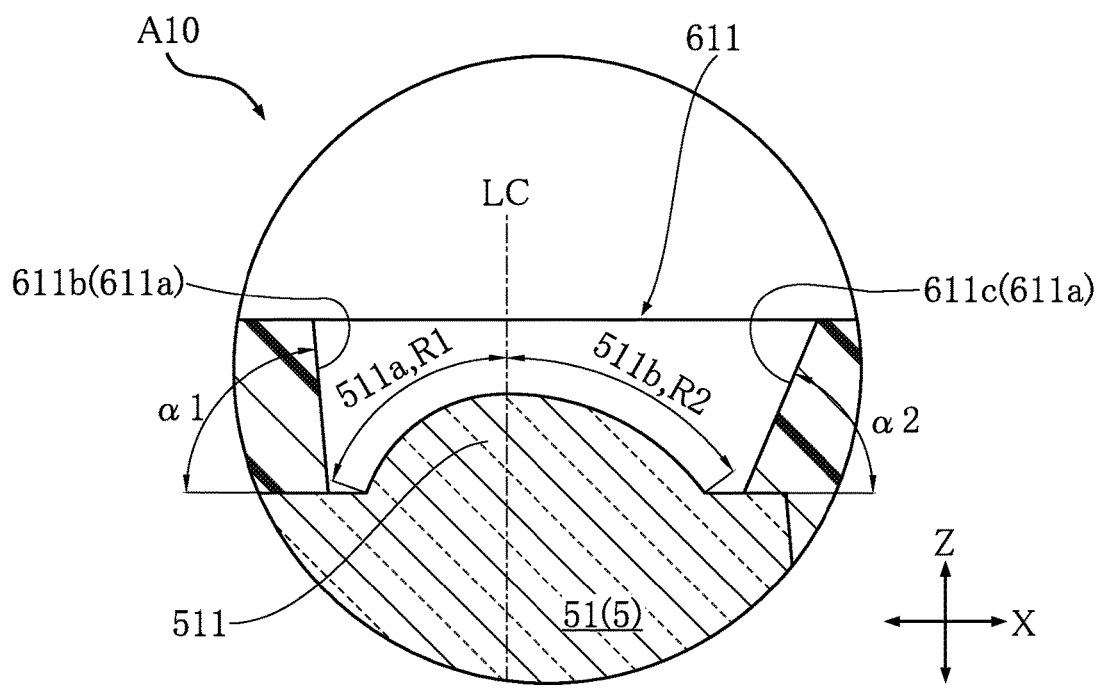
FIG. 44 is a partially enlarged view of FIG. 43.
Figure 45:
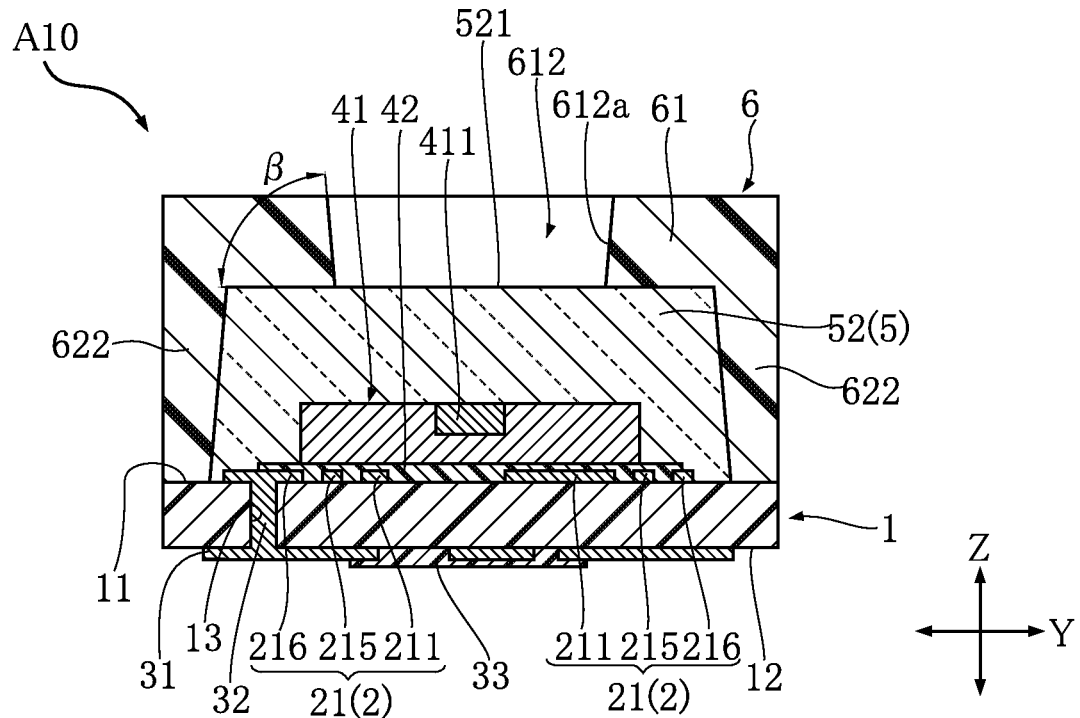
FIG. 45 is a sectional view taken along line XLV-XLV of FIG. 41.
Figure 46:
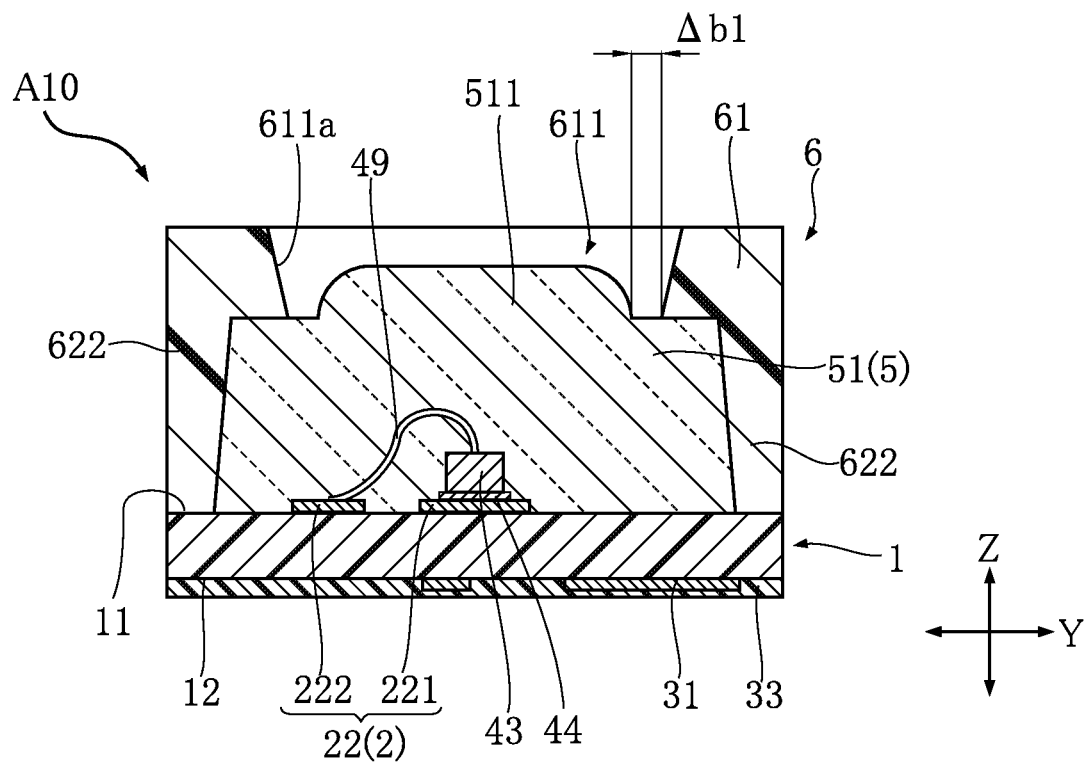
FIG. 46 is a sectional view taken along line XLVI-XLVI of FIG. 41.
Figure 47:
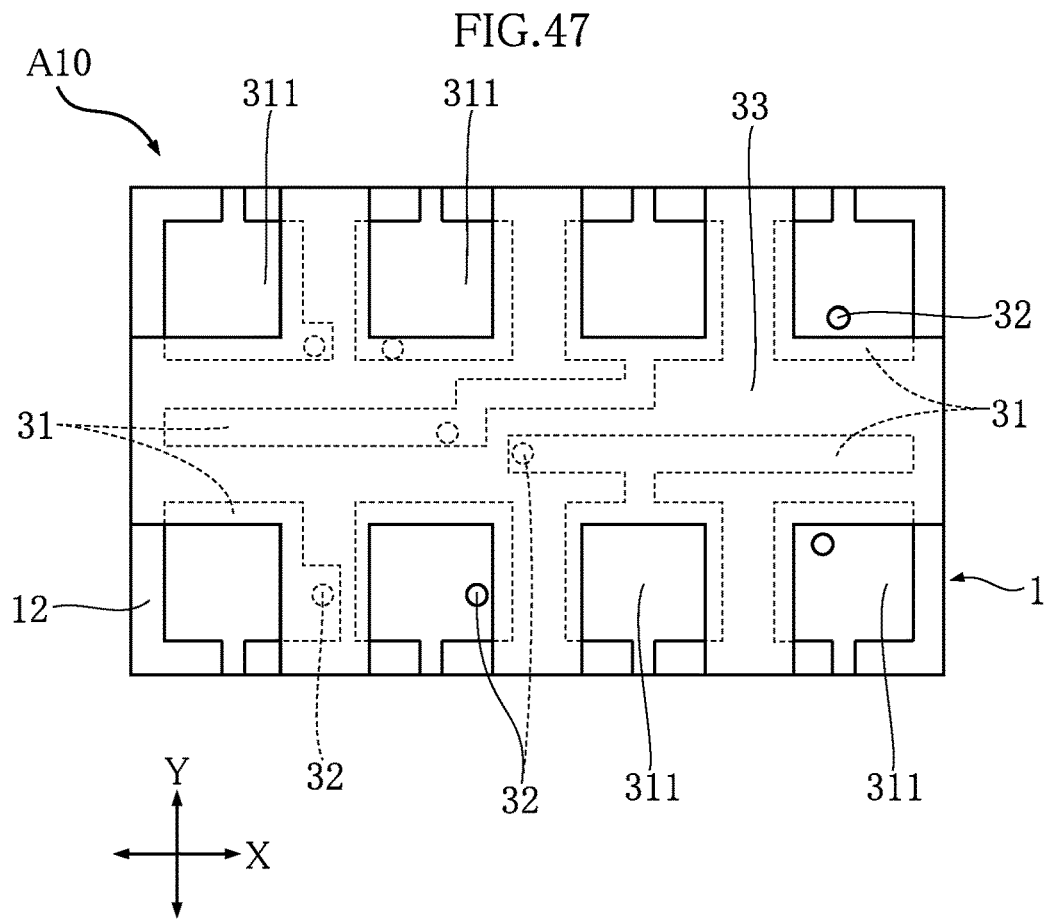
FIG. 47 is a bottom view of the semiconductor device of FIG. 40.
Figure 48:
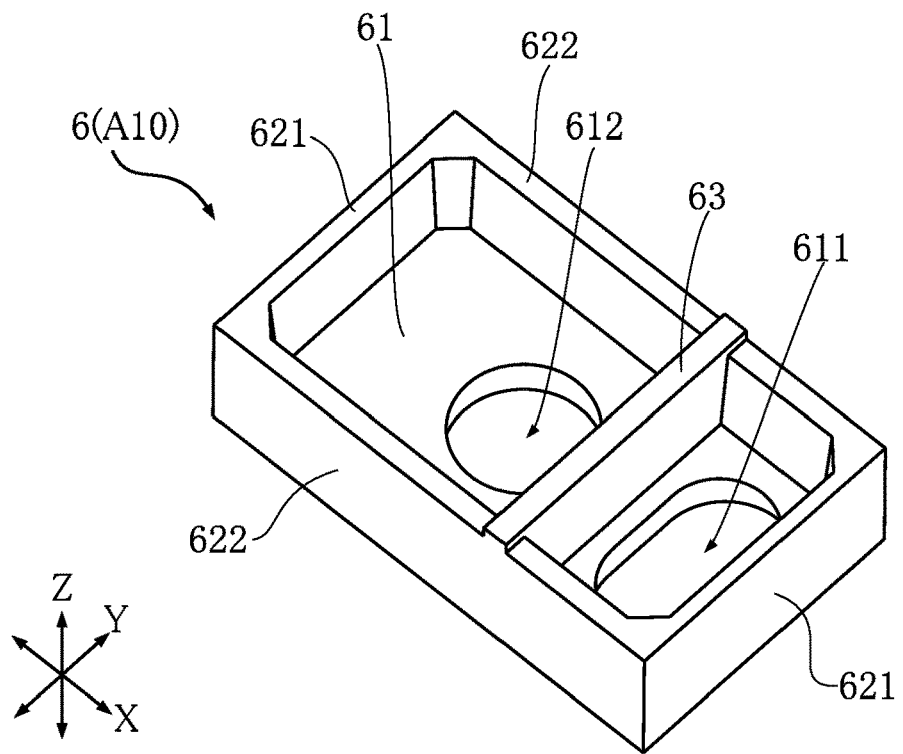
FIG. 48 is a perspective view showing the light-shielding member of the semiconductor device of FIG. 40.
Figure 49:
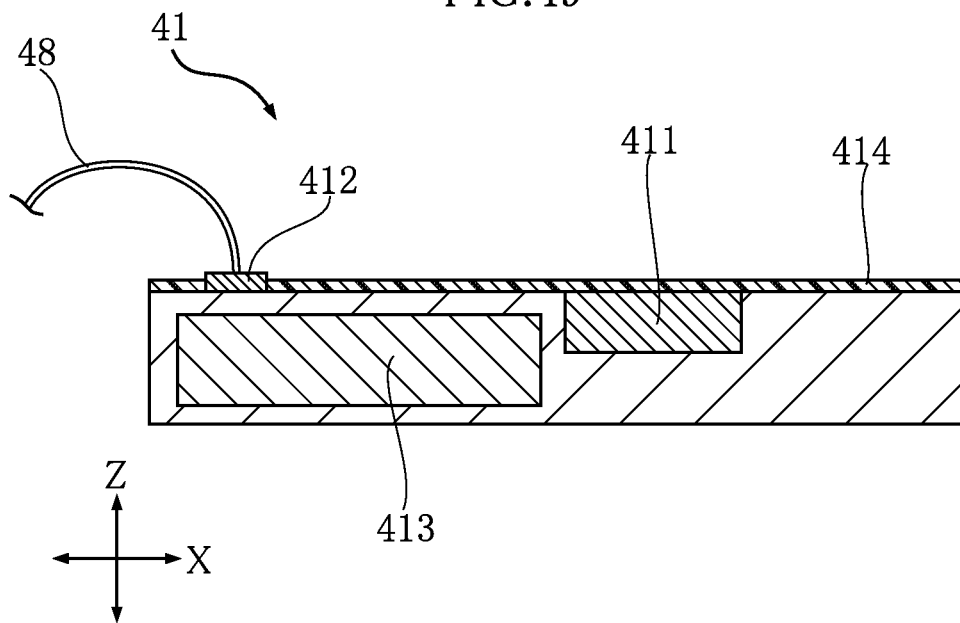
FIG. 49 is a sectional view showing a light-receiving element of the semiconductor device of FIG. 40.
Figure 50:
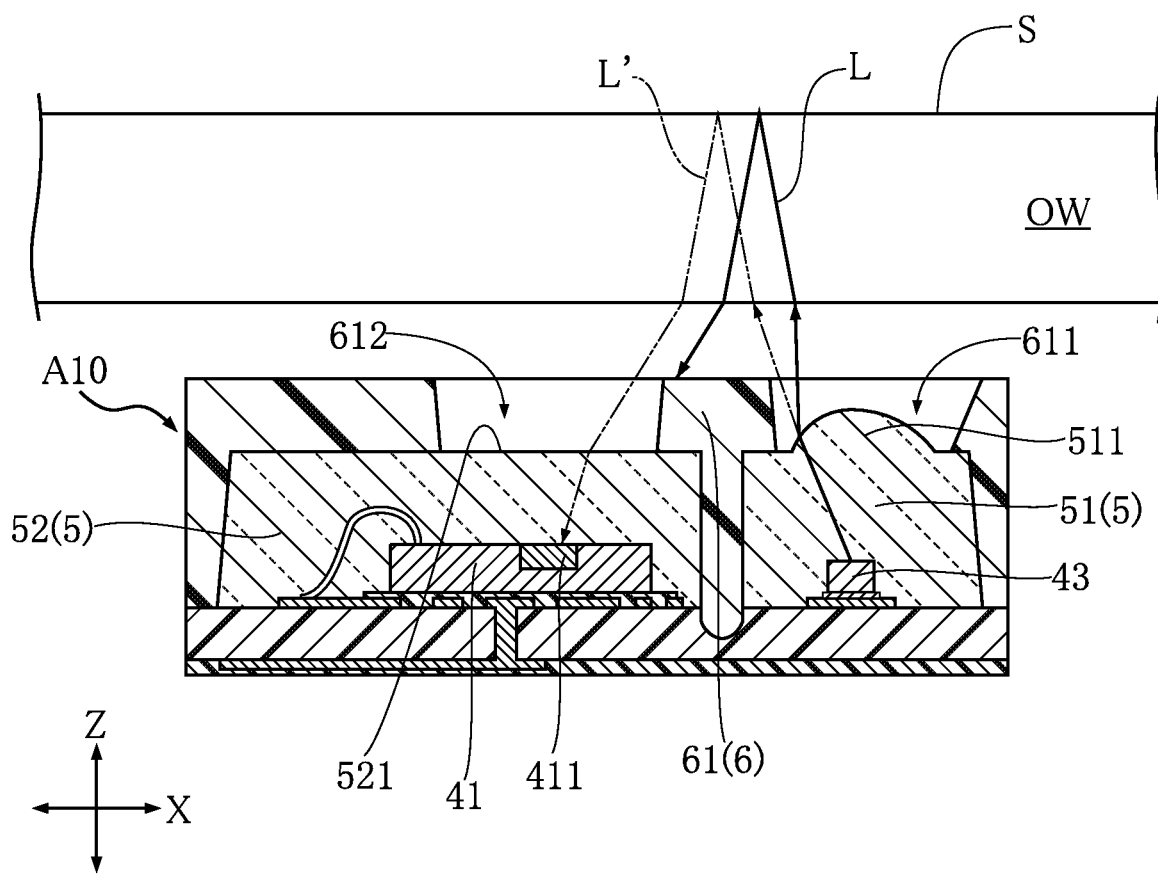
FIG. 50 is a sectional view illustrating advantages of the semiconductor device of FIG. 40.

FIG. 40 is a perspective view of the semiconductor device A10. FIG. 41 is a plan view of the semiconductor device A10. FIG. 42 is a plan view of the semiconductor device A10, with the light-transmitting member 5 and the light-shielding member 6 omitted for ease of understanding. The omitted light-transmitting member 5 is indicated by phantom lines (chain double-dashed lines). FIG. 43 is a sectional view taken along line XLIII-XLIII (the long dashed short dashed line in FIG. 41). FIG. 44 is a partially enlarged view of FIG. 43. FIG. 45 is a sectional view taken along line XLV-XLV of FIG. 41. FIG. 46 is a sectional view taken along line XLVI-XLVI (the long dashed short dashed line in FIG. 41). FIG. 47 is a plan view of the semiconductor device A10. FIG. 48 is a perspective view showing the light-shielding member 6 of the semiconductor device A10. FIG. 49 is a plan view showing the light-receiving element 41 of the semiconductor device A10. FIG. 50 a sectional view illustrating advantages of the semiconductor device A10 and taken along the same plane as in FIG. 43.

The semiconductor device A10 shown in these figures is designed for surface mounting on the circuit boards of electronic devices, such as smartphones and tablet computers. For the purpose of description, the right-and-left direction as seen in the plan view figures and perpendicular to the thickness direction Z of the substrate 1 is defined as a first direction X. Similarly, the up-and-down direction as seen in the plan view figures and perpendicular to both the thickness direction Z of the substrate 1 and the first direction X is defined as a second direction Y. As shown in FIG. 40, the semiconductor device A10 according to the present embodiment has a rectangular shape in plan view, i.e., as viewed in the thickness direction Z of the substrate 1 (hereinafter, simply "plan view"). The first direction X corresponds to the longitudinal direction of the semiconductor device A10.

As shown in FIGS. 41 to 43, the substrate 1 is a component for mounting the light-receiving element 41 and the light-emitting element 43 thereon and also for mounting the semiconductor device A10 on a circuit board. The substrate 1 is an electrical insulator and made of, for example, a glass epoxy resin. In plan view, the substrate 1 is rectangular having the long sides extending in the first direction X. The substrate 1 has a mounting surface 11, an attachment surface 12 and through holes 13.

As shown in FIGS. 42, 43 and 47, the mounting surface 11 and the attachment surface 12 face away from each other in the thickness direction Z of the substrate 1. In addition, both the mounting surface 11 and the attachment surface 12 are flat surfaces and rectangular in plan view with their long sides extending in the first direction X. The mounting surface 11 faces upward as seen in FIG. 43. The light-receiving element 41 and the light-emitting element 43 are mounted on the mounting surface 11, along with the internal terminals 2. The entire mounting surface 11 is covered by the light-transmitting member 5 and the light-shielding member 6. The attachment surface 12 faces downward as seen in FIG. 43. The attachment surface 12 is a side used to attach the semiconductor device A10. The external terminals 31 are mounted on the attachment surface 12.

As shown in FIGS. 43 and 45, a through hole 13 is formed in the substrate 1 to extend from the mounting surface 11 to the attachment surface 12. In the present embodiment, a plurality of through holes 13 are formed in the substrate 1. Each through hole 13 is filled with a connection terminal 32, which will be described later. In addition, as shown in FIGS. 41 to 43, the substrate 1 has a first groove 14 that is recessed from the mounting surface 11 and extends in the second direction Y. That is, the mounting surface 11 according to the present embodiment is divided into two regions by the first groove 14. The first groove 14 has a curved bottom surface.

As shown in FIGS. 42, 43, 45 and 46, the internal terminals 2 are electric conductors each of which is electrically connected to the light-receiving element 41 or the light-emitting element 43. The internal terminals 2 are made of Cu, for example. The internal terminals 2 according to the present embodiment include a plurality of first internal terminals 21 electrically connected to the light-receiving element 41 and a second internal terminal 22 electrically connected to the light-emitting element 43. The first internal terminals 21 are spaced apart from the second internal terminal 22 in the first direction X across the first groove 14 formed in the substrate 1 as a boundary. The internal terminals 2 according to the present embodiment are covered by a plating layer 39. The plating layer 39 is composed of a Ni layer and a Au layer laminated on one another.

As shown in FIGS. 42, 43 and 45, the first internal terminals 21 according to the present embodiment include a first terminal 211, a second terminal 212, a third terminal 213, a fourth terminal 214, a fifth terminal 215 and a sixth terminal 216. Each first internal terminal 21 is electrically connected to the light-receiving element 41 via a first bonding wire 48. Each first internal terminal 21 has an end forming a first pad portion 210 to which the first bonding wire 48 is connected. The first pad portions 210 are arranged along the second direction Y. Each first internal terminal 21 is electrically connected also to a connection terminal 32, which will be described later.

As shown in FIG. 42, the first terminal 211 surrounds the second terminal 212. Unlike the other first internal terminals 21, the first terminal 211 has the first pad portions 210 at either end thereof. As a result, the first pad portion 210 of the second terminal 212 is located between the first pad portions 210 of the first terminal 211 in the second direction Y. The third terminal 213 is adjacent to the first terminal 211, and the fourth terminal 214 is adjacent to the third terminal 213. In the present embodiment, the fourth terminal 214 is the shortest one among the plurality of first internal terminals 21. The fifth terminal 215 is adjacent to each of the first terminal 211, the third terminal 213 and the fourth terminal 214 and surrounds these adjacent terminals. The sixth terminal 216 is adjacent to the fifth terminal 215 and surrounds the fifth terminal 215. The sixth terminal 216 is the closest one to the light-emitting element 43 in the first direction X, among the plurality of first internal terminals 21.

As shown in FIG. 42, among the plurality of first internal terminals 21, each of the first terminal 211, the fifth terminal 215 and the sixth terminal 216 has a portion extending in the second direction Y, in a region of the mounting surface 11 of the substrate 1 between the center of the light-receiving element 41 and the center of the light-emitting element 43. Each of the first internal terminals 21, except for the sixth terminal 216, partially overlaps with the light-receiving element 41 in plan view.

As shown in FIGS. 42, 43 and 46, the second internal terminal 22 has a die pad portion 221 on which the light-emitting element 43 is mounted and a second pad portion 222 spaced apart from the die pad portion 221 in the second direction Y. The die pad portion 221 is electrically connected to the light-emitting element 43 via the second bonding layer 44. The second pad portion 222 is connected to the second bonding wire 49, so that the second pad portion 222 is electrically connected to the light-emitting element 43 via the second bonding wire 49. Each of the die pad portion 221 and the second pad portion 222 is connected to a connection terminal 32, which will be described later.

As shown in FIGS. 43 and 45 to 47, each external terminal 31 is a conductor electrically connected to the light-receiving element 41 or the light-emitting element 43 via a connection terminal 32 disposed in a through hole 13 of the substrate 1 and an internal terminal 2. The external terminals 31 and the connection terminals 32 are made of the same material as the internal terminals 2. In the present embodiment, the material is Cu, for example. The external terminals 31 are partially covered by a resist film 33 of an electrical insulator, and each external terminal has a terminal pad portion 311 exposed from the resist film 33. Each terminal pad portion 311 is rectangular in plan view. When the semiconductor device A10 is mounted on a circuit board, the terminal pad portions 311 are electrically connected to the circuit board wiring via, for example, solder paste.

Similarly to the internal terminals 2, the external terminals 31 according to the present embodiment are covered by a plating layer 39. In addition, the resist film 33 partially covering the external terminals 31 is made of, for example, solder resist.

The light-receiving element 41 and the light-emitting element 43 are the central components for the function of the semiconductor device A10. As shown in FIG. 49, the light-receiving element 41 according to the present embodiment is an integrated circuit (IC) having a light-receiving region 411, element pad portions 412, a functional region 413 and a laminated optical film 414.

The light-receiving region 411 is a portion that detects light emitted from the light-emitting element 43 and then reflected from a target object. Specifically, the light-receiving region in the present embodiment is a photodiode that detects infrared radiation. The light-receiving region 411 outputs the electrical voltage created by the photovoltaic effect occurring when light is detected. The element pad portions 412 are a plurality of components made of, for example, Al and each electrically connected to the light-receiving region 411 or the functional region 413. As shown in FIG. 42, each element pad portion 412 is connected to a first bonding wire 48, so that the element pad portions 412 are electrically connected to the respective first internal terminals 21 via the first bonding wires 48. The functional region 413 is electrically connected to the light-receiving region 411 and outputs a proximity signal indicating the presence of a nearby object based on the output voltage of the light-receiving region 411 obtained as a result of calculation. The functional region 413 outputs a proximity signal to the outside of the semiconductor device A10 when the output voltage exceeds a predetermined threshold. The laminated optical film 414 is made of a synthetic resin that is transparent only to light in the wavelength range corresponding to infrared radiation. In the light-receiving element 41, the laminated optical film 414 covers the light-receiving region 411 and the functional region 413. Thus, the light-receiving region 411 and the functional region 413 are not affected by light having other wavelengths, such as visible light.

The first bonding layer 42 is an electrical insulator and interposed between the light-receiving element 41 and the mounting surface 11 of the substrate 1, as shown in FIGS. 42, 43 and 45. The first bonding layer 42 secures the light-receiving element 41 to the mounting surface 11 by bonding. The first bonding layer 42 is made of, for example, an epoxy resin or polyimide. The first bonding layer 42 partially covers the mounting surface 11 and the first internal terminals 21.

As shown in FIGS. 42, 43 and 46, the light-emitting element 43 is a semiconductor element that emits light. In the present embodiment, an infrared light-emitting diode is used. The light-emitting element 43 emits infrared radiation from the upper surface as seen in FIGS. 43 and 46, and the second bonding wire 49 is connected to the upper surface. That is, the upper surface is electrically connected to the second pad portion 222 of the second internal terminal 22 via the second bonding wire 49. In addition, the lower surface of the light-emitting element 43 as seen in FIGS. 43 and 46 is electrically connected to the die pad portion 221 of the second internal terminal 22 via the second bonding layer 44.

The second bonding layer 44 is an electric conductor and interposed between the light-emitting element 43 and the die pad portion 221 of the second internal terminal 22, as shown in FIGS. 42, 43 and 46. The second bonding layer 44 secures the light-emitting element 43, by die bonding, to the die pad portion 221 disposed on the mounting surface 11. The second bonding layer 44 may be made of an epoxy-based synthetic resin containing Ag (so-called Ag paste).

The first bonding wires 48 are electric conductors connecting the element pad portions 412 of the light-receiving element 41 to the first internal terminals 21 among the internal terminals 2, as shown in FIGS. 42 and 43. In the present embodiment, the first bonding wires 48 are located on the side of the light-receiving element 41 opposite the light-emitting element 43 in the first direction X. In addition, the second bonding wire 49 is an electric conductor connecting the light-emitting element 43 to the second pad portion 222 of the second internal terminal 22, as shown in FIGS. 42 and 46. The second bonding wire 49 is made of the same material as the first bonding wires 48. In the present embodiment, both the first bonding wires 48 and the second bonding wire 49 are made of Au.

As shown in FIGS. 41 to 43, 45 and 46, the light-transmitting member 5 covers the internal terminals 2, the light-receiving element 41, the light-emitting element 43, the first bonding wires 48 and the second bonding wire 49 on the mounting surface 11 of the substrate 1. The light-transmitting member 5 according to the present embodiment includes a first light-transmitting member 51 and a second light-transmitting member 52. Both the first light-transmitting member 51 and the second light-transmitting member 52 are made of the same transparent synthetic resin that passes light in the wavelength range from visible to infrared. The first light-transmitting member 51 and the second light-transmitting member 52 on the mounting surface 11 are spaced apart from each other in the first direction X across the first groove 14 formed in the first substrate 1 as a boundary.

As shown in FIGS. 41, 43 and 46, the first light-transmitting member 51 has the shape of a substantially truncated pyramid and covers the second internal terminal 22, the light-emitting element 43 and the second bonding wire 49. As shown in FIGS. 40 and 41, the first light-transmitting member 51 has a convex lens 511 through which light emitted by the light-emitting element 43 is transmitted to the outside of the semiconductor device A10. In plan view, the lens 511 according to the present embodiment has an elliptical shape elongated in the second direction Y. As shown in FIGS. 40 and 44, the lens 511 has a first lens surface 511a and a second lens surface 511b. The first lens surface 511a is a surface region of the lens 511 located between an imaginary plane LC and the light-receiving element 41. The second lens surface 511b is a surface region of the lens 511 located on the side opposite the first lens surface 511a across the imaginary plane LC. The first lens surface 511a and the second lens surface 511b are regions of a continuous surface of the lens 511. The first lens surface 511a has a curvature radius R1 that is smaller than the curvature radius R2 of the second lens surface 511b.

As shown in FIGS. 41, 43 and 45, the second light-transmitting member 52 has the shape of a substantially truncated pyramid and covers the first internal terminals 21, the light-receiving element 41 and the first bonding wires 48. As shown in FIGS. 40 and 41, the second light-transmitting member 52 has an incident region 521 on which light is made incident after the light is emitted from the light-emitting element 43 and then reflected from a target object. The incident region 521 is a surface of the second light-transmitting member 52 exposed through a second opening 612 of the light-shielding member 6, which will be described later. The incident region 521 according to the present embodiment is a flat surface.

As shown in FIGS. 40, 41, 43, 45 and 46, the light-shielding member 6 covers both the first light-transmitting member 51 and the second light-transmitting member 52 of the light-transmitting member 5. As shown in FIG. 48, the light-shielding member 6 has a top portion 61, a pair of first side walls 621, a pair of second side walls 622 and a partition wall 63. The light-shielding member 6 is made of a light-shielding synthetic resin, such as a black epoxy resin. In the present embodiment, the light-shielding member 6 is made of a synthetic resin that differs in the physical property (or physical properties) from the synthetic resin forming the first light-transmitting member 51 and the second light-transmitting member 52. The light-shielding member 6 has a glass transition point lower than the glass transition point of the first light-transmitting member 51 and the second light-transmitting member 52.

As shown in FIGS. 40, 41, 43, 45 and 46, the top portion 61 overlies the first light-transmitting member 51 and the second light-transmitting member 52 in the thickness direction Z of the substrate 1. In plan view, the top portion 61 is equal in size to the substrate 1. The top portion 61 has a first opening 611 and a second opening 612.

As shown in FIGS. 40, 41, 43, 46 and 48, the first opening 611 is a through hole formed in the top portion 61 to expose the lens 511. In plan view, the first opening 611 has an elliptical shape elongated in the second direction Y. An inner wall 611a of the first opening 611 has a surface inclined toward the center of the first opening as the distance to the light-emitting element 43 decreases in the thickness direction Z of the substrate 1. As shown in FIG. 44, the inner wall 611a of the first opening 611 has a first portion 611b facing the first lens surface 511a and a second portion 611c facing the second lens surface 511b. The inclination angle $\alpha 1$ of the first portion 611b relative to the first direction X is larger than the inclination angle $\alpha 2$ of the second portion 611c. As shown in FIGS. 43 and 46, in addition, on the surface of the first light-transmitting member 51 in contact with the top portion 61, a clearance $\Delta b1$ is provided between the lens 511 and the inner wall 611a of the first opening 611. The width of the clearance $\Delta b1$ is uniform along the entire circumference of the lens 511.

As shown in FIGS. 40, 41, 43, 45 and 48, the second opening 612 is a through hole formed in the top portion 61 to expose the incident region 521. The second opening 612 is spaced apart from the first opening 611 in the first direction X. In plan view, the second opening 612 is circular. An inner wall 612a of the second opening 612 has a surface inclined toward the center of the second opening as the distance to the light-receiving element 41 decreases in the thickness direction Z of the substrate 1. As shown in FIGS. 43 and 45, the inclination angle $\beta$ of the inner wall of the second opening 612 relative to the first direction X is uniform along the entire circumference of the lens 511.

As shown in FIGS. 43 and 48, the pair of first side walls 621 are spaced apart from each other in the first direction X. In the thickness direction Z of the substrate 1, one end of each first side wall is connected to the top portion 61 and the other end is in contact with the substrate 1. In the second direction Y, the opposite ends of each first side wall 621 are connected to the pair of second side walls 622. As shown in FIGS. 45, 46 and 48, in addition, the pair of second side walls 622 are spaced apart from each other in the second direction Y. In the thickness direction Z of the substrate 1, one end of each second side wall is connected to the top portion 61 and the other end is in contact with the substrate 1. In the first direction X, the opposite ends of each second side wall 622 are connected to the pair of first side walls 621. That is, the pair of first side walls 621 and the pair of second side walls 622 are disposed to surround the first light-transmitting member 51 and the second light-transmitting member 52.

As shown in FIGS. 43 and 48, the partition wall 63 is a barrier isolating the first light-transmitting member 51 from the second light-transmitting member 52. The partition wall 63 is parallel to the pair of first side walls 621, and the opposite ends in the second direction Y are connected to the pair of second side walls 622. In addition, one end of the partition wall in the thickness direction Z of the substrate 1 is connected to the top portion 61, and the other end is fitted in the first groove 14 formed in the mounting surface 11 of the substrate 1.

The following now describes advantages of the semiconductor device A10.

The semiconductor device A10 includes: the light-receiving element 41 and the light-emitting element 43 each of which is mounted on the mounting surface 11 of the substrate 1; the first light-transmitting member 51 having the lens 511; and the light-shielding member 6 having the first opening 611 exposing the lens 511. The lens 511 has the first lens surface 511*a* located between the imaginary plane LC and the light-receiving element 41 and also has the second lens surface 511*b* located on the side of the imaginary plane LC opposite the first lens surface 511*a* in the first direction X. The first lens surface 511*a* and the second lens surface form a continuous surface. The curvature radius R1 of the first lens surface 511*a* is smaller than the curvature radius R2 of the second lens surface 511*b*. As shown in FIG. 50, light L and L' from the light-emitting element 43 is refracted at the first lens surface 511*a*, and the refracted light may be made incident on an optical window OW of an electronic device to be reflected at the boundary surface S between the optical window OW and the outside. The light L represents an optical path of light emitted by light-emitting element 43 of the semiconductor device A10. The light L' represents an optical path of light emitted from the light-emitting element 43 according to a conventional configuration. As compared to the light L', the light L is refracted at the first lens surface 511*a* to travel in a direction closer to the thickness direction Z of the substrate 1. Thus, although the light L' is reflected at the boundary surface S to reach the light-receiving region 411 of the light-receiving element 41, the light L is reflected at the boundary surface S to fall on the top portion 61 of the light-shielding member 6 but not on the light-receiving region 411. In this way, the amount of light reflected at the boundary surface S to reach the light-receiving region 411 can be restricted. Thus, the light-receiving element 41 and the light-emitting element 43 can be disposed to have a shorter center distance in the longitudinal direction of the device (the first direction X), without reducing the detection accuracy of the light-receiving element 41.

The semiconductor device A10 includes the internal terminals 2 disposed on the mounting surface 11 of the substrate 1 and also includes the first bonding wires 48 connecting the element pad portions 412 of the light-receiving element 41 to the internal terminals 2. The light-receiving element 41 and the light-emitting element 43 on the mounting surface 11 are spaced apart from each other in the first direction X that is perpendicular to the thickness direction Z of the substrate 1. The first bonding wires 48 are located on the side of the light-receiving element 41 opposite the light-emitting element 43 in the first direction X. This configuration allows the light-receiving element 41 to be located closer to the light-emitting element 43 in the first direction. Thus, the center distance between the light-receiving element 41 and the light-emitting element 43 in the longitudinal direction of the device can be shorted as compared to a conventional configuration. In addition, this configuration can ensure a longer distance between the first bonding wire 48 and the light-emitting element 43 in the first direction X and thus reduce noise in the light-receiving element 41 resulting from the electric current flowing in the light-emitting element 43.

The internal terminals 2 include the first internal terminals 21 electrically connected to the light-receiving element 41 via the first bonding wires 48. Each first internal terminal 21 has an end forming a first pad portion 210 to which the first bonding wire 48 is connected. The first pad portions 210 are arranged along the second direction Y that is perpendicular to both the thickness direction Z of the substrate 1 and the first direction X. With this configuration, the first bonding wires 48 are closely located to be in a localized area, which is effective to further reduce noise in the light-receiving element 41.

The first internal terminals 21 partially overlap with the light-receiving element 41 in plan view. In addition, the semiconductor device A10 has the first bonding layer 42 that is an electrical insulator and that is interposed between the light-receiving element 41 and the mounting surface 11 of the substrate 1. That is, in the semiconductor device A10, the light-receiving element 41 disposed on the mounting surface 11 partially overlies the first internal terminals 21. This configuration provides an effective way to avoid upsizing of the semiconductor device A10.

The lens 511 formed in the second light-transmitting member 52 covering the light-emitting element 43 has an elliptical shape elongated in the second direction Y in plan view. This shape of the lens 511 enables the length of the second light-transmitting member 52 to be reduced in the second direction, while ensuring the lens 511 to have a lens surface of a sufficient area. In this way, the center distance between the light-receiving element 41 and the light-emitting element 43 in the first direction X can be shortened, while ensuring that the semiconductor device A10 is able to emit a certain amount of light.

The light-shielding member 6 covering the first light-transmitting member 51 and the second light-transmitting member 52 has the partition wall 63 that isolates the first light-transmitting member 51 from the second light-transmitting member 52. This configuration prevents light emitted from the light-emitting element 43 from directly made incident on the light-emitting element 43 and thus prevents erroneous detection by the light-receiving element 41. In addition, the partition wall 63 is fitted in the first groove 14 formed in the mounting surface 11 of the substrate 1. This configuration improves the bond strength between the light-shielding member 6 and the substrate 1.

The light-shielding member 6 is made of a synthetic resin that differs in the physical property (or physical properties) from the synthetic resin forming the first light-transmitting member 51 and the second light-transmitting member 52. The light-shielding member 6 has a glass transition point lower than the glass transition point of the first light-transmitting member 51 and the second light-transmitting member 52. With this configuration, the light-shielding member 6 will have a higher elastic modulus than the first light-transmitting member 51 and the second light-transmitting member 52 at high temperatures experienced by the semiconductor device A10 in use. This is effective to reduce the temperature stress on the first light-transmitting member 51 and the second light-transmitting member 52 caused by thermal expansion of the light-shielding member 6. Consequently, crack formation is prevented in the first light-transmitting member 51 and the second light-transmitting member 52.

The respective plating layers 39 covering the internal terminals 2 and the external terminals 31 are composed of a Ni layer and a Au layer laminated on one another. The plating layers 39 of this configuration can protect the internal terminals 2 from impacts such as heat occurring at the time of mounting the light-receiving element 41 and the light-emitting element 43 or at the time of connecting the first bonding wires 48 or the second bonding wire 49. After the semiconductor device A10 is mounted on a circuit board, in addition, the plating layers can protect the terminal pad portions 311 of the external terminals 31 from erosion caused by solder paste or by other factors.

Embodiment C2

With reference to FIGS. 51 to 54, the following describes a semiconductor device A20 according to Embodiment C2 of the present disclosure. In these figures, components identical or similar to the components of the semiconductor device A10 described above are denoted by the same reference signs, and redundant descriptions thereof are omitted.

Figure 51:
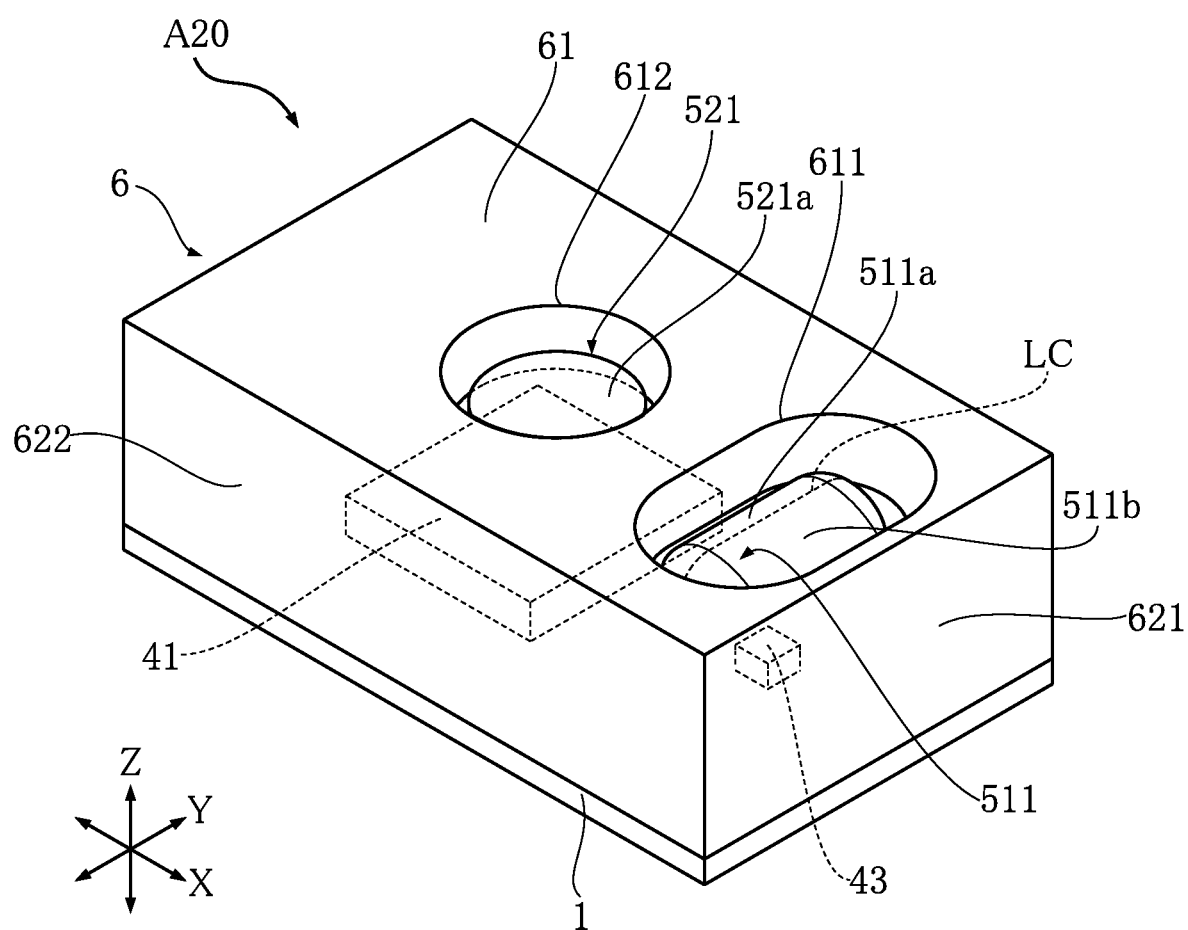
FIG. 51 is a perspective view of a semiconductor device according to Embodiment C2 of the present disclosure.
Figure 52:
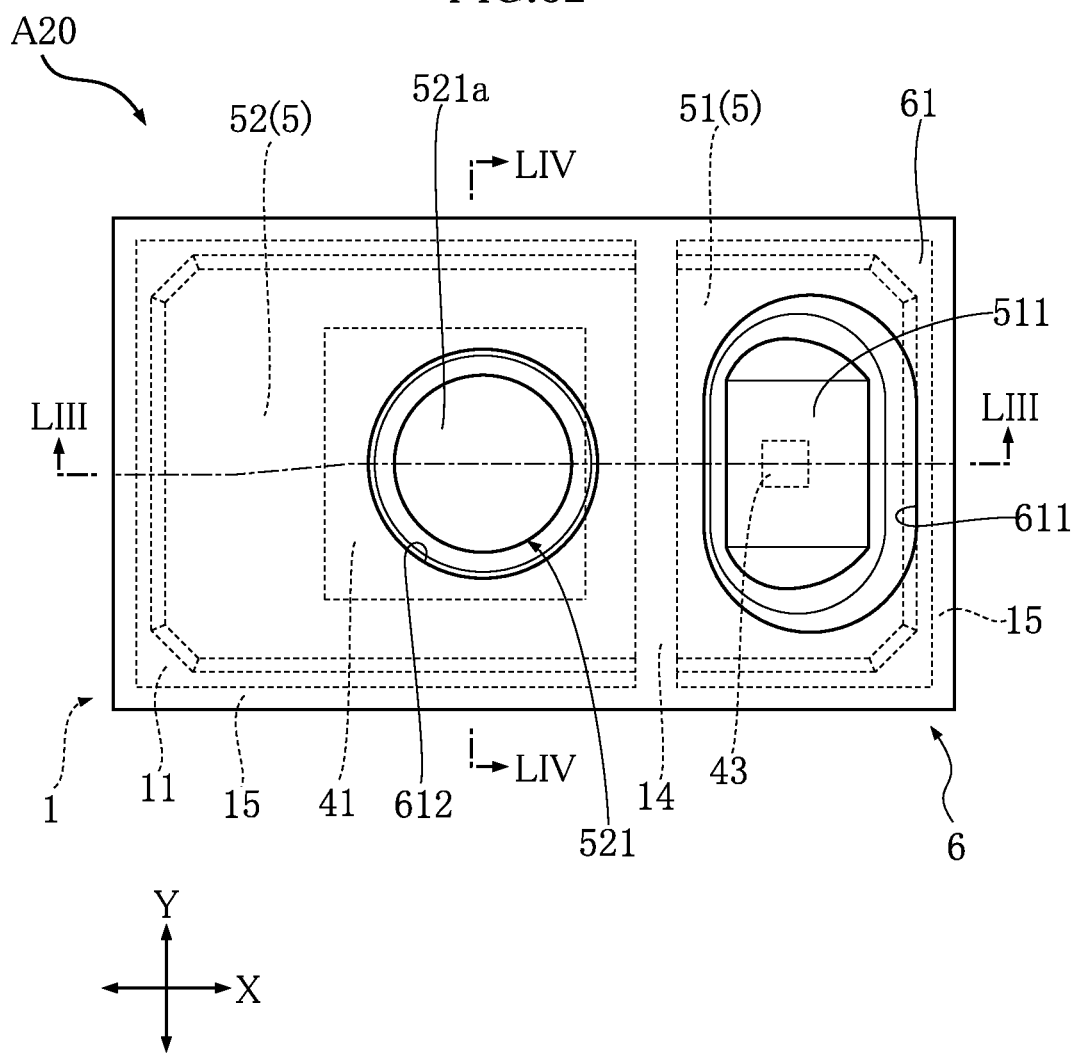
FIG. 52 is a plan view of the semiconductor device of FIG. 51.
Figure 53:
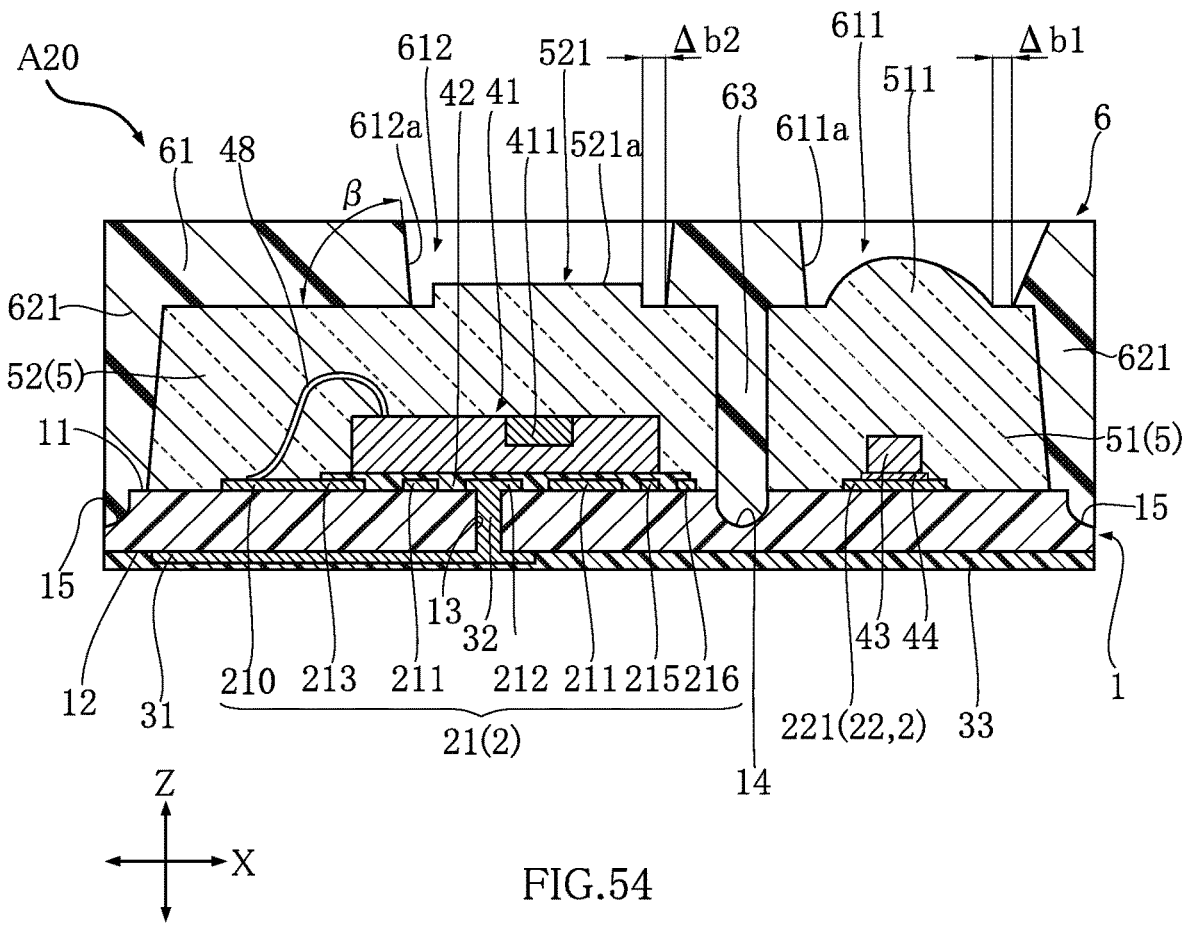
FIG. 53 is a sectional view taken along line LIII-LIII of FIG. 52.

FIG. 51 is a perspective view of the semiconductor device A20. FIG. 52 is a plan view of the semiconductor device A20. FIG. 53 is a sectional view taken along line LIII-LIII (the long dashed short dashed line in FIG. 52). FIG. 53 is a sectional view taken along line LIV-LIV of FIG. 52.

The semiconductor device A20 according to the present embodiment differs from the semiconductor device A10 in the configuration of the substrate 1, the second light-transmitting member 52 and the light-shielding member 6. As shown in FIG. 51, the semiconductor device A20 according to the present embodiment is rectangular in plan view.

Figure 54:
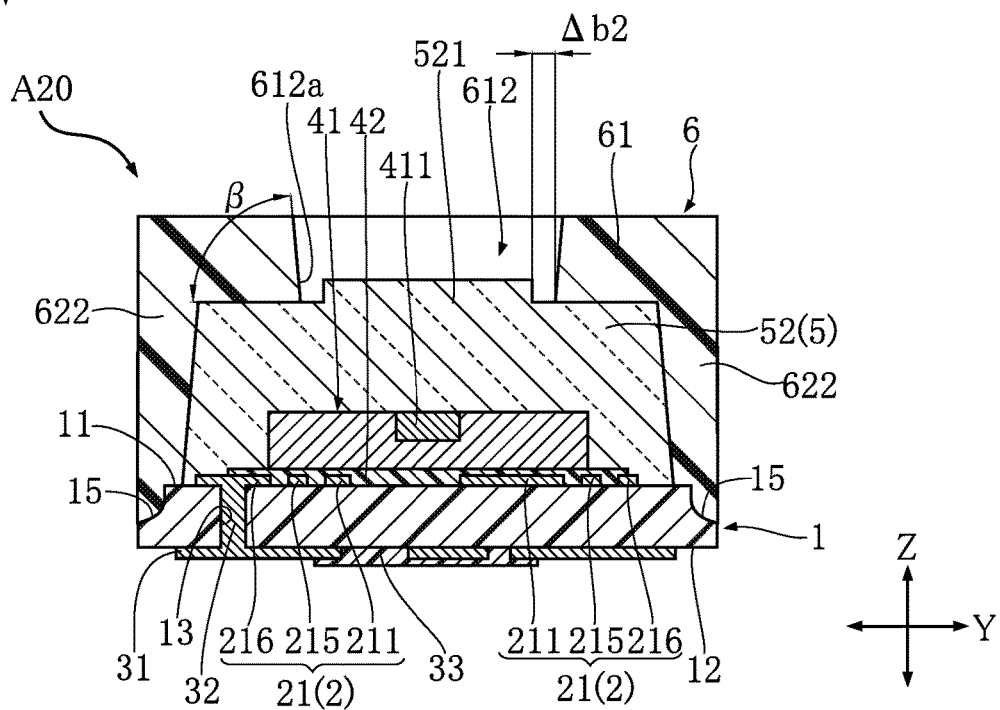
FIG. 54 is a sectional view taken along line LIV-LIV of FIG. 52.

As shown in FIGS. 52 to 54, the substrate 1 according to the present embodiment has a second groove 15 in addition to the first groove 14. The second groove is recessed from the mounting surface 11 and surrounds the first light-transmitting member 51 and the second light-transmitting member 52. The opposite ends of the first groove 14 are connected to the second groove 15. The pair of first side walls 621 and the pair of second side walls 622 of the light-shielding member 6 are fitted in the first groove 14. In the present embodiment, the second groove 15 has a depth (length in the thickness direction Z of the substrate 1) equal to the depth of the first groove 14.

As shown in FIGS. 51 to 54, the incident region 521 of the second light-transmitting member 52 is raised in the thickness direction Z of the substrate 1. The incident region 521 has an incident surface 521a on which light is made incident. The incident surface 521a is a flat surface perpendicular to the thickness direction Z of the substrate 1. The incident region 521 according to the present embodiment is circular in plan view.

As shown in FIGS. 53 and 54, the present embodiment provides, on the surface of the second light-transmitting member 52 in contact with the top portion 61, a clearance Δb2 between the incident region 521 and the inner wall 612a of the second opening 612. The width of the clearance Δb2 is uniform along the entire circumference of the incident region 521.

The following now describes advantages of the semiconductor device A20.

Similarly to the semiconductor device A10 described above, the semiconductor device A20 includes the first light-transmitting member 51 that covers the light-emitting element 43 and has the lens 511. The lens 511 has the first lens surface 511a and the second lens surface 511b. Also in this embodiment, the curvature radius R1 of the first lens surface 511a is smaller than the curvature radius R2 of the second lens surface 511b. The semiconductor device A20 can thus restrict the amount of light reflected at the boundary surface S to reach the light-receiving region 411 of the light-receiving element 41, preventing reduction of the detection accuracy of the light-receiving element 41.

The mounting surface 11 of the substrate 1 has the first groove 14 and also the second groove 15. The light-shielding member 6 is disposed such that the partition wall 63 is fitted in the first groove 14 and the pair of the first side walls 621 and the pair of the second side walls 622 are fitted in the second groove 15. This configuration can further increase the bond strength of the light-shielding member 6 to the substrate 1 than in the semiconductor device A10.

The incident region 521 of the second light-transmitting member 52 is raised in the thickness direction Z of the substrate 1. This configuration ensures that light emitted by the light-emitting element 43 and reflected by a target object travels a longer distance in the second light-transmitting member 52, as compared to the semiconductor device A10. In addition, the second light-transmitting member 52 is configured such that the angle of refraction at the incident surface 521a of the incident region 521 is smaller than the angle of incidence at the incident region 521. Consequently, the amount of light reflected from a target object to reach the light-receiving region 411 increases as compared to the semiconductor device A10, so that the accuracy of detection by the light-receiving element 41 can be improved.

The following clauses summarizes the embodiments described above.

[Clause 1]

A semiconductor device comprising:

a substrate having a mounting surface and an attachment surface facing away from each other;

a light-receiving element mounted on the mounting surface of the substrate, the light-receiving element having a light-receiving region that detects light;

a light-emitting element mounted on the mounting surface of the substrate and spaced apart from the light-receiving element in a first direction perpendicular to a thickness direction of the substrate; and a light-transmitting member covering the light-receiving element and the light-emitting element, the light-transmitting member having a convex lens from which light is emitted, wherein the lens has a first lens surface and a second lens surface that are next to each other in the first direction, the first lens surface being located between an imaginary plane perpendicular to the first direction and the light-receiving element, the second lens surface being located on a side of the imaginary plane opposite the first lens surface, and wherein a curvature radius of the first lens surface is smaller than a curvature radius of the second lens surface.

[Clause 2]

The semiconductor device according to Clause 1, comprising: a light-shielding member that covers the light-transmitting element and has a first opening exposing the lens.

[Clause 3]

The semiconductor device according to Clause 2, wherein the lens has an elliptical shape elongated in a second direction in plan view, the second direction being perpendicular to both the first direction and a thickness direction of the substrate.

[Clause 4]

The semiconductor device according to Clause 3, wherein the first opening has an elliptical shape elongated in the second direction in plan view.

[Clause 5]

The semiconductor device according to any one of Clauses 2 to 4, wherein a clearance is provided between the lens and an inner wall of the first opening.

[Clause 6]

The semiconductor device according to Clause 5, wherein the inner wall of the first opening has a surface inclined toward a center of the first opening with a decreasing distance to the light-emitting element in the thickness direction of the substrate.

[Clause 7]

The semiconductor device according to Clause 6, wherein the inner wall of the first opening has a first portion facing the first lens surface and a second portion facing the second lens surface, and wherein an inclination angle of the first portion relative to the first direction is larger than an inclination angle of the second portion relative to the first direction.

[Clause 8]

The semiconductor device according to any one of Clauses 2 to 7, the light-transmitting member includes a first light-transmitting member and a second light-transmitting member, the first light-transmitting member covering the light-emitting element and having the lens, the second light-transmitting member covering the light-receiving element and having an incident region on which light is made incident, and wherein the first light-transmitting member and the second light-transmitting member are mounted on the mounting surface of the substrate and spaced apart from each other in the first direction.

[Clause 9]

The semiconductor device according to Clause 8, the light-shielding member has a second opening exposing the incident region, and wherein the second opening is spaced apart from the first opening in the first direction.

[Clause 10]

The semiconductor device according to Clause 9, wherein the second opening has a circular shape in plan view.

[Clause 11]

The semiconductor device according to Clause 9 or 10, wherein an inner wall of the second opening has a surface inclined toward a center of the second opening with a decreasing distance to the light-receiving element in the thickness direction of the substrate.

[Clause 12]

The semiconductor device according to Clause 11, wherein an inclination angle of the inner wall of the second opening relative to the first direction is uniform along an entire circumference of the second opening.

[Clause 13]

The semiconductor device according to Clause 11 or 12, wherein the incident region is raised in the thickness direction of the substrate and has a flat surface perpendicular to the thickness direction of the substrate, the flat surface comprising an incident surface on which light is made incident.

[Clause 14]

The semiconductor device according to Clause 13, wherein the incident region has a circular shape in plan view.

[Clause 15]

The semiconductor device according to Clause 13 or 14, wherein a clearance is provided between the incident region and the inner wall of the second opening.

[Clause 16]

The semiconductor device according to any one of Clauses 8 to 15, wherein the light-shielding member has a partition wall shielding the first light-transmitting member and the second light-transmitting member from each other.

[Clause 17]

The semiconductor device according to Clause 16, wherein the substrate has a first groove recessed from the mounting surface and located between the first light-transmitting member and the second light-transmitting member, and wherein the partition wall is fitted in the first groove.

[Clause 18]

The semiconductor device according to Clause 17, wherein the substrate has a second groove that is recessed from the mounting surface to surround the first light-transmitting member and the second light-transmitting member, and wherein the light-shielding member is fitted in the second groove.

[Clause 19]

The semiconductor device according to Clause 18, wherein the first groove has a first end and a second end both of which are connected to the second groove.

[Clause 20]

The semiconductor device according to any one of Clauses 8 to 19, wherein the first light-transmitting member and the second light-transmitting member are made of an identical synthetic resin.

[Clause 21]

The semiconductor device according to Clause 20, wherein the light-shielding member is made of a synthetic resin having a different physical property from the synthetic resin of the first light-transmitting member and the second light-transmitting member, and wherein a glass transition point of the light-shielding member is lower than a glass transition point of the first light-transmitting member and the second light-transmitting member.

[Clause 22]

The semiconductor device according to any one of Clauses 1 to 21, further comprising a plurality of external terminals disposed on the attachment surface of the substrate, each of the plurality of external terminals being electrically connected to the light-emitting element or the light-receiving element.

[Clause 23]

The semiconductor device according to Clause 22, wherein the plurality of external terminals are covered by a plating layer.

[Clause 24]

The semiconductor device according to any one of Clauses 1 to 23, wherein the light-receiving element comprises an integrated circuit, and the light-receiving region comprises a photodiode.

[Clause 25]

The semiconductor device according to any one of Clauses 1 to 24, wherein the light-emitting element comprises a light-emitting diode.

The invention claimed is:

1. A semiconductor device comprising:
   a substrate having a mounting surface and an attachment surface facing away from each other;
   a plurality of internal terminals disposed on the mounting surface;
   a light-receiving element mounted on the mounting surface of the substrate, the light-receiving element having a light-receiving region that detects light and a plurality of element pad portions, at least one of the plurality of element pad portions being electrically connected to the light-receiving region;
   a light-emitting element mounted on the mounting surface of the substrate and spaced apart from the light-receiving element along a first direction perpendicular to a thickness direction of the substrate;
   a first bonding wire connecting one of the plurality of element pad portions of the light-receiving element to one of the plurality of internal terminals, the first bonding wire being located on a side of the light-receiving element opposite the light-emitting element along the first direction; and a light-transmitting member covering the light-receiving element, the light-emitting element and the first bonding wire.

2. The semiconductor device according to claim 1,
wherein the plurality of internal terminals include a plurality of first internal terminals each connected to the light-receiving element and a second internal terminal connected to the light-emitting element, and
wherein each of the plurality of first internal terminals is spaced apart from the second internal terminal along the first direction, respectively.

3. The semiconductor device according to claim 2, wherein each of the plurality of first internal terminals has an end forming a first pad portion, one of the first pad portions being connected to the first bonding wire, the first pad portions being arranged along a second direction perpendicular to both the thickness direction of the substrate and the first direction.

4. The semiconductor device according to claim 3, wherein the plurality of first internal terminals have a portion extending in the second direction in plan view and in a region of the mounting surface of the substrate between a center of the light-receiving element and a center of the light-emitting element.

5. The semiconductor device according to claim 3, wherein at least one of the plurality of first internal terminals overlaps with the light-receiving element in plan view.

6. The semiconductor device according to claim 5, further comprising a first bonding layer that is an electrical insulator and that is interposed between the light-receiving element and the mounting surface of the substrate.

7. The semiconductor device according to claim 3, wherein the light-receiving element comprises an integrated circuit, and the light-receiving region comprises a photodiode.

8. The semiconductor device according to claim 3,
wherein the second internal terminal includes a die pad portion on which the light-emitting element is mounted and a second pad portion spaced apart from the die pad portion in the second direction, and
wherein the semiconductor device comprises a second bonding wire connecting the light-emitting element to the second pad portion.

9. The semiconductor device according to claim 8, wherein the second bonding wire extends in the second direction.

10. The semiconductor device according to claim 8, wherein the second bonding wire and the first bonding wire are both made of an identical material.

11. The semiconductor device according to claim 8, further comprising a second bonding layer that is an electric conductor and that is interposed between the light-emitting element and the die pad portion.

12. The semiconductor device according to claim 3,
wherein the light-transmitting member includes a first light-transmitting member and a second light-transmitting member, the first light-transmitting member covers the light-emitting element and has a convex lens from which light is emitted, and the second light-transmitting member covers the first bonding wire and has an incident region on which light is made incident, and
wherein the first light-transmitting member and the second light-transmitting member are disposed on the mounting surface of the substrate and spaced apart from each other in the first direction.

13. The semiconductor device according to claim 12, further comprising a light-shielding member having a first opening and a second opening and covering the first light-transmitting member and the second light-transmitting member,
wherein the lens is exposed through the first opening, and the incident region is exposed through the second opening.

14. The semiconductor device according to claim 13, wherein the lens has an elliptical shape elongated in the second direction in plan view.

15. The semiconductor device according to claim 14, wherein the first opening has an elliptical shape elongated in the second direction in plan view.

16. The semiconductor device according to claim 13, wherein a clearance is provided between the lens and an inner wall of the first opening.

17. The semiconductor device according to claim 16, wherein the inner wall of the first opening has a surface inclined toward a center of the first opening with a decreasing distance to the light-emitting element in the thickness direction of the substrate.

18. The semiconductor device according to claim 13, wherein the second opening has a circular shape in plan view.

19. The semiconductor device according to claim 13, wherein the inner wall of the second opening has a surface inclined toward a center of the second opening with a decreasing distance to the light-receiving element in the thickness direction of the substrate.

20. The semiconductor device according to claim 19, wherein the incident region is raised in the thickness direction of the substrate, the entrance region comprising an incident surface on which light is made incident, the incident surface being a flat surface perpendicular to the thickness direction of the substrate.

21. The semiconductor device according to claim 20, wherein the incident region has a circular shape in plan view.

22. The semiconductor device according to claim 20, wherein a clearance is provided between the incident region and the inner wall of the second opening.

23. The semiconductor device according to claim 1,
wherein the light-transmitting member includes a first light-transmitting member covering the light-emitting element and a second light-transmitting member covering the light-receiving element, and
wherein the semiconductor device further comprises a light-shielding member disposed between the first light-transmitting member and the second light-transmitting member, the light-shielding member including a partition wall isolating the first light-transmitting member from the second light-transmitting member.

24. The semiconductor device according to claim 23,
wherein the substrate has a first groove recessed from the mounting surface and located between the first light-transmitting member and the second light-transmitting member, and
wherein the partition wall is fitted in the first groove.

25. The semiconductor device according to claim 24,
wherein the substrate has a second groove that is recessed from the mounting surface and surrounds the first light-transmitting member and the second light-transmitting member, and
wherein the light-shielding member is fitted in the second groove.

26. The semiconductor device according to claim 25, wherein the first groove has a first end and a second end each of which is connected to the second groove.

27. The semiconductor device according to claim 13, wherein the first light-transmitting member and the second light-transmitting member are both made of an identical synthetic resin.

28. The semiconductor device according to claim 27, wherein the light-shielding member is made of a synthetic resin having a different physical property from the synthetic resin of the first light-transmitting member and the second light-transmitting member, and a glass transition point of the light-shielding member is lower than a glass transition point of the first light-transmitting member and the second light-transmitting member.

29. The semiconductor device according to claim 1, further comprising a plurality of external terminals disposed on the attachment surface of the substrate,
  wherein each of the plurality of external terminals is electrically connected to one of the plurality of internal terminals.

30. The semiconductor device according to claim 29, further comprising a plating layer covering at least one of: the plurality of internal terminals; and the plurality of external terminals.

31. The semiconductor device according to claim 1, wherein the light-emitting element comprises a light-emitting diode.

\* \* \* \* \*